(12) United States Patent
Quan

(10) Patent No.: US 10,879,864 B2
(45) Date of Patent: Dec. 29, 2020

(54) METHOD AND APPARATUS TO EVALUATE AUDIO EQUIPMENT FOR DYNAMIC DISTORTIONS AND OR DIFFERENTIAL PHASE AND OR FREQUENCY MODULATION EFFECTS

(71) Applicant: Ronald Quan, Cupertino, CA (US)

(72) Inventor: Ronald Quan, Cupertino, CA (US)

( * ) Notice: Subject to any disclaimer, the term of this patent is extended or adjusted under 35 U.S.C. 154(b) by 0 days.

(21) Appl. No.: 16/740,462

(22) Filed: Jan. 12, 2020

(65) Prior Publication Data

US 2020/0153406 A1 May 14, 2020

Related U.S. Application Data

(63) Continuation-in-part of application No. 16/517,115, filed on Jul. 19, 2019, which is a continuation of application No. 16/371,102, filed on Mar. 31, 2019, now Pat. No. 10,418,960, which is a continuation-in-part of application No. 15/721,451, filed on Sep. 29, 2017, now Pat. No. 10,012,682, which is a continuation-in-part of application No. 15/397,767, filed on Jan. 4, 2017, now Pat. No.
(Continued)

(51) Int. Cl.
| H03G 11/08 | (2006.01) |
| H03G 3/30 | (2006.01) |
| H04R 29/00 | (2006.01) |

(52) U.S. Cl.
CPC .......... *H03G 11/08* (2013.01); *H03G 3/3005* (2013.01); *H04R 29/001* (2013.01)

(58) Field of Classification Search
CPC ..... H04R 29/001; H03G 3/3005; H03G 11/08

USPC .................................. 381/28, 56, 58, 120
See application file for complete search history.

(56) References Cited

U.S. PATENT DOCUMENTS

| 2,625,614 A | 1/1953 | Schelling |
| 2,929,989 A | 3/1960 | Hurvitz |
(Continued)

OTHER PUBLICATIONS

Cordell,Robert R., A MOSFET Power Amplifier with . . . Correction, Regional Bell Operating Companies,Central Services Organization,Holmdel,NJ,presented at the 72nd Convention of the Audio Engineering Society, vol. 32, Jan.-Feb. 1984, pp. 2-17.
(Continued)

*Primary Examiner* — Paul Kim

(57) ABSTRACT

A system is provided to analyze cross-modulation distortion in audio devices, which may include testing with audio frequencies. One or more distortion signals from the audio device may be measured for an amplitude, phase, and or frequency modulation effect. In another embodiment a musical signal may be used as a test signal. Providing additional test signals to the audio device can induce a time varying cross-modulation distortion signal from an output of the audio device. Also utilizing at least one additional filter, filter bank, demodulator and or frequency converter and or frequency multiplier provides extra examination of distortion. Also frequency and or phase response can be measured with the presence of a de-sensing signal and or another signal that induce near slew rate limiting or near overload condition of the device under test. Another system is provided to analyze modulation index differences between input and output signals for a test signal including modulation.

10 Claims, 30 Drawing Sheets

Related U.S. Application Data 9,820,065, which is a continuation-in-part of application No. 14/511,170, filed on Oct. 9, 2014, now Pat. No. 9,729,987, which is a continuation-in-part of application No. 14/284,295, filed on May 21, 2014, now Pat. No. 9,386,385, which is a continuation-in-part of application No. 13/907,821, filed on May 31, 2013, now Pat. No. 9,271,097, which is a continuation-in-part of application No. 13/556,556, filed on Jul. 24, 2012, now Pat. No. 8,994,381, which is a continuation-in-part of application No. 12/875,563, filed on Sep. 3, 2010, now Pat. No. 8,624,602, which is a continuation-in-part of application No. 12/707,425, filed on Feb. 17, 2010, now Pat. No. 8,704,533, which is a continuation-in-part of application No. 12/456,752, filed on Jun. 22, 2009, now Pat. No. 8,643,359, which is a continuation-in-part of application No. 11/508,700, filed on Aug. 23, 2006, now Pat. No. 7,550,977.

(60) Provisional application No. 60/721,027, filed on Sep. 27, 2005.

(56) References Cited

U.S. PATENT DOCUMENTS

| | | | |
|---|---|---|---|
| 4,028,622 | A | 6/1977 | Evans et al. |
| 4,575,811 | A | 3/1986 | Hammon et al. |
| 4,673,888 | A | 6/1987 | Engelmann et al. |
| 5,093,636 | A | 3/1992 | Higgins et al. |
| 5,420,516 | A | 5/1995 | Cabot |
| 5,475,315 | A | 12/1995 | Cabot |
| 5,644,495 | A | 7/1997 | Soutar et al. |
| 5,818,240 | A | 10/1998 | Cabot |
| 5,915,029 | A | 6/1999 | Yazurio et al. |
| 6,385,435 | B1 | 5/2002 | Lee |
| 6,405,147 | B1 | 6/2002 | Fera |
| 6,452,467 | B1 | 9/2002 | McEwan |
| 6,493,024 | B1 | 12/2002 | Hartley et al. |
| 6,836,240 | B1 | 12/2004 | Dubbert et al. |
| 7,113,606 | B2 | 9/2006 | Botti et al. |
| 8,299,852 | B2 | 10/2012 | Quan |
| 2004/0083069 | A1 | 4/2004 | Wu |
| 2017/0118569 | A1* | 4/2017 | Quan ............... H04R 29/001 |

OTHER PUBLICATIONS

Cordell, Robert R., Phase Intermodulation Distortion—Instrumentation and Measurements Results, Bell Laboratories, Holmdel, NJ, presented at the 70th Convention of the Audio Engineering Society, Oct. 1981, pp. 1-39.

Craig, Margaret, Television Measurements—NTSC Systems, Tektronix, May 1994, pp. 7,25-26,29,37-42,47-60,and 70-72.

Jones,Douglas L., Collection Editor,The DFT. FFT, and Practical Spectral Analysis, Feb. 2007, pp. 23-35.

Metzler,Bob,Measurement of Non•Linearity, Audio Precision Audio Measurement Handbook, Audio Precision, Inc., Aug. 1993,pp. 23•59.

Meyer, Robert G., Shensa,Mark J.,Eschenbach, Ralph,Cross Modulation and Intermodulation in Amplifiers at High Frequencies, IEEE Journal of Solid•State Circuits, vol. SC-7,No. 1, Feb. 1972, pp. 16-23.

Meyer,Robert G.,Eschenbach,Ralph,Chin,Robert,A Wide-Band Ultralinear Amplifier from 3 to 300 MHz. IEEE Journal of Solid-State Circuits,vol. SC-9,No. 4,Aug. 1974,pp. 167-175.

Leinonen, E., Otala, M., Curl, J.,A Method for Measuring Transient Intermodulation Distortion (TIM). Journal of the Audio Engineering Society, vol. 25,No. 4, Apr. 1977,pp. 170-177.

Kenneth Clarke & Donald Hess, Communication Circuits Analysis and Design,Addison-Wesley Publishing, 1971, pp. 636 to 641.

Quan, Ronald, Measuring Frequency and Amplitude Modulations Effects in Cross-Modulation Distortion from Audio Amplifiers, AES Convention Paper #9564 Sep. 29, 2016, pp. 1-8.

* cited by examiner

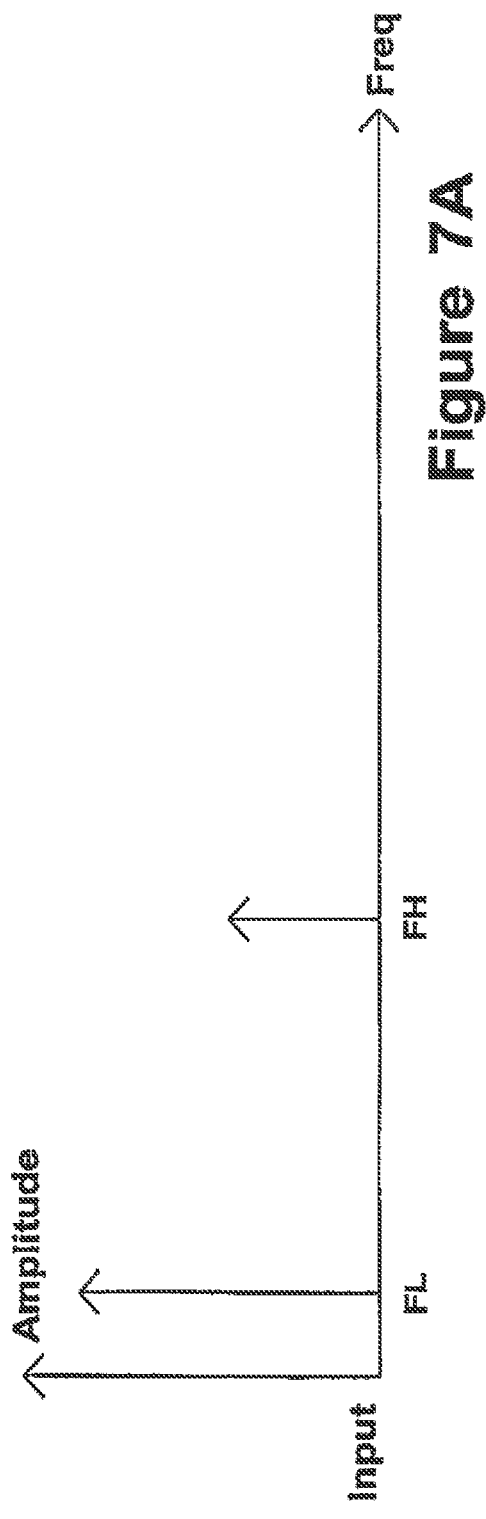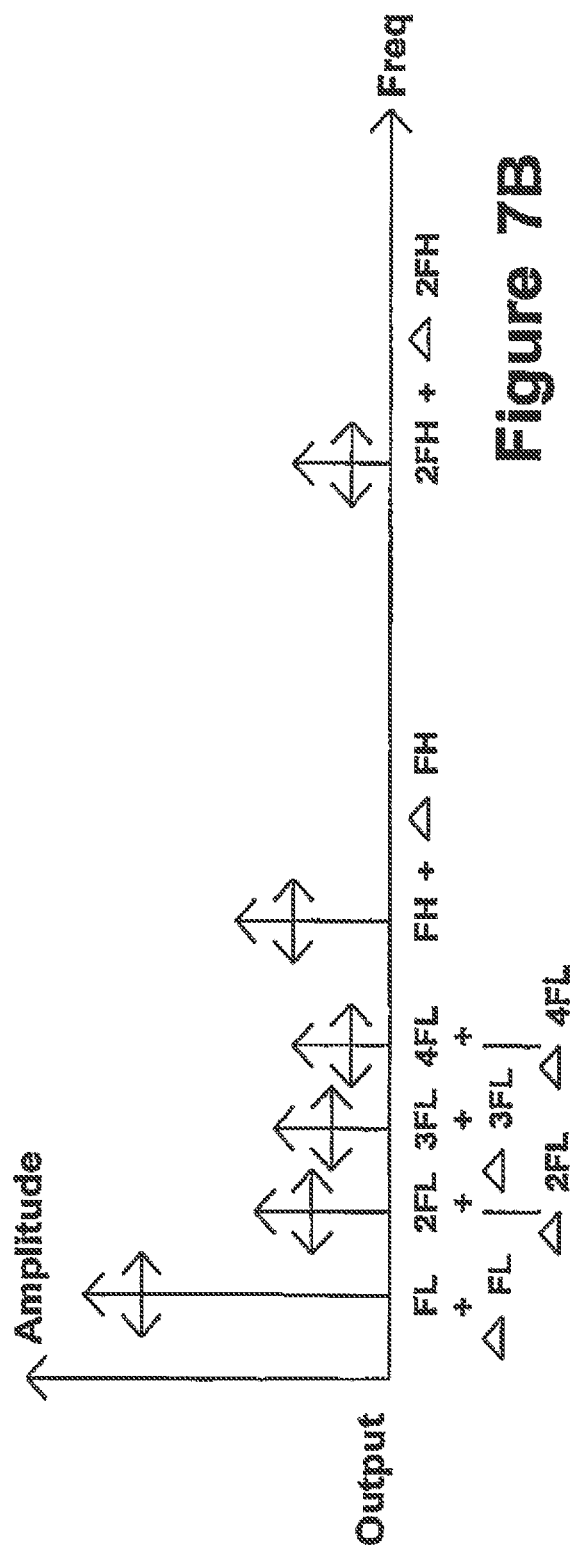

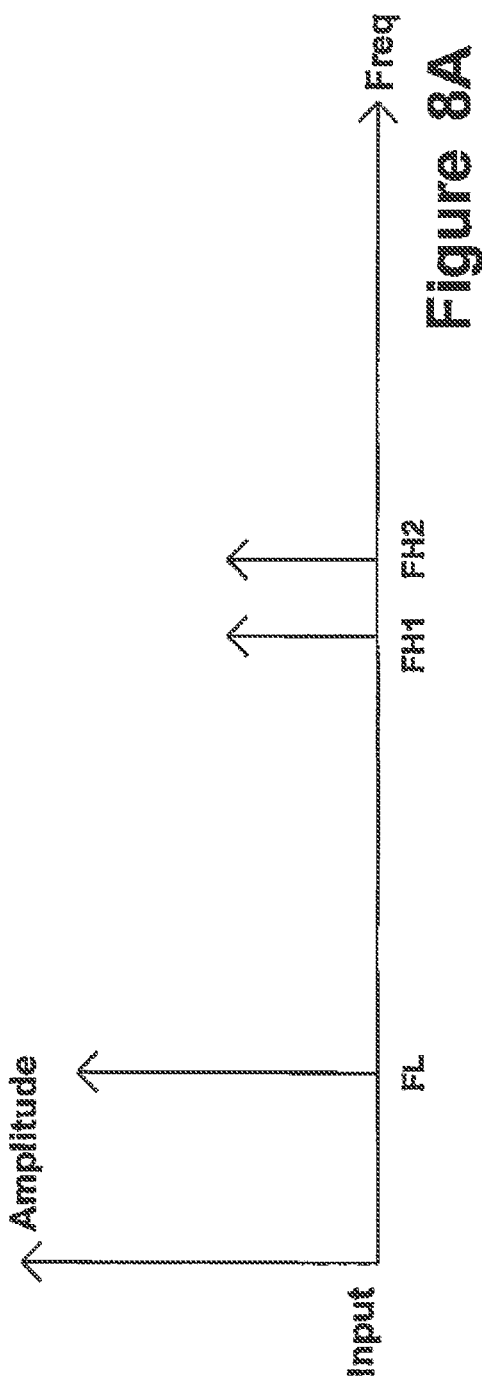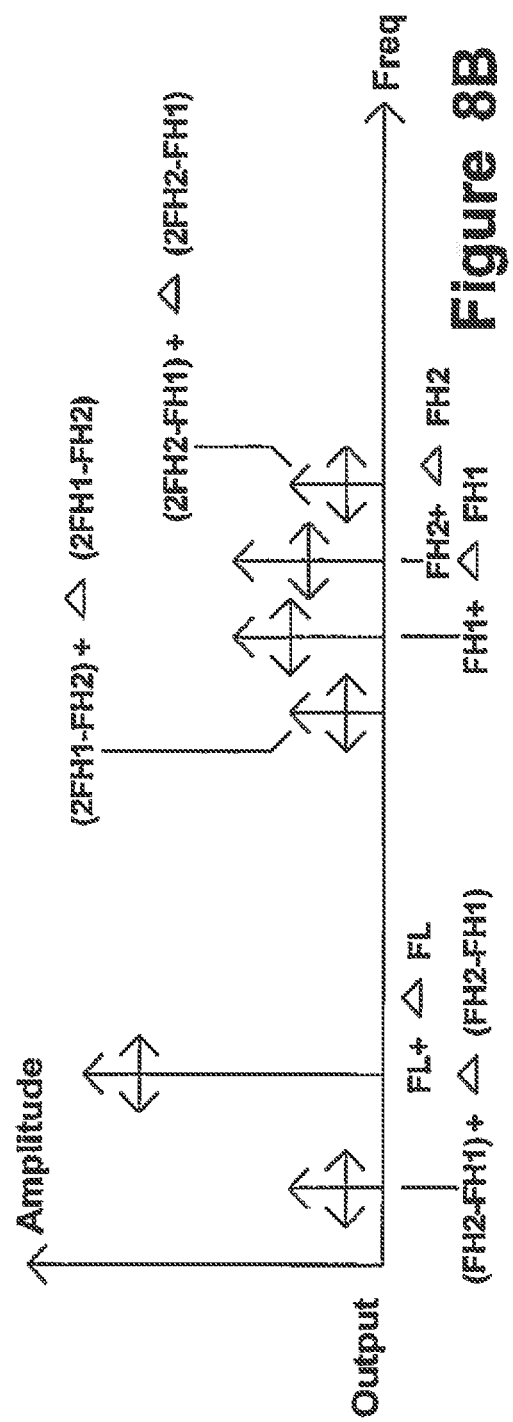

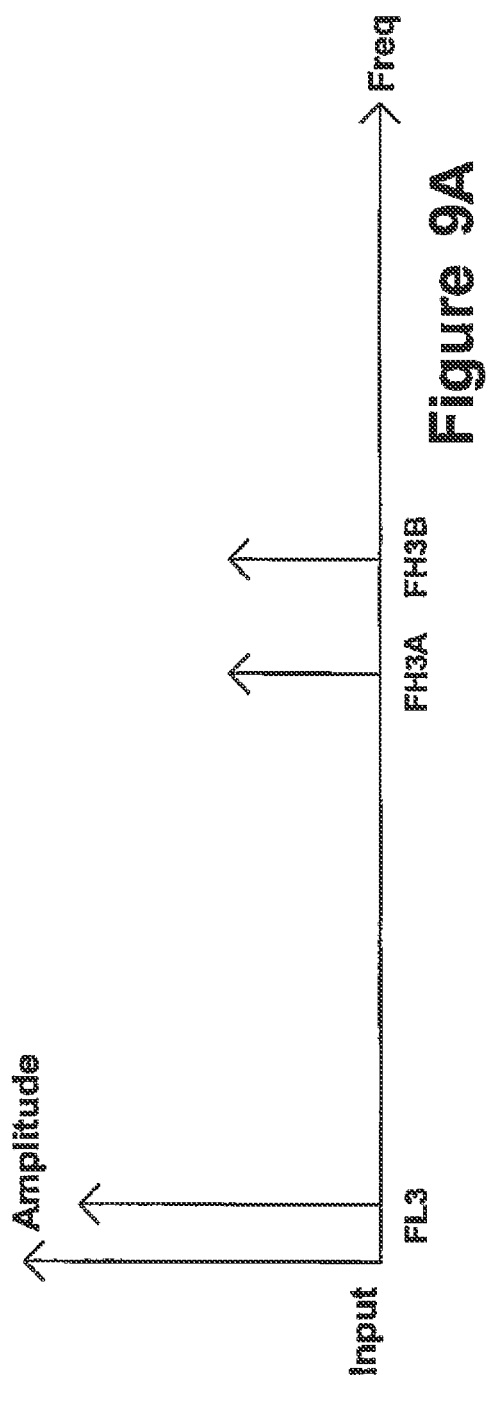
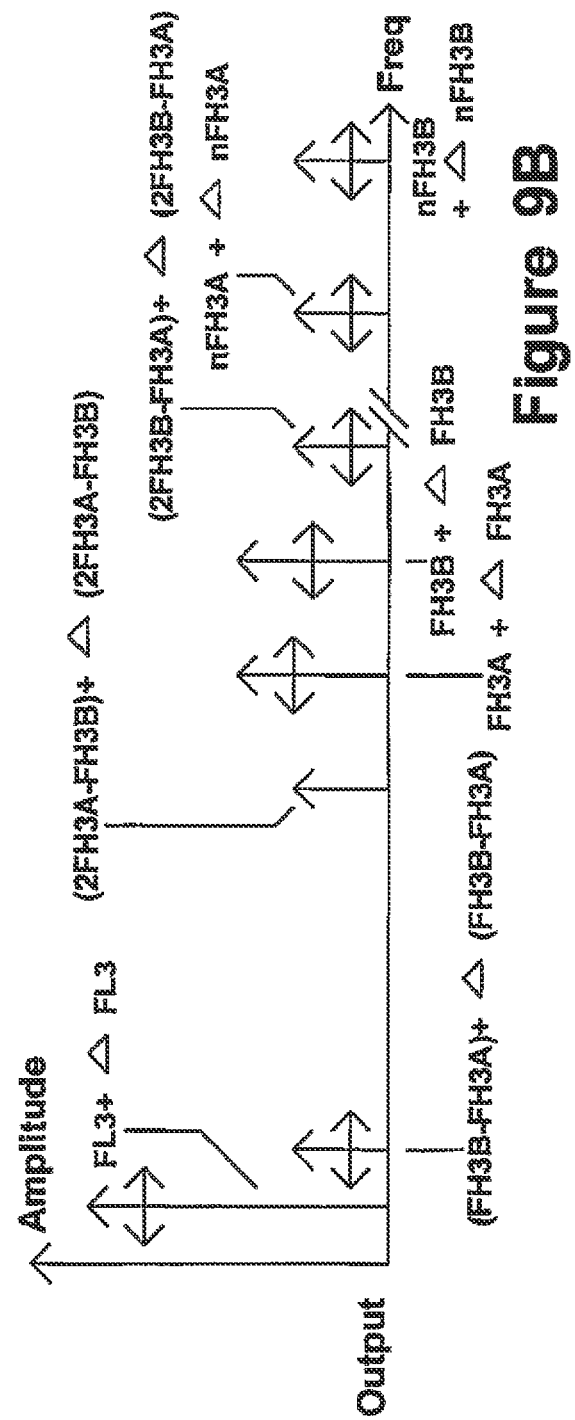
Figure 9A
Figure 9B

Top Trace: Second harmonic distortion displayed as a function of composite signal on below.

Bottom Trace: Composite signal

Composite signal example for intermodulation test signal.

Top trace: Low frequency signal without the two or more higher frequency signals for intermodulation test.

Bottom trace: Second order intermodulation distortion as a function of the low frequency signal.

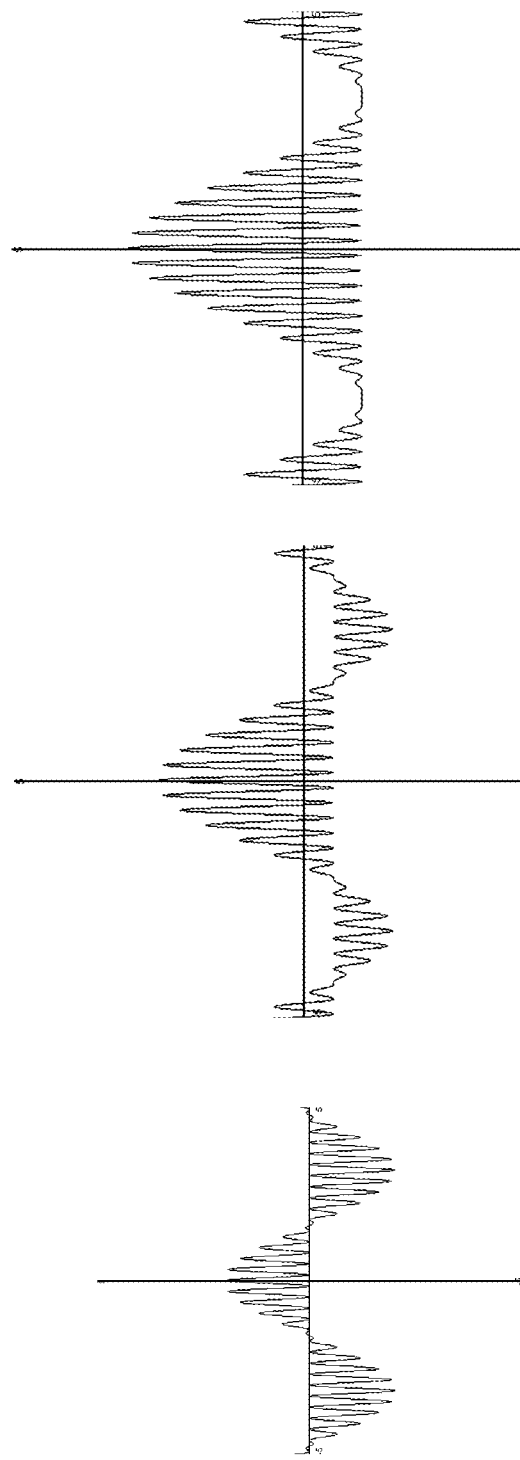

METHOD AND APPARATUS TO EVALUATE AUDIO EQUIPMENT FOR DYNAMIC DISTORTIONS AND OR DIFFERENTIAL PHASE AND OR FREQUENCY MODULATION EFFECTS

This application is a continuation in part of U.S. application Ser. No. 16/517,115 filed on Jul. 19, 2019, which is a continuation of U.S. application Ser. No. 16/371,102 filed on Mar. 31, 2019, which is a continuation-in-part of, U.S. application Ser. No. 15/721,451 filed Sep. 29, 2017, U.S. application Ser. No. 15/397,767 filed Jan. 4, 2017, U.S. application Ser. No. 14/511,170 filed Oct. 9, 2014, U.S. application Ser. No. 14/284,295 filed May 21, 2014, which is a continuation-in-part of U.S. application Ser. No. 13/907,821 filed May 31, 2013, which is a continuation-in-part of U.S. application Ser. No. 13/556,556 filed Jul. 24, 2012, of U.S. application Ser. No. 12/875,563 filed Sep. 3, 2010, which is a continuation-in-part of U.S. application Ser. No. 12/707,425 filed Feb. 17, 2010, which is a continuation-in-part of U.S. application Ser. No. 12/456,752 filed Jun. 22, 2009, which is a continuation-in-part of U.S. application Ser. No. 11/508,700 filed Aug. 23, 2006, which claims benefit of U.S. provisional Ser. No. 60/721,027 filed Sep. 27, 2005, which are incorporated herein by reference.

BACKGROUND

This invention is related to the testing of audio equipment and, in particular, analog to digital converters (ADC), digital to analog converters (DAC), digital audio processors or recorders, audio amplifiers, and the like.

DESCRIPTION OF THE PRIOR ART

Presently, conventional harmonic and or intermodulation distortion tests are used to measure the performance of the audio equipment.

An intermodulation distortion test provides for two tones to be applied to the device, in which the amplitude of the sum and or difference of the tones may appear at the output of the device. In one case an AM detector (or amplitude measurement) is used for evaluating second order amplitudes of the difference and or sum of the frequency inter-modulation products (e.g., F1+F2 and or F1−F2).

In another intermodulation distortion measurement, two tones are coupled to the device and the amplitudes of the third order intermodulation distortion products (e.g., 2F1+F2, 2F1−F2, 2F2−F1, and or 2F2+F1) are measured.

While these conventional tests are fine for many basic evaluations of the equipment, there still exist discrepancies between the sonic signature of amplifiers and equipment even with comparable distortion performance from the prior art testing methods. The conventional harmonic and inter-modulation distortion measurements are done with a zero offset signal. Thus a new method of testing is required.

In audio testing, distortion is generally measured at a nominal (fixed) bias point for harmonic distortion. In the case of mechanical reproducing systems such as tape recorders and or phonograph players, conventional test methods are measuring harmonic and or intermodulation distortion. For measuring mechanical speed stability of the recorder or playback device, a single tone at about 3.00 KHz (or 3.15 KHz) is recorded and played back to assess Wow and Flutter (W & F).

It is well known in the past 40 years that video equipment uses a different set of performance tests. One of these tests is the differential phase measurement, which is based on a combined luma and chroma signal (e.g., modulated ramp or stairstep waveform and wherein the chroma signal is demodulated by a phase detector). This differential phase test allows an objective measurement of how a color signal of a particular color would change in hue under different brightness levels.

It is well known that program audio comprised of musical instruments and or voice may be a mixture of various low to middle frequency tones of a nominal (high) amplitude along with some smaller level of higher frequency components. Of course amplitude levels of low, middle, and higher frequencies occur in music.

It would be advantageous to provide different methods for addressing alternatives in testing audio equipment or other types of equipment.

SUMMARY

A testing method or apparatus utilizes a filter bank or filter banks to measure time varying or dynamic harmonic distortion or intermodulation distortion. With a stairstep signal and filter bank(s), Nth order harmonic and or intermodulation distortion is measured via the filter banks at different offsets provided by an arbitrary low frequency signal.

For example, an amplifier with crossover distortion will show increased harmonic and or intermodulation distortion near the zero crossing while providing less distortion in other portions of the transfer curve of the amplifier.

By using filter banks and an arbitrary low frequency signal combined with one or more tones, time varying harmonic and or intermodulation distortion can be measured. For example, a stairstep signal or multiple step signal of two or more levels is combined with a single or multiple tone that is coupled to a device under test will allow measurement of harmonic and or intermodulation distortion as a function of time and or dynamic offset voltage(s). Furthermore the harmonic and or intermodulation distortion signals from the filter banks may be coupled to phase detector or phase demodulator or frequency modulation detector (e.g., frequency to voltage converter) to measure differential phase, phase modulation, and or frequency modulation effect(s) from any of the distortion signal (e.g., via one or more filter banks).

One part of the invention is also concerned with measuring induced phase and or frequency modulation at the output (of any signal) from a device when two or more frequencies are coupled to the input of the device. This method of measuring induced phase and or frequency modulation may apply to various electronic equipment, amplifiers, processors, or the like over a wide range of frequencies.

A basic embodiment (of the invention) comprises measuring phase and or frequency modulation of a device under test (DUT) when two or more signals are coupled to the input of the DUT, wherein any phase or frequency modulation of any signal generated at the output of the DUT is measured. This basic embodiment may include measuring phase and or frequency modulation of any of the two or more input signals, harmonics of any input signals, and or any intermodulation components or products of the two or more input signals.

In an overview of some embodiments (of the invention), these embodiments are distinguished over conventional chroma video differential phase tests and standard Wow and Flutter measurement tests.

A distinguishing aspect of the invention over the prior art video chroma signal subcarrier differential phase and or gain measurement systems is that the differential gain and phase measurements have been used for measuring the color saturation and or hue distortions for a (composite) color television (TV) signal (such as an NTSC video signal). These color saturation and or hue distortions arise from a color subcarrier signal superimposed on a video luminance signal. The luminance signal is of a lower frequency, which biases the color subcarrier signal (e.g., 3.58 MHz NTSC color subcarrier frequency) to different brightness levels. If the video system is not perfect, the result will be that as the picture brightness changes, the color, which is supposed to display constant color saturation and hue, will shift in saturation and or hue. So prior art measurements for chroma differential gain and phase pertains to what is displayed on a TV monitor in terms of distortions in color saturation and hue. The present invention does not pertain to color saturation or color hue distortions as displayed on a TV set.

A distinguishing aspect of the invention over prior art Wow and Flutter measurement methods is that prior art Wow and Flutter measurement systems are not used in amplifier or electronic systems. Instead, the Wow and Flutter measurements are to reveal speed irregularities in mechanical record and or playback systems such as tape recorders and phonograph turntables. Until the disclosure of this invention, non-mechanical systems such as amplifiers or audio processors have not been tested with a Wow and Flutter meter. Should a standard Wow and Flutter test is made on a non mechanical apparatus such as an amplifier, the Wow and Flutter will measure zero percent. That is, the standard single 3000 Hz tone from the Wow and Flutter test source into an amplifier will produce at the amplifier's output a 3000 Hz signal without Wow and Flutter and without frequency variations.

One basic discovery by the inventor involves the unexpected measurement of Wow and Flutter in amplifiers with a new testing method (e.g., a new test method that involves two or more frequencies instead of the one single frequency for standard Wow and Flutter measurement). Because electronic (non-mechanical) amplifiers are not known to behave like (mechanical) recorders or play back devices of recorded signals, it is then a unique process to measure Wow and Flutter via an amplifier circuit.

The new test method measures small variations of frequency or phase response differences as a function of output or input swing. These phase or frequency variations show up as Wow and Flutter when a dynamic biasing signal (which may include close to DC in frequency) is used, hence the need for more than one frequency for a new test in accordance with the invention.

In a mechanical recorder or playback machine, a speed variation exists upon recording or playback of an electronic signal. This mechanical player or recorder will exhibit an amount of speed variation, which translates to a frequency variation of an electronic signal. Such a frequency variation can lead to the characteristic for example of a "sour" tone for reproducing a sustained piano note.

The standard measurement technique is to supply a single frequency tone to the mechanical device for record and playback or for playback via a prerecorded media (e.g., prerecorded tape or disc). Upon playback of the mechanical device, the single frequency tone is measured for frequency variation via a Wow and Flutter meter (e.g., Leader model LFM-39A).

At least one embodiment (of the invention) is therefore distinguished over the standard measurement for Wow and Flutter. One reason is that at least another signal is added or involved, and or a modifier circuit or method is used to allow (e.g., reduce interference from the other signal or signals) for measuring the frequency variation of the signal involved.

Another reason that there is distinction is that Wow and Flutter meters are used for measuring speed variation of mechanical systems, not non mechanical apparatus such as electronic amplifiers or electronic processors.

Thus, one object (of the invention) is to measure frequency (or phase) variation of a signal caused by another signal.

In one embodiment, measurement is done such that a lower frequency signal causes a frequency (or phase) modulation on at least one higher frequency signal (AKA Quan effect #1 for frequency modulation of a higher frequency signal induced by a lower frequency signal). Frequency or phase variation is then measured for any of the higher frequency signal(s), which may include its distortion components or products (e.g., from an amplifier or processor).

Alternatively, in another embodiment, measurement is done such that a higher frequency signal causes a frequency (or phase) modulation on one or more lower frequency signal (AKA Quan effect #2 for frequency modulation on a lower frequency signal induced by a higher frequency signal, and AKA Quan effect #3 for phase modulation on a lower frequency signal induced by a higher frequency signal). Frequency or phase variation is then measured for any of the lower frequency signal(s), which may include its distortion components or products (e.g., from an amplifier or processor).

For example, in one embodiment, a larger amplitude "low" frequency signal below 400 Hz is added to a 3 KHz signal from the Wow and Flutter meter (e.g., Leader model LFM-39A). The 3 KHz signal is adjusted to have a lower amplitude that that of the lower frequency signal (e.g., 100 Hz, 150 Hz, or 300 Hz, or any other frequency, or >300 Hz). The two signals are then combined and fed to the input of an amplifier or amplifier system, which may be named DUT (Device Under Test). The output of the amplifier or DUT is fed to a filter or modifier, which removes, modifies, and or attenuates the lower frequency signal. The output of the filter (or modifier) is then fed to a Wow and Flutter meter or a detector (e.g., phase detector and or FM detector).

For this example, the low frequency signal was 100 Hz (sine wave) and the higher frequency signal was 3000 Hz (sine wave). A simple (microphone) two-transistor feedback amplifier was set for a gain of 91 and had a −3 dB frequency response at 17 KHz. About 3.9 volts peak to peak of the example 100 Hz signal and about 100 millivolts to 160 millivolts peak to peak of the example 3000 Hz signal was measured at the output of the amplifier. Then a (e.g., 3000 Hz) bandpass, or high pass filter, or modifying circuit) filter/modifier essentially removed the 100 Hz signal and passed the 3000 Hz signal from the amplifier's output to the Wow and Flutter meter, which read 0.15% Wow and Flutter (W&F). Considering the amplifier is not mechanical system, this new test showed an "unexpected" result that amplifiers exhibit Wow and Flutter during the presence of a multiple signal input.

In comparison to a very high quality cassette audio recorder such as the Pioneer CT-F1000 (cost of $600 from "High Fidelity Test Reports 1979" issue), the Wow and Flutter measured 0.08%. Note that in this cassette deck test, the Wow and Flutter meter only sends out either a 3000 Hz or a 3150 Hz test signal (but not both frequencies) for the cassette recorder to record and playback the test signal.

(There is no other signal, other than the single tone involved for this standard W&F measurement of the cassette audio recorder).

Thus, the invention or an embodiment is considered novel over the prior art in that multiple signals or tones are used. These multiple signals or tones are sent to a DUT (device under test). The DUT is coupled to a modifier, which allows a Wow and Flutter meter or phase detector or FM detector to measure at least one particular test tone(s) essentially without interference from the other tones (e.g., lower frequency tones or any of its harmonics). Thus, from the example test with the two transistor amplifier mentioned above, this amplifier yielded almost twice the Wow and Flutter of a (mechanically driven) cassette tape recorder (e.g., 0.15% for amplifier under new testing method versus 0.08% for the Pioneer CT-F1000 cassette audio recorder).

Other experiments with amplifiers that exhibit cross over distortion yielded similar results of the two-transistor amplifier experiment mentioned above. Cross over distortion in an amplifier causes a drop in bandwidth in the "dead zone", so as a dynamic biasing signal causes a higher frequency signal to go in and out of the dead zone, the frequency response changes in time.

And (in general) an increase in frequency for the dynamic biasing signal applied, the more change in phase occurs in time, which leads to a greater/increased FM effect or greater/increased frequency deviation (e.g., of a higher frequency signal).

In some cases, an amplifier with cross over distortion yielded even more Wow and Flutter such as 0.175% (in this example of a new way to measure Wow and Flutter or to measure a frequency modulation effect of one signal induced by another signal).

And if the lower frequency signal (e.g., dynamic biasing signal) is raised from 100 Hz to a higher frequency such as 140 Hz or higher, Wow and Flutter measurements (via an embodiment of the invention) increase to about 0.360% or higher.

Because there is a phase shift change in the (higher frequency) signal as a function of where the output is "biased" to, when the low frequency signal is increased in amplitude and or frequency, a greater change in phase shift over time of the higher frequency signal will occur. And the greater phase shift per time translates to a greater shift (e.g., deviation) in frequency of the higher frequency signal (e.g., more frequency modulation). For example, in another embodiment of the invention, a (higher amplitude) 2000 Hz signal was combined with a lower amplitude 15 KHz signal into the two transistor feedback amplifier example. The output of the two transistor feedback amplifier had comparable amplitude levels as the previous example with 100 Hz and 3000 Hz signals. And the output of this example amplifier was coupled to a high pass filter (to remove the 2 KHz signal while passing the 15 KHz signal), which was then coupled to a frequency to voltage converter. The output of the frequency to voltage converter revealed a frequency shift or deviation of 1.5% for the 15 KHz signal (caused by the 2000 Hz signal) from the output of the two transistor feedback amplifier example.

It should be noted that cascading amplifiers for making an amplifier system, (e.g., preamplifier coupled to a tone control amplifier, which then couples to a power amplifier) will generally cause an increase in phase or frequency modulation effect (e.g., in total). The phase and or frequency modulation effect of each amplifier in a chain may be additive or cumulative in some manner. Depending on the phase versus bias voltage effect on amplifiers, in some cases the cascading of certain amplifiers may reduce the phase and or frequency modulation.

In general but not limited to, the new test of the present invention comprises providing 2 or more frequencies such as a lower frequency signal to a higher frequency signal (to yield a complex or composite signal) and coupling this complex signal to the amplifier's or device's (e.g., a device may be electrical, mechanical, magnetic, optical, electromechanical, and or a transducer) input. At the output of the amplifier (or device) under test, the lower frequency signal (which may include any of its harmonics) is modified (e.g., reduced in amplitude or removed), and the higher frequency component is coupled to a detection circuit or system (e.g., computational system, Wow and Flutter meter, FM detector, phase detector, and or frequency to current or voltage converter). The lower frequency signal will cause a dynamic bias upon the amplifier or device under test, and thus the amplifier or device can exhibit a different frequency response (or phase change/delay) for each different bias point as defined by the test.

The difference in the higher frequency response (e.g., when biased by a lower frequency signal) yields a difference in phase response according to various bias points via the lower frequency signal. By measuring the phase changes or shifts or angles of the higher frequency signal as a function of bias points (caused by the lower frequency signal), the output phase modulation of the higher frequency signal can then be measured or computed. By providing a slope or derivative function of the phase modulation, a frequency modulation effect can be measured or computed.

Of course, the output of the modifying circuit, which contains the phase (or frequency) modulated signal may be coupled directly to a phase detector or frequency modulation detector. Examples of phase detectors may include mixers or multiplying circuits, balanced detectors, phase lock loop circuits and or the like. And examples of frequency modulation detectors may include frequency discriminators (e.g., Foster Seeley), ratio detectors, quadrature detectors, peak differential detectors, phase detectors, phase shifting circuits, phase lock loop circuits, pulse counting circuits, frequency to signal converters, slope detectors, and or the like.

In an another embodiment (of the invention), a bias or operating voltage of an audio equipment is varied and a (e.g., nominally higher frequency) signal is added. Because many audio equipment such as digital systems or amplifiers may have different nonlinearities at various operating points such as quantizing error or crossover distortion, a fuller picture of the equipment is evaluated via a variable bias signal plus a (high frequency) signal.

For example, an embodiment (of the invention) may include biasing (e.g., providing a variable/dynamic offset voltage or current) an amplifier, device, and or a digital system with a voltage to span an output voltage range of the device while measuring harmonic or intermodulation distortion or phase or frequency (or phase) response at the various operating points.

In a further example, an embodiment provides one or more frequency signals above 10 KHz (such as a signal at 18 KHz and a signal at 20 KHz), and then provides a larger amplitude (lower frequency) signal in the range between 20 Hz and 10 KHz (such as a signal whose frequency is any between 20 HZ and 5 KHz; 300 Hz for example).

The lower frequency signal plus one or more of the higher frequency signals are then combined and coupled to the (DUT) (e.g., amplifier, ADC, and or DAC). The output of the DUT is then coupled to a modifier, which affects, modifies or removes the lower frequency signals (e.g., FL) and or the lower frequency signal's harmonics. The output of the modifier then is coupled to at least one detector such as a phase detector or an FM detector, which can measure the phase and or frequency modulation effect on the one or more higher frequency signals.

In the case of more than one higher frequency signal, the detector may include an apparatus or method to remove substantially all but one of the higher frequency signals, which may include intermodulation distortion signal(s). For example, to reduce interference from one (high frequency) signal to the other in terms of detection or demodulation (e.g., of phase modulation and or frequency modulation). Thus, in this example, the detector will measure phase and or frequency modulation effects on the 18 KHz and or 20 KHz signals caused by the 300 Hz signal. The detector (via a modifier) may be used to measure the phase and frequency modulation effects on one or more intermodulation distortion frequencies such as 2nd, 3rd, and or higher order intermodulation components (or harmonics).

For example, the detector may measure phase and or frequency modulation effects for second order intermodulation component. In this example, the sum and difference frequency distortion signals (e.g., 18 KHz+20 KHz=38 KHz, and or 20 KHz 18 KHz=2 KHz). And third order intermodulation distortion components (e.g., 2FH1−/+FH2, 2FH2−/+FH1) may be measured for phase and or frequency modulation effects.

In this third order intermodulation example, 2×20 KHz− 18 KHz=22 KHz, and 2×18 KHz 20 KHz=16 KHz and or the third order sum components. Also the phase and or frequency modulation effects of any of the harmonics of any of the higher frequency signals may also be measured. In this example, 2×20 KHz=40 KHz and or 2×18 KHz=36 KHz.

Of course other frequencies may be used for FH, such as making FH>FL (e.g., FL<2 KHz, FH>5 KHz).

For example, the lower frequency signal (FL) may be <2 KHz and the higher frequency components (FH) may be a signal or multiple signals at 9 KHz and or 10 KHz. In this example the second harmonics of the 9 KHz and or 10 KHz FH signals can be measured for phase and or frequency modulation effect(s).

Yet another embodiment may include a low frequency signal with a smaller amplitude higher frequency signal to test a dynamic change in frequency response, gain, and or phase. The change in phase with a time varying signal will then produce an FM effect.

Still another embodiment may include using a multiple frequency signal to dynamically induce a time varying phase (or frequency) distortion for the device that has differential phase distortion. The device's output is then measured with an FM (or PM) detector or discriminator in order to find a (frequency or dynamic phase) shift in at least one of the frequencies used in the test signal (or at least one of the distortion products from the DUT). For example, the complex or composite signal may include one or more lower frequency signals and more than one higher frequency signal. Another method of measuring dynamic phase (modulation) and or frequency (modulation) effects after the modifier, may reveal that the modulation effects may or may not track with the (various) higher frequency components. The modifier removes/attenuates the lower frequency signals and may remove or attenuate any harmonics of the lower frequency signals.

Another embodiment may include a high frequency reference signal added prior to or after a combination of a low frequency and higher frequency signal. The duration of the high frequency reference signal, which may include for example a synchronizing signal would be shorter than that of the low frequency and high frequency signal. This is similar to a TV signal, but is used to test for non-TV applications such as audio and or RF systems. In some cases, the audio device under test may output a signal not synchronous to the input signal (e.g., the output of a digital processor may not have exactly the same frequency at its output as its input signal's frequency). In this embodiment at least one synchronizing signal is needed at the output to provide a testing method or apparatus for generating a reference phase and or frequency, which is similar to a TV color burst signal or a data clock reference signal.

In an alternative embodiment (of the invention) for non-standard testing of audio (or other) equipment, one or more modulated waveforms may be coupled to the device. One such waveform may be an amplitude modulated waveform, which may be combined with an offset signal such as a ramp or generated waveform or DC offset that may be varied. Then the analysis of a modulated waveform's sidebands or carrier(s), in terms of any extra sidebands, or phase shifts in sidebands or carrier(s), or changes in frequency of any sidebands or carrier(s), is done (e.g., at the output of the device under test). A phase or frequency detector may also be used in analyzing the device under test in terms of phase or frequency errors.

Another modulated waveform (for another embodiment) may include a frequency or phase modulated signal that is added to an offset signal such as previously described. It also is possible to provide any combination of modulations on a signal for a non-standard test of audio equipment.

In any of the embodiments or examples described, the waveform may be set to a small amplitude as an offset is being varied for testing a digital system (e.g., analog to digital converter, or combined testing of analog to digital converter and or digital to analog converter) and or for testing an analog system. For example, quantizing errors can reveal shifts in frequency or phase, or sideband distortion.

Computational analysis of the sidebands generated by the higher frequency signal(s) may be found such that generating a Bessel function map that can then yield the deviation of the higher frequency's FM (or PM) effect. Some of the Bessel function sidebands may be out of phase, and a method to find/identify the phase can be done by adding an AM signal wherein the modulating signal includes fundamental and harmonics of a known phase. The AM signal is combined or added with the higher frequency signal (that may exhibit frequency modulation) and sidebands are assessed whether there was an increase or decrease in sideband amplitude. For example, those sidebands that are reduced in level denote an out of phase sideband. Once a sufficient number of or all side bands are measured in amplitude and phase, the Bessel function can be determined. Thus the modulation index is calculated. With the modulation index calculated, the frequency or phase deviation of the higher frequency component is calculated or found.

Although the embodiments or examples described are generally for audio equipment testing, any of the test embodiments described herein may be used for testing of non-audio equipment, e.g., such as an RF amplifier/device or a part of a communication system or a video device.

A summary of various of the embodiments (in which any method may be an apparatus) of the invention is stated below:

A new testing method and apparatus comprises the application of multiple frequencies to a device under test for measuring newly discovered frequency modulation effects. This new testing method may be applied to audio and or radio frequency devices.

An embodiment may include a lower frequency signal with a smaller amplitude higher frequency signal to test a dynamic change in frequency response, gain, and or phase. This dynamic test can reveal frequency modulation effects.

Another embodiment may include using a multiple frequency signal to dynamically induce a time varying phase distortion for a device that has differential phase distortion. The device's output is then measured with an FM detector or discriminator in order to measure a shift in one of the frequencies used in the test signal or to measure frequency modulation effects of any signals (e.g., any test signals and or distortion products) output from the device.

For example, an embodiment (of the invention) may include biasing an amplifier or a digital system with a voltage to span the output voltage range of the device while measuring harmonic or intermodulation distortion or phase or frequency response at the various operating points.

Below is a further summary of various embodiments (of the invention):

Method of measuring frequency modulation effects of an electronic device, wherein the device has an input and an output, comprising, coupling two or more frequency signals into the input, and providing an FM detector at the output of the device, to measure a frequency modulation effect or frequency shift for one or more frequency signals at the output of the device.

Method of measuring Wow and Flutter effects on an electronic device comprising, applying multiple frequencies to the input of the device, coupling the output of the device to the input of a modifier circuit, and coupling a Wow and Flutter meter to the output of the modifier.

An invention or an embodiment includes a method wherein the modifier circuit reduces amplitude of a frequency or removes one or more selected frequencies, and also a method of measuring induced phase or frequency modulation in a signal of multiple frequencies, or more than one signals of different frequencies.

An invention or an embodiment further includes a method of applying a signal or signals to the input of a device, and measuring via a phase and or frequency modulation detector at the output of the device at least one phase and or frequency modulation effect on any selected signal frequency from the output of the device.

An invention or an embodiment also includes:

A method wherein the selected frequency from the output of the device may include any fundamental, harmonic, and or intermodulation frequency component.

A method wherein an amplitude detector measures amplitude variations of any of the phase and or frequency modulated signal frequencies.

A method wherein the derivative of the phase detector is taken to provide a frequency modulation measurement, and or wherein an integrated function of the frequency modulation detector provides a phase modulation measurement.

A method wherein one of the signals is a dynamic biasing signal, wherein the dynamic biasing signal provides a dynamic offset output voltage or current, and A method of measuring dynamic distortion of an electronic device, wherein a dynamic offset voltage is combined with a test signal comprising, applying the combined dynamic offset voltage and test signal to the input of the device, and measuring the dynamic distortion for at least one offset voltage.

An invention or an embodiment (also) includes a method of providing an audio and or radio frequency test signal, comprising, adding and or inserting a lower frequency signal, one or more reference higher frequency signal packets of one or more frequencies, and one or more signals of higher frequencies to provide the test signal, and also a method wherein an optional unipolar or bipolar synchronizing signal is added or inserted.

An invention or an embodiment includes a method of measuring frequency modulation effects of a device under test, wherein a test signal is input to the device, and wherein the test signal includes a lower frequency signal combined with a higher frequency signal, comprising, coupling a frequency to voltage converter or FM detector to the output of the device, and measuring the higher frequency signal for at least one frequency modulation effect.

In addition an invention or an embodiment includes a method wherein the test signal includes an optional synchronizing signal, and a method wherein the measured frequency modulation effect is displayed.

Also included is a method of measuring a phase and or frequency modulation effect of a device, wherein the input of the device is coupled to at least one signal of two or more frequencies, wherein the at least one signal induces a phase or frequency modulation effect on the device, whereby the output of the device is coupled to a tunable filter which tunes to a selected frequency of a signal from the output of the device, and wherein a phase detector and or a frequency modulation detector measures the phase and or frequency modulation effect of the device.

An invention or an embodiment includes a method of a measuring a phase and or a frequency modulation effect of a device, comprising coupling multiple frequencies to the input of the device, wherein the output of the device generates a frequency modulation effect on one or more of its output signal frequencies, whereby the output of the device is coupled to a phase detector, FM detector, and or frequency to voltage converter for measuring at least one phase modulation and or frequency modulation effect of any signal frequency from the output of the device.

Further an invention or an embodiment includes a method wherein a modifier is couple to the output of the device, and whereby the modifier removes or reduces the amplitude of at least one selected signal frequency, wherein the output of the modifier is coupled to a Wow and Flutter meter.

An invention or an embodiment includes a method of measuring at least one phase modulation and or frequency modulation effect of an audio device that has an input and an output, comprising, coupling one or more signals including two or more frequencies to the input of the audio device, coupling a phase detector, FM detector, and or frequency to voltage converter to the output of the audio device to measure phase modulation and or frequency modulation at any signal frequency from the output of the device.

An embodiment includes any combination of:

A method or apparatus wherein a modifier or filter is placed between the output of the audio device and the input of the phase detector, FM detector, and or frequency to voltage converter.

A method or apparatus wherein the modifier removes or reduces in amplitude one or more signals from the output of the audio device.

A method or apparatus wherein the modifier is coupled to a Wow and Flutter meter.

A method or apparatus wherein the Wow and Flutter meter is modified for wider bandwidth.

A method or apparatus to measure time varying distortion via two or more signals.

A method or apparatus to provide measuring distortion as a function of time and or voltage or current.

Harmonic distortion is measured or provided or characterized as a one or two dimension function: $HD_n(t)$, $HD_n(v)$, or $HD_n(t,v)$, where n=order of the harmonic distortion (e.g., n=2 denotes $2^{nd}$ order distortion), t denote time, and v denotes voltage at any node of the device under test such as input or output voltage or any voltage measured within the device. Note that v may be replaced with i so that the distortion is a function of current anywhere related to the device under test.

Intermodulation distortion is measured or provided or characterized as a one or two dimension function: $IM_n(t)$, $IM_n(v)$, or $IM_n(t,v)$, where n=order of the intermodulation distortion (e.g., n=2 denotes $2^{nd}$ order distortion), t denote time, and v denotes voltage at any node of the device under test such as input or output voltage or any voltage measured within the device. Note that v may be replaced with i so that the distortion is a function of current anywhere related to the device under test.

Cross modulation distortion is measured or provided or characterized as a one or two dimension function: $CM_n(t)$, $CM_n(v)$, or $CM_n(t,v)$, where n=order of the cross moduation distortion (e.g., n=2 denotes $2^{nd}$ order distortion), t denote time, and v denotes voltage at any node of the device under test such as input or output voltage or any voltage measured within the device. Note that v may be replaced with i so that the distortion is a function of current anywhere related to the device under test.

N-Beat or triple beat distortion is measured or provided or characterized as a one or two dimension function: $ND_n(t)$, $NB_n(v)$, or $NB_n(t,v)$, where n=order of the N-Beat or triple beat distortion (e.g., n=2 denotes $2^{nd}$ order distortion), t denote time, and v denotes voltage at any node of the device under test such as input or output voltage or any voltage measured within the device. Note that v may be replaced with i so that the distortion is a function of current anywhere related to the device under test.

A test signal is provided or characterized by: TestSignal (t)=$k_1$ [$k_2$ m(t)+$k_3$]$f_1$(t)+$k_4$ m(t), where $k_1$, $k_2$, $k_3$, and $k_4$ are constants, m(t) is a modulating signal, and $f_1$(t) is a carrier signal.

Another test signal is provided or characterized by: TestSignal'(t)=$k_1$ [$k_2$m(t+q-$\varphi_1$(t))+$k_3$]$f_1$(t+$\varphi_2$(t))+$k_4$ m(t+$\varphi_3$(t)), where $k_1$, $k_2$, $k_3$, and $k_4$ are constants or time varying, m(t) is a modulating signal, and $f_1$(t) is a carrier signal, and where $\varphi_1$(t), $\varphi_2$(t), and $\varphi_3$(t) denote a phase shift or time varying phase shift.

A method and or apparatus for measuring a time varying or dynamic harmonic, cross modulation, N-Beat, and or intermodulation distortion from an audio device, wherein the audio device has an input and an output, comprising: providing at least two signals comprising at least a first signal comprising an arbitrary waveform and a second signal comprising at least one signal whose frequency is higher than the frequency of the first signal to an input of the audio device; coupling the output of the audio device to an input of a modifier, and wherein the modifier provides an output terminal; measuring the harmonic, cross modulation, N-Beat, and or intermodulation distortion via measuring or displaying an amplitude level to provide the measurement of time varying harmonic, cross modulation, N-Beat, and or intermodulation distortion measurement of the audio device.

Also included is a method or apparatus wherein at least one signal of the harmonic, cross modulation, N-Beat, and or intermodulation distortion is further coupled to a phase demodulator and or frequency modulation detector to measure phase modulation, differential phase, and or frequency modulation in the harmonic and or intermodulation distortion signal. The method or apparatus mentioned in this paragraph may include at least one signal of the harmonic, cross modulation, N-Beat, and or intermodulation distortion is further coupled to a Fourier Transform or short time Fourier Transform to measure for phase modulation, differential phase, and or frequency modulation in the harmonic, cross modulation, N-Beat, and or intermodulation distortion signal. It should be noted that a modifier may include at least two band reject filter and or at least one band pass filter.

Optionally, at least one signal associated with the harmonic, cross modulation, N-Beat, and or intermodulation distortion is coupled to a spectrum analyzer for spectrum analysis for measuring phase modulation, differential phase, and or frequency modulation in the at least one signal associated with the harmonic, cross modulation, N-Beat, and or intermodulation distortion. Optionally, the first signal includes any combination of a pulse waveform, stairstep waveform, a ramp waveform, a sinusoidal waveform, and or a modulated waveform. Optionally, the second waveform includes one or more sinusoidal waveforms.

A test signal for measuring dynamic or static distortion or for measuring phase and or frequency modulation effects in an audio device comprising: a modulated signal including characterized by an equation:

$$\text{TestSignal}'(t) = k_1[k_2 m(t+\varphi_1(t))+k_3]f_1(t+\varphi_2(t))+k_4 m(t+\varphi_3(t)),$$

wherein $k_1$, $k_2$, $k_3$, and $k_4$ are constants or time varying, m(t) is a modulating signal, and $f_1$(t) is a carrier signal, and wherein $\varphi_1$(t), $\varphi_2$(t), and $\varphi_3$(t) denote a static phase shift or time varying phase shift. Optionally, TestSignal'(t) may be used at least in part for measuring harmonic distortion, cross modulation distortion, N-Beat distortion, and or intermodulation distortion from the audio device. The test signal, TestSignal'(t), may optionally include that m(t) and or f(t) comprises a sinewave, sine squared, Gaussian pulse, and or bell shaped curve signal. Optionally, the modulated signal includes a phase and or amplitude modulated carrier signal and or a modulated that includes a phase modulated signal. Optionally, the modulated signal includes a signal of any combination of amplitude modulation, double sideband suppressed carrier amplitude modulation, single sideband amplitude modulation, frequency modulation, phase modulation, pulse code modulation, pulse amplitude modulation, pulse position modulation, and or pulse width modulation.

BRIEF DESCRIPTION OF THE DRAWINGS

FIG. 7A shows an example of an input signal spectrum applied to a DUT (device under test).

FIG. 7B shows the output of the DUT used in FIG. 7A, which may include at least one phase or frequency modulated signal.

FIG. 8A shows another example of an input signal spectrum applied to a DUT.

FIG. 8B shows the output of DUT used in FIG. 8A, which may include at least one phase or frequency modulated signal. This modulated signal may include a signal that is any one of many distortion products, for example.

FIG. 9A shows another example of an input signal applied to a DUT.

FIG. 9B shows the output of a DUT which include at least one signal component that can be measure for phase, frequency, and or amplitude modulation effect.

FIGS. 30, 31, and 32 show examples of test waveforms or test signals.

DETAILED DESCRIPTION

Figure 1A:
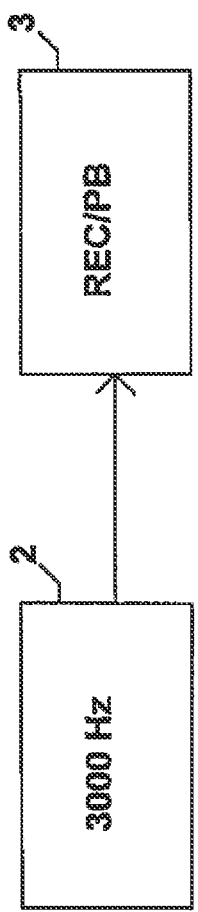
FIGS. 1A and 1B show a prior art configuration in testing frequency deviation effects via a Wow and Flutter meter.

FIG. 1A shows a standard prior art method of performing a Wow and Flutter test. A test tone signal, 2, of 3000 Hz (or 3150 Hz) tone is coupled to a recorder, 3. This recorder may be a tape recorder or a disc recorder.

Figure 1B:
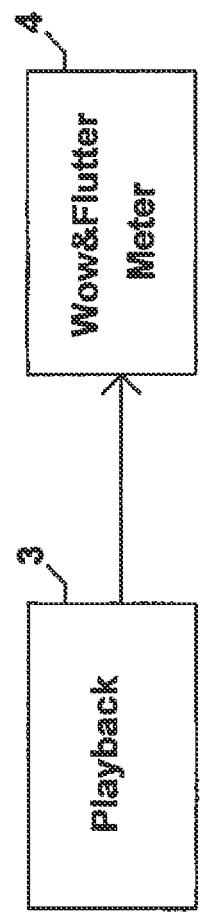

FIG. 1B shows further that the recorded test tone is then played back via 3 and coupled to a Wow and Flutter meter, 4, for measurement of frequency deviations of the singe tone (for a prior art standard method of measuring Wow and Flutter). These frequency deviations of the test tone are for example a result of the non-perfect speed or velocity in which the mechanical recorder exhibits upon recording and or playback.

One object (of the invention) is to assess phase or frequency modulation from an audio system or amplifier caused by the two or more input signals. Therefore, FIG. 1B, which shows standard (prior art) testing for Wow and Flutter, does not apply (for example, to a multiple signal method of an embodiment of the invention) because only one test tone signal is used (e.g., 3000 Hz).

Figure 1C:
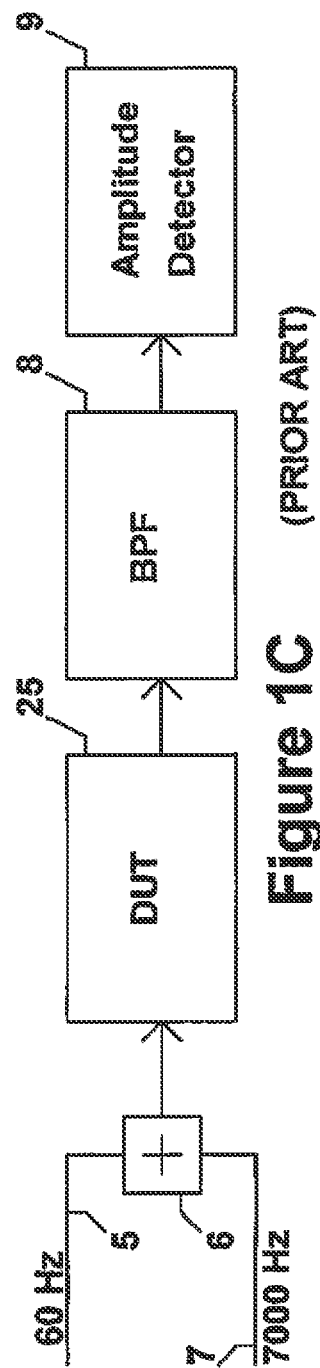
FIG. 1C shows a prior art method of using a two-tone test for measuring the amplitude of intermodulation distortion.

FIG. 1C shows a prior method of measuring the amplitude (but not phase or frequency modulation) of intermodulation distortion components on a two tone signal. In one example, a 60 Hz signal, 5, is combined with a 7000 Hz signal, 7, via a circuit 6, which is coupled to the device under test, DUT, 25, such as an amplifier. The output of the amplifier is then coupled to a filter, 8, to remove the 60 Hz component and pass a signal around 7000 Hz. The intermodulation distortion components are signals 60 Hz above and below the 7000 Hz signal from the DUT's output. These intermodulation distortion components then are measured for amplitude via an amplitude detector such as an amplitude modulation (AM) envelope detector, or an amplitude measuring system as denoted by block 9.

Note that there is another other two-tone intermodulation test such as coupling a 19 KHz and 20 KHz tone to the DUT to measure only the amplitude of third (and or second) order intermodulation distortion components.

Yet another object (of the invention) is to measure phase or frequency modulation effects of intermodulation distortion signals or tones, and or the test tones or signals from the DUT's output. The measuring of the phase and or frequency modulation effect(s) (e.g., of the any test signal frequencies and or of any distortion products from the DUT) is distinguished from (the prior art method of) measuring the amplitude or magnitude of intermodulation distortion products.

Another object (of the invention) is to measure the amplitude modulation/variation of any phase or frequency modulated signal from the DUT (e.g., with multiple signals).

Figure 2:
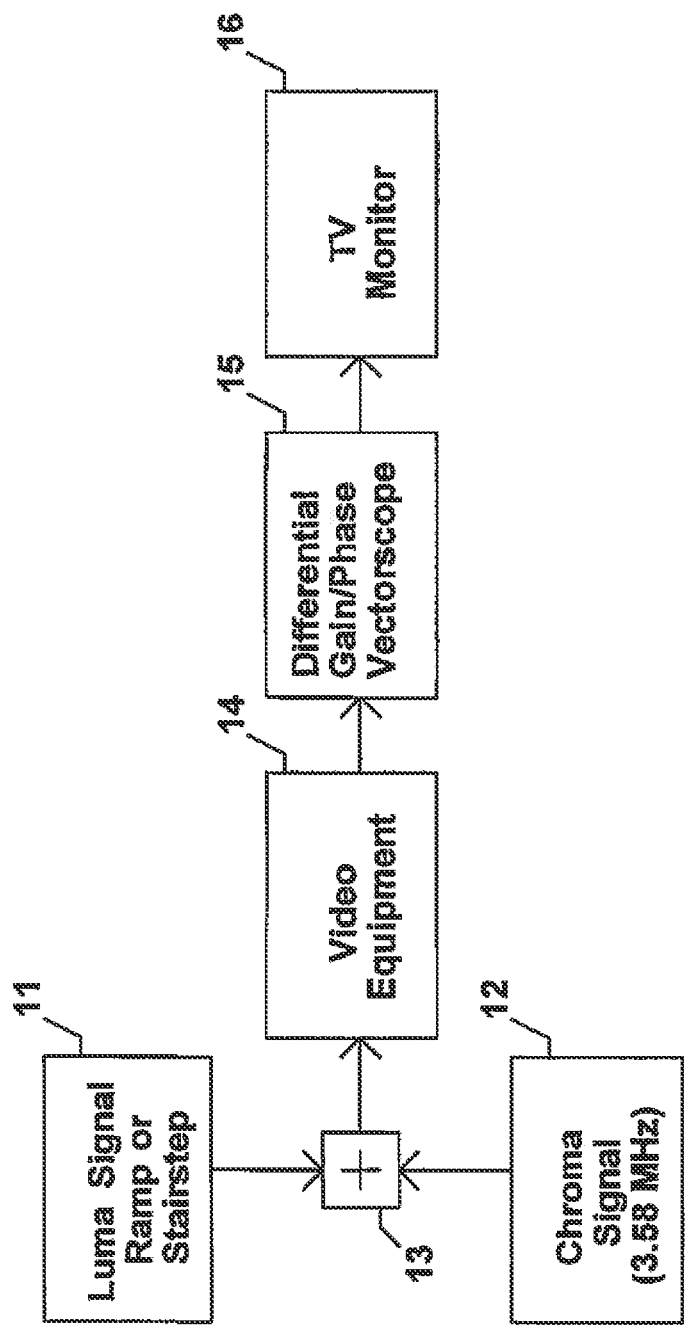
FIG. 2 shows a prior art method to measure phase distortion in a color video signal.

FIG. 2 shows a prior art standard test method for measuring differential phase or gain in a composite color video signal. Measuring different (color) gain is important to assess a shift in color saturation with changes in luminance or brightness values. And, measuring differential (color) phase is important in assessing a shift in color hue or tint with changes in luminance or brightness values. A low frequency luma signal, 11, (e.g., stairstep signal of ramp signal with a repetition frequency of 15.734 KHz or 15.625 KHz) is combined with a chroma color subcarrier signal, 12 (e.g., 3.58 MHz or 4.43 MHz). The chroma and luma signals are combined via circuit 13 and are coupled to a video equipment, 14. The output of 14 is coupled to a differential phase and or gain meter, 15, which filters out the luma signal, and uses a phase detector (e.g., no FM detector) to determine/measure phase or gain variations as function of varying brightness (luma) levels, which lead to color variations. The output of differential phase and or gain meter 15, which may be coupled back to the input of 15 (dashed line), may be coupled to a TV, 16, for monitoring.

FIG. 2 is intended for a video picture assessment for a color TV signal and its effects on color distortion. On the other hand, an object of the invention is to assess the effect of differential phase modulation on an audio signal, which can lead to a sonic (blurring) effect of music. Since measuring differential phase and or gain in an audio signal does not lead to the prior art's FIG. 2 intent to assess color distortion on a color TV signal (which is subsequently viewed on a TV set), the use and or objective of the invention is distinguished from the prior art shown in FIG. 2.

Another object (of the invention) is to assess the frequency variations of an audio signal that can lead to a sonic (blurring) effect. Note that this audio effect is not heard via a color TV signal (e.g., the video signal is beyond the bandwidth of audio hearing). Also, there is no "differential frequency" measurement for video signals. Thus, an embodiment (of the invention) is distinguished from video testing.

Also combining the prior art shown in FIGS. 2 and 1 will lead to a Wow and Flutter meter operating out of range because the video signal (>15 KHz) is too high in frequency. Applying the prior art 3000 Hz tone of FIG. 1 into the differential phase/gain meter of FIG. 2 will not work, because this tone is too low in frequency for video testing.

Figure 3:
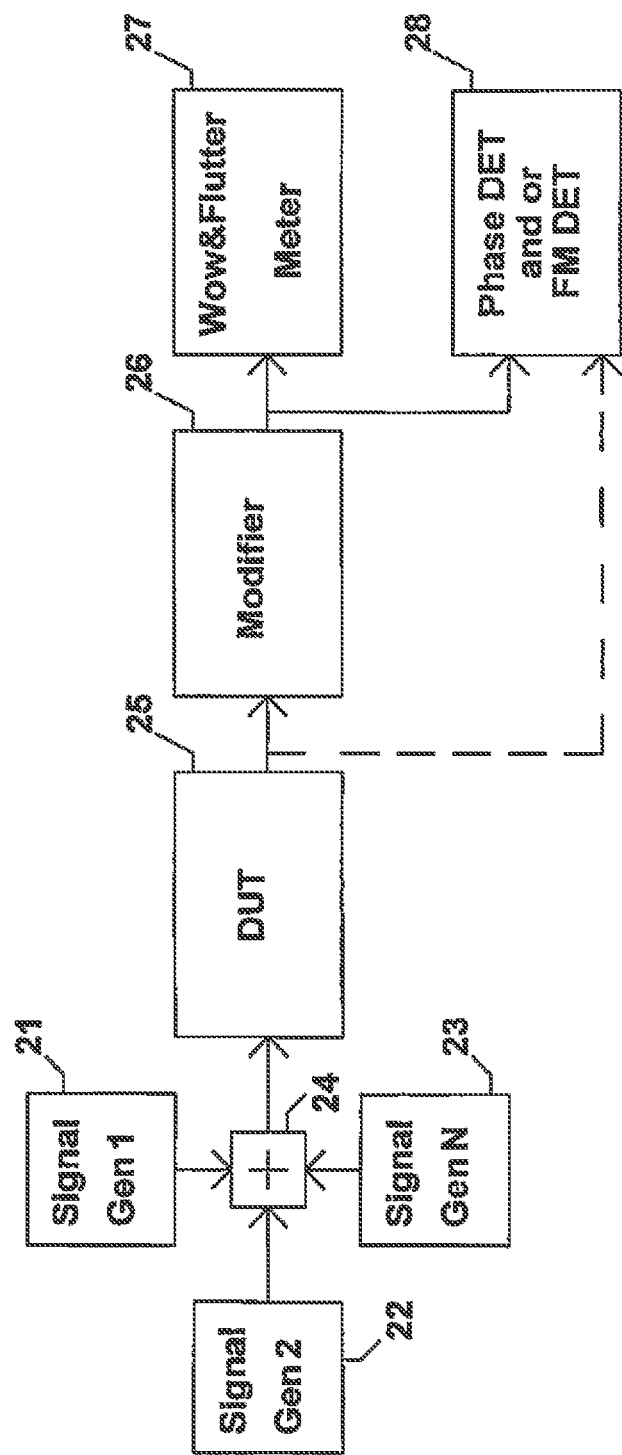
FIG. 3 shows an embodiment example.

FIG. 3 shows an example (of the invention) wherein multiple signal sources 21,22, and or 23 are combined or coupled by a circuit 24. Note that there may be (up to) N signal sources supplied to block 24. The output of combining circuit or apparatus 24 is then coupled to the DUT, 25, which may include at least one amplifier (e.g., an amplifier can be at least one amplifier stage), analog to digital converter, digital to analog converter, device (e.g., of previously mentioned), signal processor, and or storage apparatus. Because of the multiple tones coupled into the DUT, the output of the DUT 25 will (for example) include phase and or frequency modulation (e.g., a form of new distortion) for one or more signals at its output. The output of the DUT, 25, is then coupled to a modifier circuit or apparatus 26. Modifier 26 reduces or removes at least one interfering signal for measurement of phase and or frequency modulation. And the output of modifier 26 is then coupled to a Wow and Flutter meter 27 or to block 28, a phase and or frequency detector/discriminator.

The Wow and Flutter meter 27 may be of conventional type such as a Leader LFM-39A or a modified version of it to extend its frequency range. For example, a conventional Wow and Flutter meter measures frequency deviations based on a 3 KHz test signal with a 300 Hz bandwidth for the recovered frequency modulation effect(s). Thus for example, a Wow and Flutter meter can be modified for measuring frequency modulation effects of a 15 KHz test signal, with a 1500 Hz (or more) bandwidth for recovering the frequency modulation effects. Of course (these or) other (test) frequency signals may be used and or other recovered bandwidths may be provided (e.g., for the FM detector).

FIGS. 4A to 4F shows various ways of modifying a signal from the DUT.

Figure 4A:
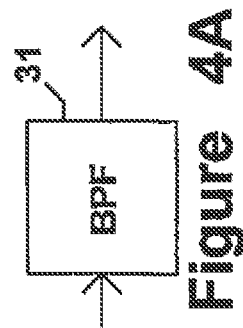
FIGS. 4A through 4F show various modification methods or circuits of the invention or of an embodiment.

FIG. 4A is a bandpass filter, 31, to remove or reduce the amplitude of one or more signals out of its bandpass and pass through a signal or tone to the phase and or frequency (modulation) detector/discriminator (or Wow and Flutter meter). FIG. 4A for example may be set to tune to any frequency component from the output of the DUT, which may include any of the (input) test signal frequencies, and or any distortion products generated from the DUT. Thus, any of the tuned frequencies mentioned may be coupled to a detector for measuring modulation effects such as in phase and or frequency modulation (effects). Bandpass filter 31 may be set for a particular bandwidth in the pass-band (for example, to allow sufficient or substantially accurate measurement of differential phase and or frequency modulation distortion).

Using a filter, for example at least one band pass filter, and at least one detector (phase, frequency, and or amplitude detector) can reveal phase and or frequency modulation (or even amplitude modulation as well) of any (one or more) signal component from the DUT.

Figure 4B:
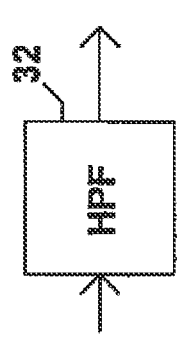

FIG. 4B shows an alternate way to measure the modulation distortion. A high pass filter, 32, is used to reduce or to remove unwanted signals, at least one lower frequency signal so as to facilitate a more accurate detection of phase and or frequency modulation distortion from the DUT. One advantage of using a high pass filter is that a wider bandwidth of phase and or frequency detection/discrimination can be achieved over a simple band pass filter. However, a more complex band pass filter can yield similar wider bandwidth recovery for the detector.

Although there are many types of frequency detectors which may be used for at least one embodiment of the invention such as (tuned circuit) ratio detectors, discriminators, peak differential, phase lock loop, and or quadrature detectors, there is also a pulse counter FM detector.

The pulse counter FM detector generates a fixed width or duration pulse of a set amplitude and is triggered by the incoming signal at a particular slicing level. For example, if the higher frequency signal is adequately separated from the other signals at the DUT's output, a limiter circuit or comparator may generate a square wave signal.

This squarewave signal then can be coupled to a timing generator such as one shot or half shot circuit. The output of the timing generator then produces a train of pulses of fixed width. If the higher frequency signal is incurring an FM effect, then the number of pulses per time will vary from the timing generator, which in turn when integrated or low pass filtered, will convert the frequency deviation (FM effect) into a demodulated output signal.

In another example (of the embodiment) for the detector, the positive and negative going edges of the square wave signal are coupled to two timing generators. The timing generator outputs are combined (e.g., a logic OR), which yield a pulse train of twice the frequency of the higher frequency signal (e.g., FH in FIGS. 7, 8, and or 9), which allows for wider band FM demodulation. This form of "double edge" FM demodulation is commonly used in analog video recorders. (For example see FIG. 17, latter portion).

For example, it is widely known in FM analog video recording systems, that as long as the first sideband (e.g., upper sideband) is recovered in the FM signal, a wide frequency response is achievable. For example, at a carrier frequency of about 8 MHz, a modulating frequency of about 4.2 MHz may be recovered with little distortion via this double edge technique.

Thus, an example would have a sharp cutoff high pass filter at about 1.6 KHz as the modifier block 26, and a double edge FM detector as block 28. The output of combiner 24 will have a higher frequency signal of 3 KHz or more, and a lower frequency signal of less than 1.55 KHz. The high pass filter will remove and or sufficiently attenuate any frequency at 1.55 KHz or lower. With this example, then it is possible to measure FM effects of the DUT caused by the lower frequency signal up to about 1.55 KHz even though the higher frequency signal (e.g., "carrier" into the detector) is at 3 KHz. In other words or in general, FM effects can be recovered (from a 3 KHz (carrier) signal or higher frequency) up to about a little more than one half of its own (e.g., "carrier") frequency (e.g., 1.55 KHz demodulated from a 3 KHz signal, but other frequencies may be provided or used).

Figure 4C:
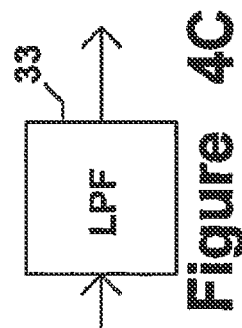

FIG. 4C shows a low pass filter, 33, as a modifier, which may be used to couple the lower frequency signal into a detector to measure phase, frequency, and or amplitude modulation effects. Also the low pass filter will remove the higher frequency signal while passing the lower frequency signal, (such) as a synchronizing signal from the DUT's output. (For example, see FIG. 12.)

Figure 4D:
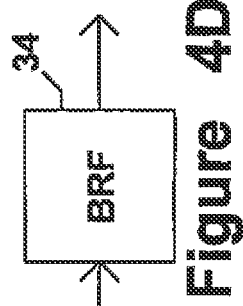

FIG. 4D shows a notch filter, 34, as a modifier. This notch or band reject filter may provide for rejecting or reducing one or more signal frequencies.

For example, a notch may reject the lower frequency tones and (or) any or all of the lower frequency signal's harmonics or other distortion products (e.g., intermodulation distortion components). In one example, the notch filter then passes at least one of the higher frequency signal's components (e.g., fundamental, harmonic(s), and or intermodulation distortion product (s).)

Figure 4E:
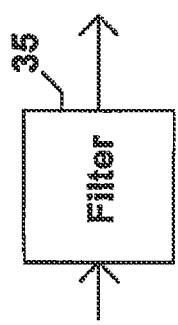

FIG. 4E illustrates a filter, 35, as a modifier. This filter may be any combination of the previously mentioned filters. FIG. 4E may denote a comb filter to pass through or reject one or more frequencies. In general, FIG. 4E represents a filter comprised of any combination of software, firmware, digital, and or analog techniques.

Note that any filter described in FIGS. 4A to 4E may be phase compensated for a flatter group delay characteristic. For example, phase equalization may be employed. Generally, a more linear phase response or flatter group delay characteristic will yield less distortion in PM and or FM demodulators (e.g., demodulators=detectors).

Figure 4F:
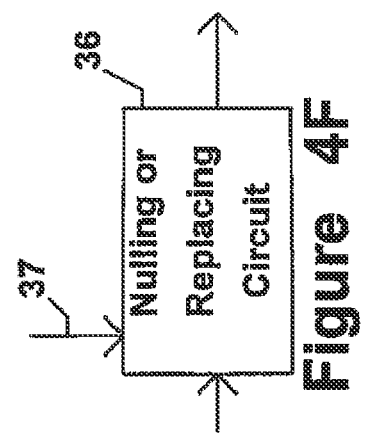

FIG. 4F denotes a nulling and or reducing circuit (method), 36, which may include cancellation.

One such method is to add a substantially out of phase signal or signals to at least partially cancel out one or more signals.

For example, circuit 36's input may be coupled to the DUT's output and a second input, 37, comprise of a lower (or higher) frequency signal from blocks 21 or 24 of FIG. 3. With the signal coupled to input 37, the phase is altered and amplitude is set to cause a cancel of at least part of the lower frequency signal from the DUT's output.

In this example, the output of circuit 36, would comprise substantially the higher frequency signal(s).

Again, block 36 (or any of the blocks in FIGS. 4A to 4F) may be implemented in the analog, digital, and or software domain.

Figure 5:
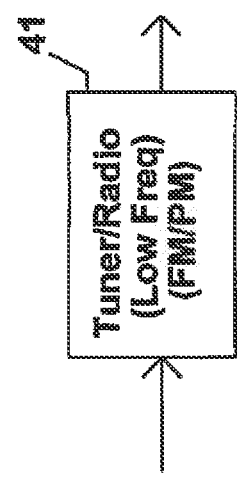
FIG. 5 shows another example embodiment.

FIG. 5 shows a tunable receiver (or tuner), 41, with an FM, PM, and or AM detector. Block 41 then tunes into any of frequency of the spectrum to measure modulation effects on any of the signals produced by the DUT's output. The DUT's output may have the higher and lower frequencies and or their distortion products, harmonic and or intermodulation components. The tunable receiver 41 may be implemented with at least one filter, mixer, amplifier, oscillator, and or detector.

When the tunable receiver 41 is implemented to cover the audio range or higher, frequency, phase, and or amplitude modulation effects can be measured, stored, and or computed.

Block 41 and or any other part of the invention such as the blocks in FIG. 3 may be scaled for radio frequencies as well. In superheterodyne radio receivers, it is well known that the phase noise of a local oscillator can cause degradation in signal to noise of the demodulated signal. Thus this invention when scaled up to radio frequencies can measure frequency, phase, and or amplitude modulation effects on a receiving signal cause by other RF signals.

For example, an antenna picks up many channels of different frequencies(e.g., multiple signals). In some radio receivers, there is a varactor (variable capacitance) effect from the semiconductor mixer, RF amplifier, and or some tuned circuits. This varactor effect, which causes a change in capacitance versus a voltage across the semiconductor, then can induce incidental phase noise or extra frequency modulation, which can lead to extra noise at the demodulated output. Thus this invention can be applied to RF systems to measure phase noise for example (when two or more signals are involved).

Figure 6:
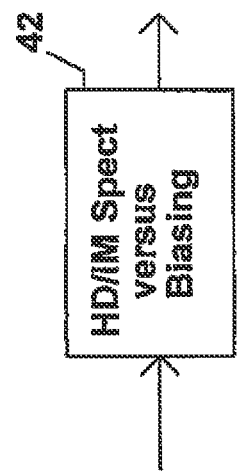
FIG. 6 shows yet another example embodiment. For example, an FM, PM, and or AM receiver will tune into various signal components from the DUT's output, which may be used to measure, capture, and or store frequency, phase, and or amplitude modulated deviations.

FIG. 6 shows an alternative way of measuring standard distortions. Standard prior art tests measure harmonic, intermodulation at a single bias point of an amplifier or audio processor. Block 42 tests for harmonic and or intermodulation distortion products at a varying bias level. This varying bias level test via the block 42 can also be used to measure noise (e.g., noise output at various bias levels). The distortions and or noise measurements can then be stored, displayed, and or computed.

FIG. 7A shows one example of multiple signals applied into a DUT. The lower frequency signal has a frequency FL and a higher frequency signal has a frequency FH. In this example the amplitude of the FL signal is larger than the FH signal. However, the amplitude of either or both may be set to any level or any selected level.

FIG. 7B shows an output of the DUT, which may include an amplifier, device, at least part of a digital system, audio system, and or an RF system (e.g., which may generate harmonic and or intermodulation distortion due to a nonlinearity). FIG. 7B then shows that there can be phase and or frequency modulation effects on the FL signal, FH signal, and or at least one harmonic of the FH signal, as denoted by the horizontal double arrows across each component.

For example the double arrows shows a $\Delta FL$, $\Delta FH$, and $\Delta 2FH$ as a deviation or shift in frequency for those signals with frequencies FL, FH and a harmonic of FH. By use of a modifier (and or) detector, the deviation or shift in phase and or frequency may be measured.

It should be noted although not shown in FIG. 7A, it is possible to provide to the (phase or FM) detector (e.g., for measuring phase and or frequency modulation) any harmonics of FL and or FH, and or any intermodulation distortion component based on FL and FH.

FIG. 8A shows another example of multiple tones/signals, this time with more than two signals. Again, although the FL signal is denoted as larger in amplitude than the FH1 and FH2 signal, (other) amplitude levels may be set for any or all of the signals. In FIG. 8A, the use of more than two signals allows for measuring at least one intermodulation distortion component based on two higher frequency signals such as FH1 and FH2.

FIG. 8B then shows an example of at least some intermodulation and or harmonic distortion components based on FH1 and FH2 (e.g., caused by a non-linearity of a DUT). Not shown in FIG. 8B are other (e.g., intermodulation and or harmonic) distortion components (that may be coupled to a detector) based on any combination of FL, FH1, and FH2 (e.g. caused by non-linearity from a DUT). In FIG. 8B phase and or frequency modulation effect(s) can occur in the following but not limited to:

(FH2−FH1) (a second order intermodulation difference frequency),

FL, (2FH1−FH2) (a third order intermodulation difference frequency),

FH1,

FH2, (2FH2−FH1) (another third order intermodulation difference frequency).

Thus any or all of the above frequency components may be coupled to one or more (e.g., phase and or frequency) detectors. Modifier 26 may be used to ensure a more accurate measurement from any of the detectors.

The double horizontal arrows denote a representation of the shift or deviation (e.g., in terms of phase and or frequency) across each signal component.

Also, the signal deviation or shift (such as frequency deviation or phase shift) is denoted by the following:

Δ(FH2−FH1) or ΔFH IM2D

ΔFL

Δ(2FH1−FH2) or ΔFH IM3DL

ΔFH1

ΔFH2

Δ(2FH2−FH1) or ΔFH IM3DU

ΔnFH3A

ΔnFH3B

ΔnFL wherein n>=2 for example

Of course other distortion products may be coupled to the detector, such as sum and or difference intermodulation distortion components (e.g., of Nth degree distortion and of M signals) for measuring frequency and or phase modulation (and or amplitude modulation). Note that other or higher order harmonic distortion products or signals may be coupled to a detector.

FIG. 9A shows an example of a multiple signal test. In this example, the lower signal frequency FL3 is chosen to be lower than the frequency (FH3B−FH3A). These signals are coupled to the DUT.

FIG. 9B then shows an effect of the multiple tones on a DUT's output signal. In this example, the double arrows for each signal frequency designate a phase and or frequency modulation effect. FIG. 9B then shows that a modulation effect may be present not only at the input signal frequencies, but any or all of the distortion products. The distortion products shown but not limited to are the second order intermodulation distortion from FH3A and FH3B such as (FH3B−FH3A), third order intermodulation distortion products 2FH3A−FH3B, 2FH3B−FH3A, and or harmonic distortion products, nFH3A and or nFH3B (e.g., n>=2). These distortion products include any Nth order intermodulation and or harmonic distortion component(s).

Not shown in FIG. 9b, but can be included are the harmonics of FL (e.g., nFL) and the intermodulation distortion components related to FL and FH3A FH3B (FH3A+/−n'FL, FH3B+/−n'FL, 2FH3A+/−n'FL, 2FH3B+/−n'FL, and or other distortion products, wherein n'>=1). By using a modifier and or receiver/tuner 41, any of these signals or other signals (not shown) may be coupled to a detector for measuring phase and or frequency modulation effects. An amplitude measuring system such as a magnitude detector may be use to measure amplitude effects of the phase and or frequency modulated signals.

For each signal component in the spectrum a modifier such as modifier 26, may "process" the other signals as to reduce interference to a detector. The modifier may comprise filters and or cancellation methods/apparatuses. For example, in some DUTs, the frequency deviation may be large (such as due to any non-linearity, for example, any combination of cross over distortion point(s), near cut off, near saturation, or the like). With possible large frequency modulation effects from the DUT, it is desirable to have sufficient (to maximum) bandwidth around the signal that is coupled to the detector. It may be desirable to ensure sufficient attenuation of interfering signals.

For example, in FIG. 7B, we see that there are dotted lines denoting the 2nd, 3rd, and 4th harmonic of lower frequency signal whose frequency is FL. To optimize in measuring the recovered modulation (e.g., frequency modulation, FM and or phase modulation, PM) of FH, a modifier can comprise of a filter (and or cancellation circuit) to essentially remove or reduce amplitude of FL, 2FL, 3FL, and (or) 4FL (which may include 2FH). The filter can be made of a comb type band reject filter, multiple frequency notch filters, high pass, band pass and or notch filter, or the like.

From FIG. 7B, one can see it may be desirable to at least attenuate 3FL and or 4FL to avoid interfering with the (e.g., frequency and or phase modulation) detection of FH. The previous methods described above allows a wider bandwidth of recovery, whereas if one uses a narrow bandwidth band pass filter around the FH frequency, only a portion of the frequency and or phase modulation will be recovered. The reason is that a narrow band filter around an FM signal restricts recovery of the modulation.

In some cases a band-pass filter (of selected bandwidth) tuned to any signal component from the DUT's output may be sufficient for measuring phase and or frequency modulation effects (e.g., via a demodulator or detector).

Figure 10:
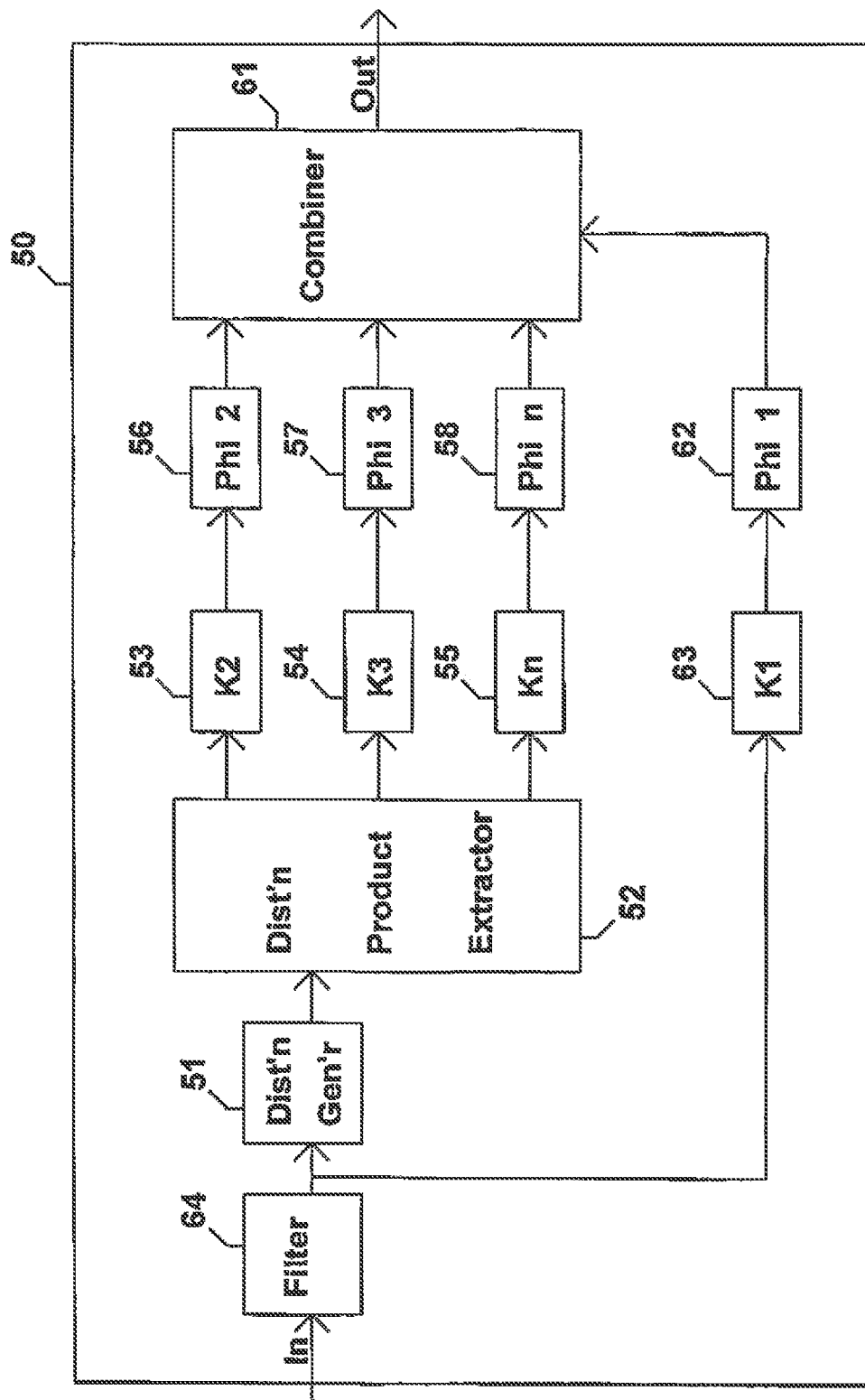
FIG. 10 shows a method to generate amplitudes of fundamental and or distortion products, which for example can be used to reduce various signals after the DUT's output.

FIG. 10 shows an apparatus/method, 50, to generate fundamental and or distortion products for reducing at least one interfering signal when the DUT is coupled to a detector. With the apparatus/method 50 combined with a modifier 26 or 26A, at least some cancellation occurs in one or more interfering signal.

An interfering signal for example, is a signal that reduces the measurement accuracy of (phase and or frequency) modulation effects (of a particular or selected frequency) from the DUT's output. For example in FIG. 7B if the 4th harmonic of FL is close in frequency to FH, then the subsequent detecting for modulation effects will be inaccurate. Because 4FL falls into a band pass of FH, an interference condition occurs that may cause an erroneous measured (frequency and or phase) modulation of FH. In general, a "carrier" signal may be the signal of interest for measuring a modulation effect. In this example, the signal from the DUT with frequency FH is considered as the carrier signal, and a harmonic of the signal FL that has a frequency of 4FL (which would be generated by a non-linearity from the DUT) is considered an interference signal.

In block 50, an input signal is (then) coupled to an optional filter, 64. The input signal is coupled to a distortion generator 51, which can comprise a waveform shaper, mixer, and or nonlinear function. The input signal may be a signal from the blocks 21,22,23, and or 24, or FIG. 3, and or the input signal may be from the DUT's output. Optional filter 64 may for example, then pass a particular signal through such as FL or FH.

In one embodiment, distortion generator 51 may generate harmonic distortion. In another embodiment, generator 51 may generate intermodulation and or harmonic distortion. The output of generator 51 is then coupled to a distortion product extractor, 52, which then output various distortion products (e.g., 2nd, 3rd, and or nth order harmonics (and or intermodulation components)) to a scaling factor and phase compensator or shifter apparatus comprised of blocks 53, 54, 55, 56, 57, and 58. Note as illustrated in FIG. 10, there are up to three outputs from the distortion extractor 52 shown, but more outputs may exist to couple to more scaling factor and phase compensator or shifter apparatuses.

The output of (any number of) the phase compensator circuits or apparatuses (e.g., 56 to 58 and or 62) is coupled to a combining apparatus 61. Also coupled to combining apparatus 61 is the output of phase shifter 62 via scaling block 63, which in this example represent a fundamental frequency signal. The output of combining apparatus 61 then may include any combination of fundamental and or (one or more) distortion products (e.g., harmonics and or intermodulation components), which can be used to then at least reduce interference signal prior to detection.

It should be known that the input of block 50 may contain more than one tone or signal. In this example, distortion generator 51 can generate intermodulation and or harmonic distortion products, and distortion extractor 52 can then extract intermodulation and or harmonic tones or signals. And the output of block 50 then can be comprised of harmonics and or intermodulation signal frequencies, which may be used accordingly to reduce a signal close (e.g., in frequency) to a (particular or selected) carrier (e.g., frequency) signal for detection.

By setting (any of) the scaling factor(s) K1-Kn, any test signal and or any distortion products may be reduced in amplitude or removed via a cancellation effect.

Also note that reducing amplitude or attenuating may include removal.

Figure 11:
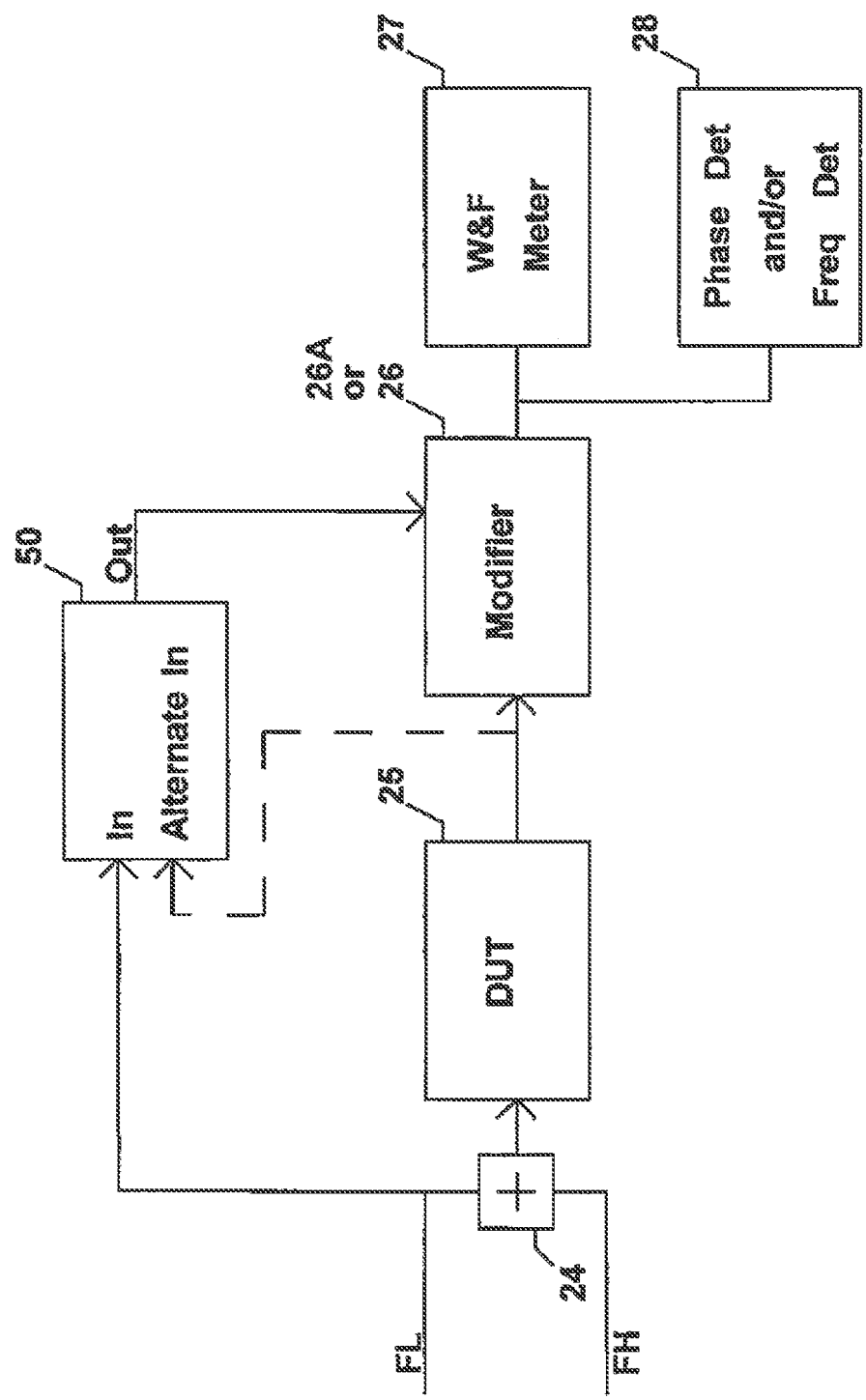
FIG. 11 shows a method to reduce the interference of at least one interfering frequency such that measurements may be made in terms of phase and or frequency modulation of one or more signals.

FIG. 11 then shows an example of block 50 of FIG. 10 for measuring a modulation effect from a DUT. In this example, signals including FL and FH (but not limited to) are combined or summed via a combining circuit 24. Signal FL is coupled to block 50, which outputs any combination of fundamental and or distortion products (e.g., 2nd, 3rd, 4th, and or nth order harmonic and or intermodulation). The output of block 50 then has via the scaling block(s) close to the amplitude of the harmonic distortion (and or intermodulation distortion) from the DUT's output. The output of block 50 may then have (essentially) the same or opposite phase of the fundamental and or harmonic(s) (and or intermodulation distortion product(s)). The DUT output is coupled to an input of the modifier 26 or 26A, and another input of the modifier is coupled to block 50's output. If the modifier is a summing apparatus, then the phase shifter/compensator blocks from block 50 are set to be about out of phase to cancel signal with frequency FL and or at least one harmonic of the signal with frequency FL. And if the modifier is a subtracting apparatus, the output of block 50 will be set for about the same phase so that the modifier may reduce or cancel the frequencies at FL and or its harmonics.

With frequency components around FL and or its harmonics reduced sufficiently at the output of the modifier, the frequency component around FH (in this example) is then coupled to the Wow and Flutter meter and or FM/PM detector (e.g., for a wider frequency range of the recovered (FM and or PM) modulation effect on the signal with frequency FH).

Figure 12:
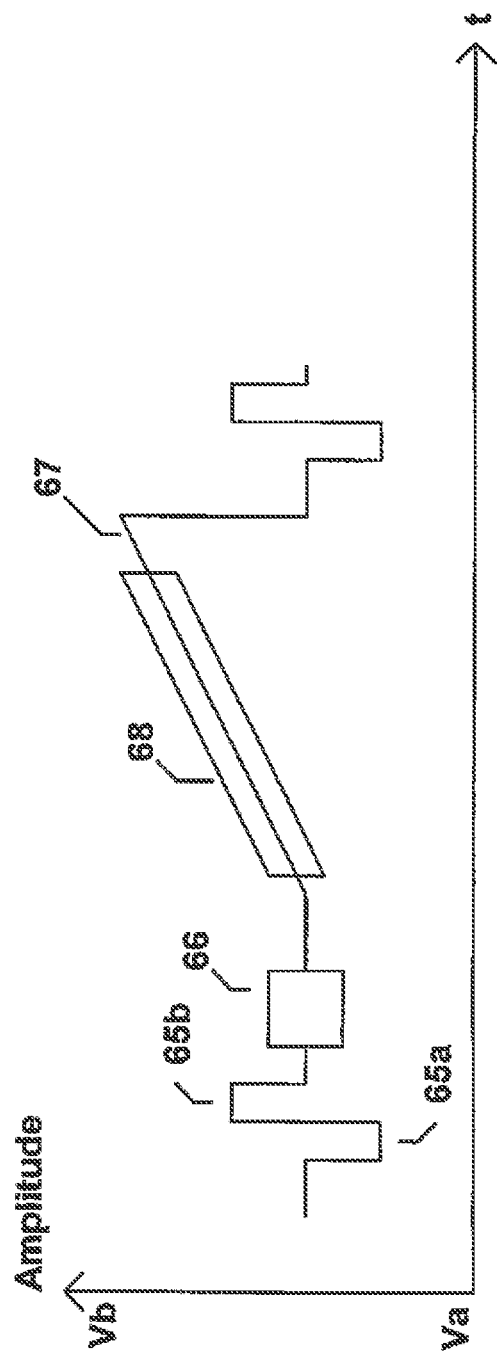
FIG. 12 shows an example test waveform that may include at least one reference signal.

FIG. 12 shows an example waveform for an audio or RF test signal to measure for phase and or frequency modulation effects. An optional sync signal, which may be bipolar as shown by numeral 65*a*, 65*b*, can also be a unipolar sync signal (e.g., such as 65*a* or 65B). A lower frequency waveform such as a ramp or sawtooth signal is shown at 67. A high frequency reference signal is shown at 66, which may contain one or more packets of more than one frequency signal. Also shown is a higher frequency signal, 68, added or superimposed on a portion of the lower frequency signal, 67. Signal 68 may be comprised of more than one frequency in sequence and or in combination. Signal 67 may be comprised of a sinusoid or arbitrary waveform.

Example frequencies of the waveform shown in FIG. 12 can have period of the waveform of $\frac{1}{30}$ of a second, the low frequency ramp, 67, may be about 20 to 30 milliseconds in duration, and sync pulse width (65) may be 2 to 5 milliseconds in duration. Reference signal 66 may have a duration of 1 to 5 milliseconds and with frequencies of 5 KHz, 7 KHz, 10 KHz, and or 15 KHz. Signal 68 may have frequencies similar or the same as reference signal 66. Amplitudes of each signal, 65, 66, 67, and or 68 may be set to any level.

Of course, other waveforms, signals, time durations, and or amplitudes may be used.

One advantage of a signal such as in FIG. 12 is that at least one reference high frequency signal is carried along with this test signal (that then does not require an external reference source such as a reference signal from generators 21, 22, or 23 of FIG. 3), which allows testing of equipment that may include storage or memory, or wherein the output of the DUT is not synchronized with the input. For example, in a storage system, the output of the DUT may output the input signal with a slight different frequency "error" (e.g., 1000 Hz in, 1001 Hz out). Thus, taking a reference phase from an FH signal at the input to make phase modulation measurements will be invalid. But instead, the reference signal 66 is used to generate a continuous high frequency signal for phase detection, wherein the phase (modulation) measurement would be valid since the reference signal (e.g., 66) would encounter the same slight frequency "error" output caused by the DUT.

Note that although FIG. 12 may look similar to a video signal circuit, the present use for devising such a signal is to measure modulation distortion in audio and or RF systems or devices.

On the other hand, in video a (prior art) video test signal is used to measure color saturation or tint effects on a color subcarrier TV signal with a luma signal.

However, in audio, a signal such as shown in FIG. 12 would be used to measure phase and or frequency modulation effects that would cause a sonic or audible characteristic. And in an RF system, extraneous noise may be measured because of phase and or frequency modulation effects, which lead to phase noise that can degrade signal to noise ratio.

Note that FIG. 12 is an illustration by way of example only, and other waveforms may be synthesized. One aspect of FIG. 12 is to carry at least one higher (and or lower) frequency reference signal along with at least one test signal. A synchronizing signal may be added to the test signal, but may not be required. For example, recovering a lower frequency signal via filtering or reducing the amplitude of the higher frequency signal(s) can provide a sync signal. Alternatively, removing or reducing the lower frequency signal may allow using one or more of the higher frequency signal(s) to provide a sync signal.

Figure 13:
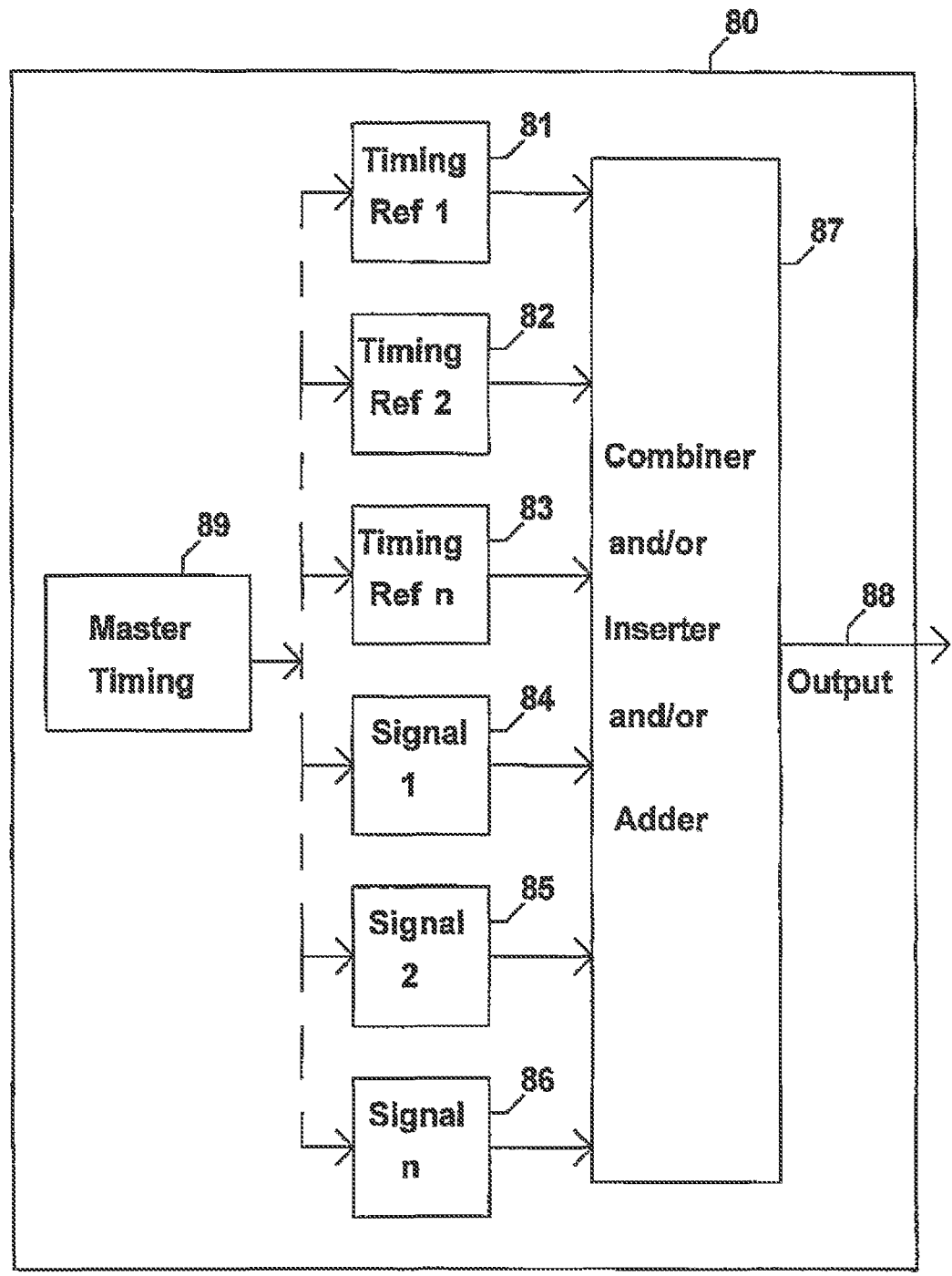
FIG. 13 shows an example embodiment of a method and or apparatus to generate a test waveform.

FIG. 13 shows an illustration of an apparatus, 80, to generate a test signal (e.g., FIG. 12 or other waveform) for measuring modulation effects on at least one particular signal or tone.

One or more reference timing signals is provided by blocks, 81, 82, and 83. Block 83 represents that up to (n or) "n0" reference timing signals can exist. These timing signals may include a synchronizing signal, and or at least one reference high and or low frequency signal in a form of a packet or packets or an arbitrary waveform.

Test signal sources (that may be comprised of low, mid, and or high frequency signals) are provided by blocks 84, 85, and or 86. Again, block 86 indicates that there may be up to (n or) "n1" test signal sources.

A combiner, adder or inserter block 87 receives the reference timing and test signal sources to output a test waveform via 88. This test waveform can then resemble part of or all of FIG. 12, or this test waveform from 88 may produce another waveform.

Also shown is block 89, which allows synchronizing the various reference and or signal timing sources. For example, block 89 may provide the order (e.g., sequence) when each reference and signal source occurs in a generated waveform at the output 88.

Block 89, 88, and or 80 may also provide sequence a different waveform at start of the next reference timing period (e.g., synchronizing or reference frequency signal).

Figure 14:
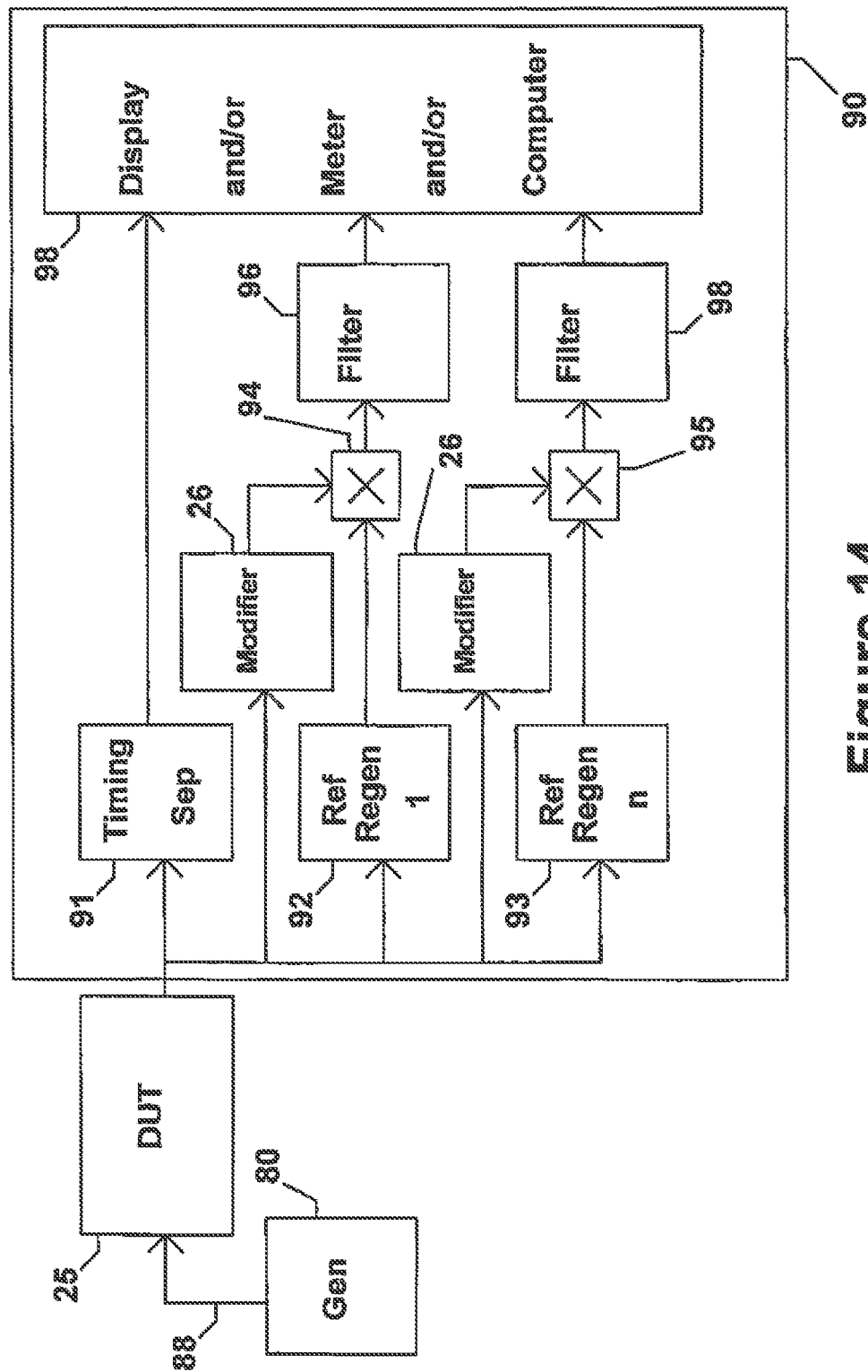
FIG. 14 shows an example embodiment that can measure phase and or frequency modulation

FIG. 14 shows a measurement system, 90, that utilizes a test waveform from generator 80. Output 88 is coupled to the input of a DUT, 25. The output of the DUT is then coupled to an input of 90. Thus the DUT's output is coupled to a timing separator 91, and one or more reference signal regeneration circuits, 92 and or 93. Block 93 represent that there can be as many as "n" reference signal regeneration circuits. An example of the reference regeneration circuit (e.g., phase lock loop, oscillator, or the like) is to provide signal (e.g., of a (fixed) phase and amplitude) that extends in duration beyond the reference signal packets, such as 66 of FIG. 12. The output of one or more reference signal regeneration circuit is then coupled to one or more mixer or multiplier or non-linear circuit (e.g., 94 and or 95) to provide phase detection of the DUT's output (e.g., from a selected signal from DUT 25). So circuits 94, and or 95 receive(s) a coupled signal from the DUT's output via a modifier such as 26 or 26A. The modifiers remove an interfering signal component prior to the input of circuits 94 and or 95. The output phase detector 94 and or 95 is coupled to a filter (e.g., 96 and or 97) of particular bandwidth.

The output of filter 96 and or filter 97, and a timing signal from timing separator 91 are coupled to a measurement system, display, meter, and or computer to measure, display and or compute the DUT's phase variation as a function of a lower frequency signal such as a ramp or other waveform. If the slope of the phase or derivative of the phase variation is taken (e.g., by a differentiator circuit and or by computation), a frequency modulation variation as a function of the lower frequency signal may be provided.

Figure 15:
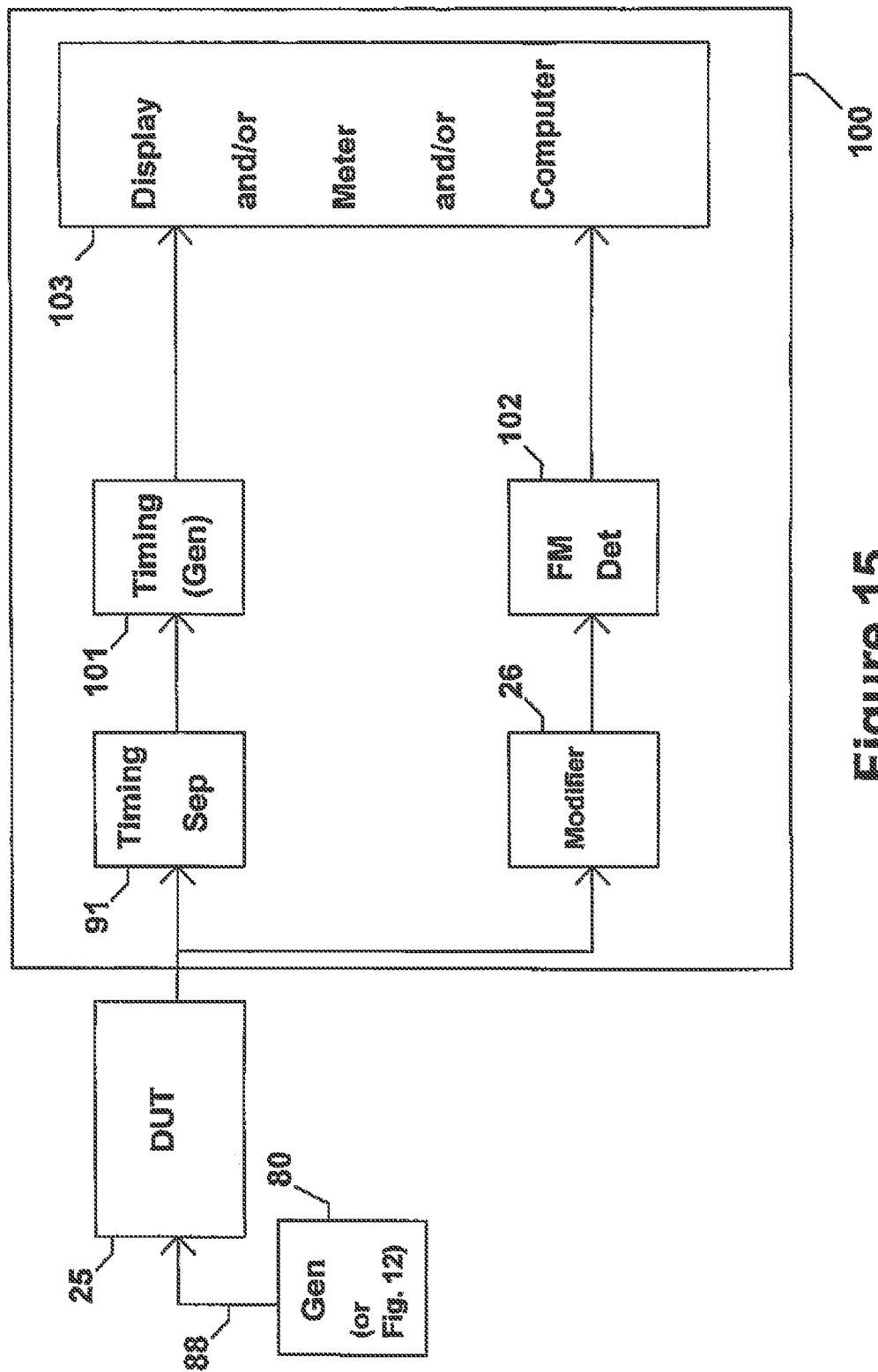
FIG. 15 shows an example embodiment that can measure frequency or phase modulation.

FIG. 15 shows an example of using waveform generator 80's output to measure frequency modulation effects from a DUT. The signal 88 is coupled to the input of the DUT, 25, whose output is then coupled to system 100, which includes a timing reference circuit 91 and a modifier 26. The output of the timing reference circuit 91 is coupled to an optional timing circuit 101. The output of the modifier 26 is coupled to an FM detector, 102. Display, meter, and or computer 103 is coupled to the timing reference signal and to the output of FM detector 102. Block 103 then can measure and or display a frequency deviation or shift of a signal or tone as a function of a lower frequency signal such as signal 66. By integrating (e.g., via an integrator circuit and or by computation) the FM detector's output, a phase variation measurement may be provided. Note that one or more FM detectors may be used for system 100.

Figure 16:
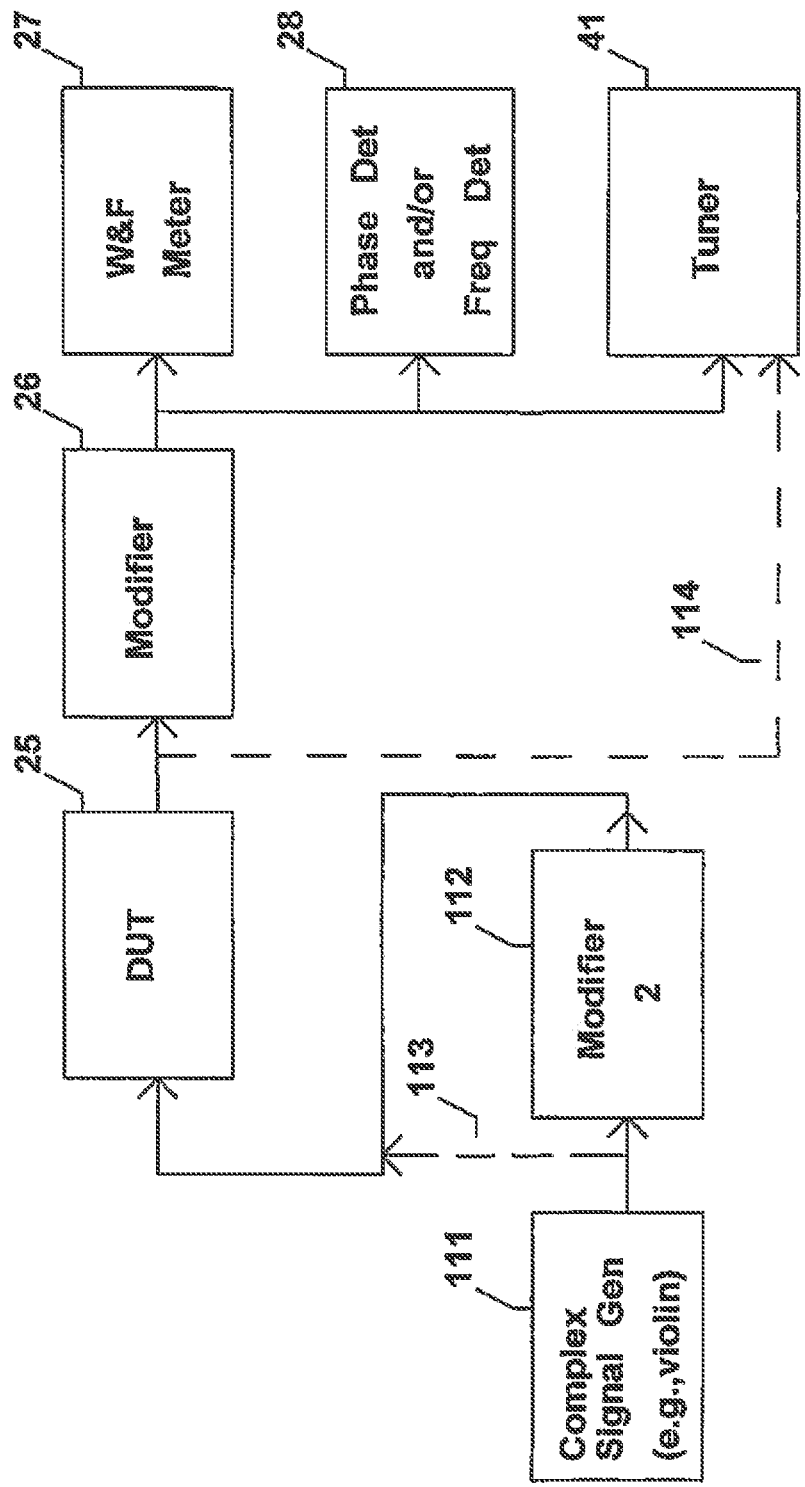
FIG. 16 shows an example of using a complex signal to test for phase and or frequency modulation of one or more selected signals.

FIG. 16 shows another example for testing for modulation effects based on two or more frequencies. Block 111 represents one or more complex signals. A complex signal may include music. For example, block 111 may include a violin or other musical instrument's note or notes. In a violin, an "A" 440 Hz note has a fundamental frequency much larger in amplitude over its harmonics.

For this example, in general, this complex (440 Hz) signal is then coupled to a DUT via line 113. The output of the DUT is then coupled to a modifier, 26, which reduces the amplitude of the fundamental and or other harmonics. A (remaining) selected harmonic (e.g., 10th harmonic at 4400 Hz or 20th harmonic at 8800 Hz) is to be coupled to a Wow and Flutter meter 27 (e.g., a modified Wow and Flutter meter to measure beyond a standard 3 KHz signal), a phase and or FM detector 28, and or a tuner/receiver, 41 (for measuring modulation effects such as PM and or FM and or Wow and Flutter). It should be noted in general, a particular musical note or signal has a fundamental frequency component and various harmonics. To measure the "nth" harmonic for phase or frequency variation, prior to coupling the musical signal to the input of the DUT, it may be preferable to remove or attenuate any harmonic(s) near/around the "nth" harmonic. For example, attenuate or filter out the "(n−1)th" (and or "(n−2)th") and or "(n+1)th" (and or "(n+2)th") harmonic of the musical signal prior to coupling to the input of the DUT.

Note the tuner/receiver 41 may be coupled to the output of the DUT, and tuned to the various harmonics and or fundamental to measure for modulation effects (e.g., phase and or frequency shifts).

In another variation or example of this test method and apparatus utilizing one or more complex waveforms from block 111, the output thereof is modified via a modifier 112 to reduce or remove one or more (signal) frequencies prior to coupling to the DUT. The output of the DUT is then coupled to the modifier 26 or 26A to remove any interfering signals prior to meter 27 (e.g., for Wow and Flutter measurement on a selected frequency) and or FM detector 28 (for measuring modulation effects). Tuner/receiver 41 may be coupled to the output of the DUT (or to the output of modifier 26 or 26A) for measuring any modulation effects (e.g., phase and or frequency shifts) of any signal from the DUT.

It should be noted that the complex signal source 111 may include one or more "voices" or musical instruments.

Thus, source 111 may be substituted for any of the signal sources previously mentioned (e.g., 111 may substitute for the sources 21, 22, and or 23; 67 and or 68; 84, 85, and or 86; or the like).

It should be known that a source such as 111 may be used in conventional testing such as harmonic and or intermodulation distortion measurements with or without a variable bias condition.

Figure 17:
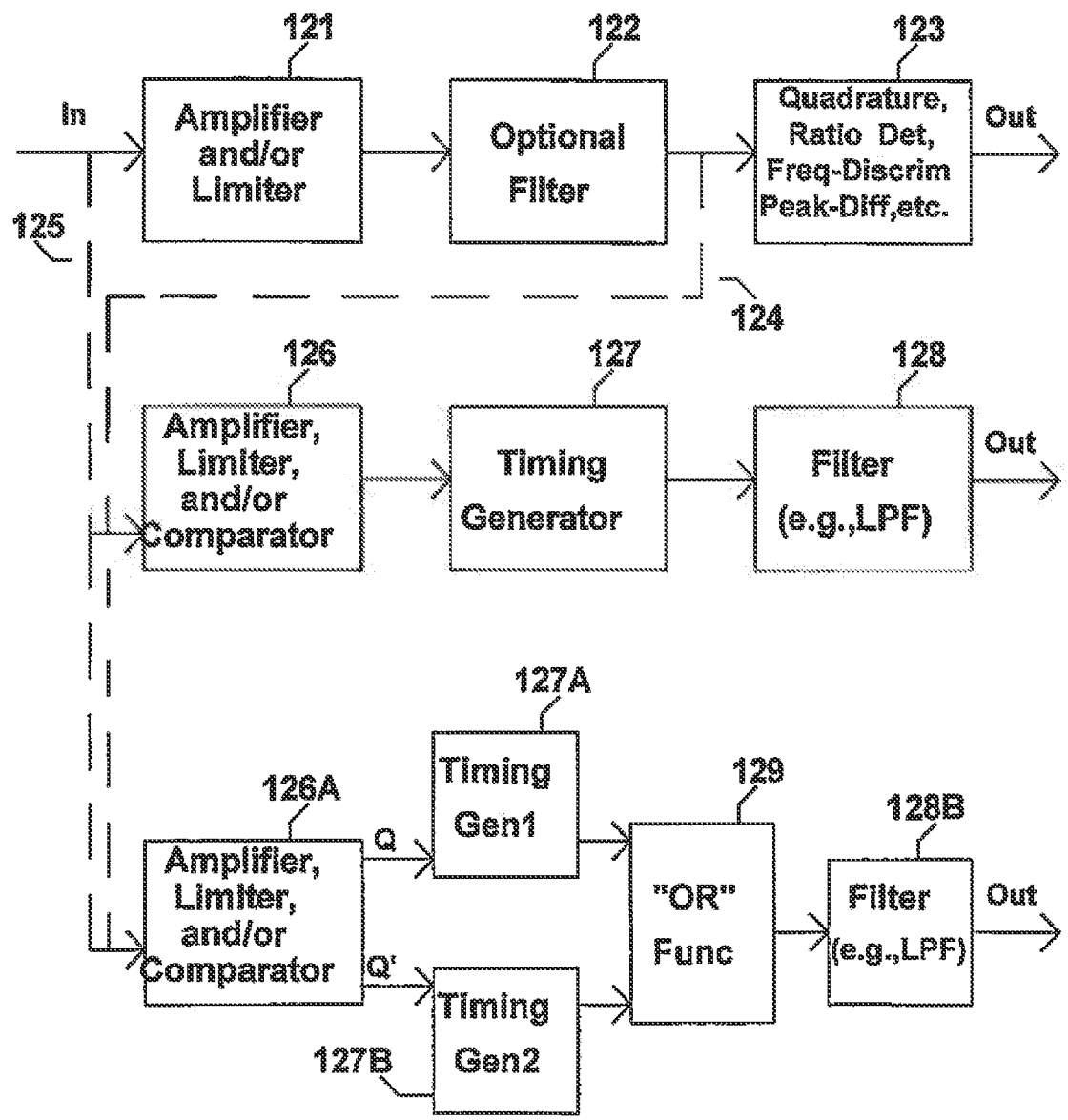
FIG. 17 shows one or more ways to detect or demodulate a signal that has a frequency modulation effect.

FIG. 17 shows various ways to detect or demodulate an FM signal. A signal 125 coupled via the DUT's output (e.g., and is sufficiently free of interfering signals for detection of a particular carrier or selected signal/tone) is coupled to an amplifier and or amplitude limiter amplifier, circuit 121. The output of circuit 121 is coupled via an optional filter 122 to a detector 123. Block 123 may be implemented in terms of a phase detector, quadrature detector, ratio detector, slope detector, regenerative detector, discriminator, phase lock loop, peak differential detector, and or a frequency to voltage/current converter.

One example of a frequency to voltage/current converter is shown by blocks 126, 127 and 128.

A second example of a frequency to voltage/current converter is shown at numerals 126A, 127A, 127B, 129, and 128B. Both examples shown are also known as pulse counter (FM) detectors. In particular the second example (via block 128B) is used in analog video recorders, and has an advantage of recovering a wider bandwidth than the first pulse counter detector (via block 128) or many of the examples of detector 123.

For the first (example) pulse counter detector, a (limiter) circuit 126 is coupled to the signal 125 from the DUT, which may include a modifier 26, or block 126's input may be coupled to the optional filter 122. The output of amplifier, limiter, and or comparator 126 is then coupled to a timing circuit, which generates a fixed duration pulse (triggered from either edge of block 126's output). The output of block 127, which is a train of fixed width pulses, is coupled to a low pass filter 128, which then provides a voltage in proportion to the frequency of the carrier or selected signal or tone. If the selected signal or tone shifts up in frequency, more pulses per time will occur and the low pass filter output will increase. If the selected signal or tone shifts down in frequency, less pulses per time from block 127 will occur and the output of low pass filter 128 will decrease.

The second example of pulse counter (FM) detector receives the signal 125 (dashed line) and utilizes both rising and falling edges (e.g., of the selected carrier signal) via the comparator/amplifier/limiter 126A's (complementary) outputs. Each 126A output is coupled to a timing generator 127A and 127B, and both 127A and 127B deliver a fixed pulse duration for its output. A logic OR (function) circuit 129 is coupled to each output of the timing generators, and the output of circuit 129 then is a double rate or double frequency FM signal from the selected tone or signal. With the double rate signal, the bandwidth for the low pass filter 128B may be extended (e.g., over filter 128), for a greater recovered information.

In some tests of DUTs that may include crossover, quantizing, and or clipping distortion, the second pulse counter detector (e.g., via 126A,127A,127B,129, and 128B) is more desirable in that the discontinuous (wider band width) nature of the phase and or frequency modulation effect is more faithfully reproduced.

Other types of testing may include a modulated waveform such as AM, PM, and or FM coupled into the DUT with or without dynamic biasing for measuring any extraneous sidebands, and or any deviation from the recovered modulation, which may include harmonic and or intermodulation distortion and or phase and or frequency modulation effect(s). The dynamic biasing may include a period waveform, an arbitrary or programmed waveform, and or at least one modulated signal.

Figure 18A:
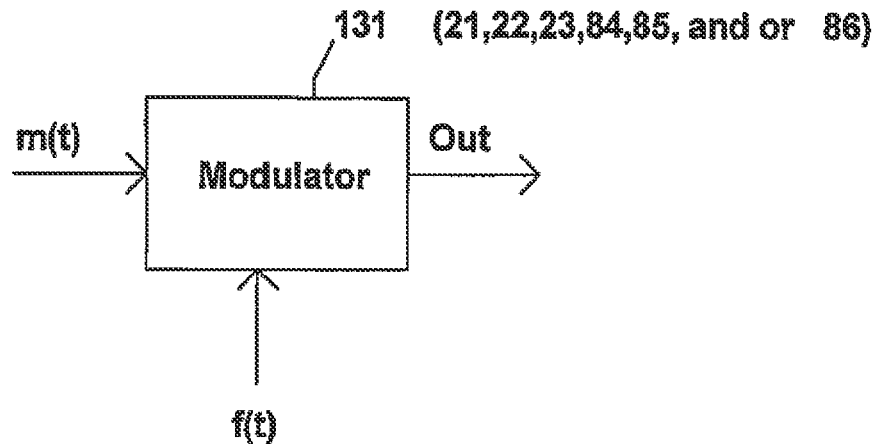
FIG. 18A shows a modulator, which may provide a modulated signal source.

In terms of another signal source or sources, any of the previously mentioned signal sources may be a modulated signal source. As shown in FIG. 18A, a modulated signal source with a modulating signal m(t) and a "carrier" frequency signal f(t) may be used. The output of FIG. 18A or 131 may then provide an amplitude, frequency, and or phase modulated signal (e.g., for coupling to a DUT). The output of 131 may serve as a signal source for any waveforms in FIG. 12 (e.g., 131 output, a modulated signal may be used for 66, 67, and or 68). (It should be noted that a modulated signal may include a zero modulation.)

For example, an amplitude modulated signal (e.g., for coupling to a DUT) may include single sideband, double sideband suppressed carrier, double sideband with carrier, and or a vestigial amplitude modulation. Amplitude modulation may include pulse amplitude modulation and or a variation of a carrier signal's amplitude level.

For phase modulation, examples may include I and Q type phase modulation, phase shift keying modulation, or simple phase modulation. Examples of frequency modulation may include narrow and or wide band frequency deviation and or frequency shift keying modulation. Frequency and or phase modulation may include vestigial frequency and or phase modulation.

Other examples of modulation may include pulse code modulation (e.g., for block 131)

In an example for amplitude modulation, a continuous tone signal of 3 KHz and an amplitude modulated 16 KHz signal was combined and coupled to a DUT (e.g., a two transistor amplifier of previous mention.). In the previous example, it was shown experimentally that a lower frequency signal combined with a higher frequency signal caused an induced phase and or frequency modulation effect on the higher frequency signal. In this example, the amplitude modulated higher frequency signal caused an induced phase and frequency modulation effect on the lower frequency signal. In one experiment a 100 Hz sine wave (e.g., m(t)) amplitude modulated a 16 KHz signal (e.g., f(t)) to generate this amplitude modulated signal that is combined with a 3 KHz signal for the DUT's input signal. With a band pass filter or modifier (e.g., to remove the 16 KHz amplitude modulated signal and pass through the 3000 KHz signal) coupled from the output of the amplifier or DUT to a Wow and Flutter meter, and it was found that 0.03% Wow and Flutter was measured. Again, this is an unexpected result (e.g., normally it would be expected that an electronic amplifier has Wow and Flutter=0.000%, or an amplifier should exhibit no Wow and Flutter) in that a higher frequency signal induces a phase and or frequency modulation onto a lower frequency signal. It should be noted that a frequency, (and or phase) modulated signal may have been used to modulate a signal. For example, many devices may exhibit a variation in frequency response. A frequency (or phase) modulated signal will then cause a incidental amplitude modulation effect when the device has a variation in frequency response, which will cause a (differential) phase or frequency modulation effect on another signal from the device. For example, a envelope variation of a carrier frequency signal can induce phase or frequency modulation effect(s) on another signal. The envelope may include two or more signals added to form an envelope to cause a modulation effect (e.g., on another signal such as a lower and or higher frequency signal).

Figure 18B:
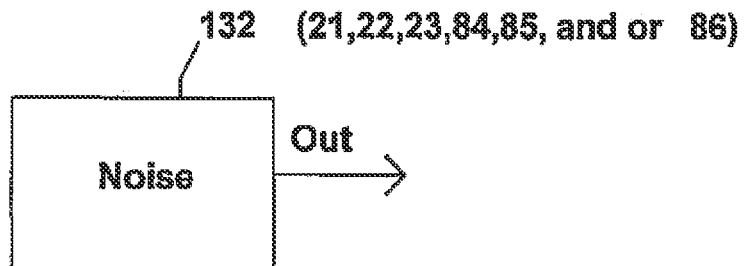
FIG. 18B shows a noise generator, which may provide a noise signal source.

FIG. 18B shows that any of the signal sources may include a noise generator. The noise source as a signal source may include filtering to shape one or more types of frequency responses. In one example, a noise source may be substituted for any of the previously mentioned signal sources and or used for a modulating signal source such as m(t) in FIG. 18A.

Figure 18C:
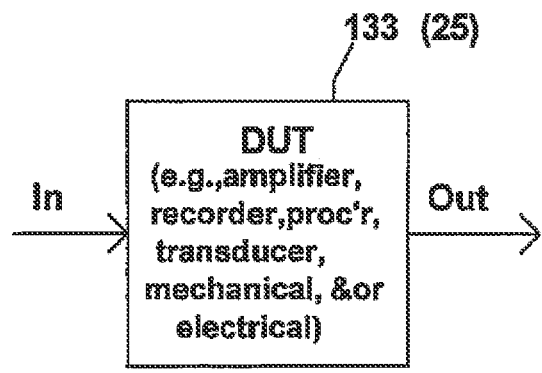
FIG. 18C shows one or more examples of the DUT.

A DUT or device under test may include an amplifier (stage), processor, recorder, transducer (e.g., microphone and or speaker, earphone, or the like), a mechanical device, an electromechanical device, an optical device, an electrical device, a magnetic device, and or an electromagnetic device. Any of these examples may be measured for an induced phase and or frequency modulation effect cause by one or more frequencies. FIG. 18C shows such examples of any DUT.

In an example of using an electromechanical device or transducer, a microphone may be tested for induced phase and or frequency modulation by sonically generating two or more sounds of different frequencies into the microphone and then outputting the microphone's signal to a detector and or modifier and detector for measuring phase and or frequency modulation effect(s). The multiple frequency sounds for example may be generated by musical instruments, and or loud speakers. In an example of using a loudspeaker or speaker system, signal(s) of multiple frequencies may be applied to a loudspeaker or loudspeaker system. The amplifier driving the loudspeaker would have to generate low amounts of induced phase and frequency modulation distortion itself. A method to avoid the need of a "perfect" amplifier is to use one amplifier for each (e.g., single) frequency signal and or to use a separate speaker for each amplifier. For example, for a two (or n) signal test, two (or n) amplifiers and two (or n) speakers are used. This way there is no induced phase or frequency modulation effect from the amplifiers or from the speakers since each item handles a single frequency. The multiple speakers then generate multiple sound signals to the microphone for testing in terms of a modulation effect (e.g., phase and or frequency).

So transducers such as loudspeakers, phonograph pickup cartridges, and or microphones (or other devices) may be tested for differential phase and or (differential) frequency modulation effect(s).

The invention or an embodiment is not limited to electrical devices. Mechanical devices may be tested similarly. Optical devices with different wavelength sources entering the optics may output a shift in wavelength caused by least one of the entering wavelength sources.

In the instance of magnetic or electromagnetic devices, examples would include waveguides and or antennas. For example, nonlinear effects of dielectrics may cause an induced phase and or frequency modulation effect. Some types of inductors and or transformers may be included as examples of magnetic or electromagnetic devices.

In terms of an RF or radio frequency system, any of the embodiments are applicable. For example, in a broadband front end section of a receiver (e.g., broadcast or shortwave or higher frequency such as VHF or UHF) a lower frequency signal may induce a phase and or frequency modulation effect on receiving a higher frequency signal (or vice versa where by a higher frequency (RF) signal may induce a phase and or frequency modulation effect on a (received) lower frequency (RF) signal.) For example in AM broadcast, which has a range of 535 KHz to 1605 KHz, a large amplitude signal at 540 KHz can affect a received signal of 1600 KHz if the front end is broadband and uses a solid state device. Under a large signal condition, the solid state device has a varactor effect, which changes capacitance or reactance versus a voltage swing. The lower frequency signal at 540 KHz causes a modulation effect on the reception of the higher frequency 1600 KHz in terms of adding extra phase noise.

Any of the embodiments is applicable to electromechanical systems as well. For example, recorders or players can be tested for induced phase and or frequency modulation distortions caused by multiple input signals. Some players and or recorders may or may not include a mechanical apparatus, but can still be tested by any of the inventive methods mentioned.

A DUT may include audio compression systems, whether for audio processing and or for reduced data rate.

It should be noted that a time (or frequency) scaled version (e.g., time compressed and or expanded) of video test signals such as multiburst, modulated ramp or stairstep, multipulse, and or modulated sine squared pulse, is useful in testing various aspects of audio and RF devices (or a DUT). (Note that a varying biasing voltage or current may be used with any of these time scaled video signal provide new methods of testing.) As an alternative, it is possible to provide a video like signal (such as those video signals previously mentioned) into a DUT's input and then sample and store the output signal of the DUT. With the stored signal in memory, one would then clock the memory out at a rate such that a video test equipment (e.g., vectorscope or Tektronix VM700) will be able to measure differential gain and or phase, and or other video performance tests such as luma/chroma delay, K factor, and the like.

In terms of any of the signals from the output of a DUT, any of these signals may be processed. For example, any signal from the output of a DUT may be frequency mixed, modulated, shifted, and or translated to another frequency for measurement. Any signal frequency from the output of a DUT may be divided and or multiplied for a measurement (e.g., for a modulation effect).

One embodiment may be summarized as: A method of measuring frequency or phase modulation effects of an electronic, electromechanical, optical, mechanical, electromagnetic, magnetic, optical, and or transducer device, wherein the device has an input and an output, comprising:

coupling two or more frequency signals into the input; and providing an FM detector and or a phase detector coupled to the output of the device, to measure a frequency or phase modulation effect or frequency or phase shift for one or more frequency signals at the output of the device. It should be noted that the device's output may be coupled to a modifier's input, and the modifier's output may be coupled to a detector.

It should be noted that any or all of the previously mentioned methods, embodiments, and or apparatuses may be implemented in any combination of analog, digital, and or software.

For example, the complex or composite signal(s), modifier, and or detector may be generated in the analog domain, digital domain, and or in software.

As a further note, any or all the embodiments may be used for measuring a phase and or a frequency modulation effect of devices, which may include video devices. So the scope of the invention, may include audio, video, RF equipment, circuits, and or devices. On other note, the signal or signals coupled to the input of the device or DUT may include a source impedance. This source impedance may include any combination of resistive, capacitive, and or inductive element(s). For example, the signal coupled to an RF amplifier may be of moderate impedance such as 300 ohms. And in an audio amplifier, such as a phono cartridge preamplifier, the signal may be coupled to the phono preamplifier via a 500 millihenry inductor, a 500 pico farad capacitor, and a 47 thousand ohm load resistor, which may represent a high impedance signal source. Because RF and audio amplifiers may have input amplifier stages with nonlinear capacitance (or nonlinear inductance), including (a) source impedance for the signal source(s) may be necessary to reveal phase and or frequency modulation effect(s), such as those mentioned in any of the embodiments. It should be noted that the output of any DUT may be loaded. For example, a DUT's output may be loaded with a resistive, capacitive, inductive, and or electromechanical device (e.g., headphone or loudspeaker system). An output load for the DUT may reveal phase and or frequency modulation effect(s).

Figure 19:
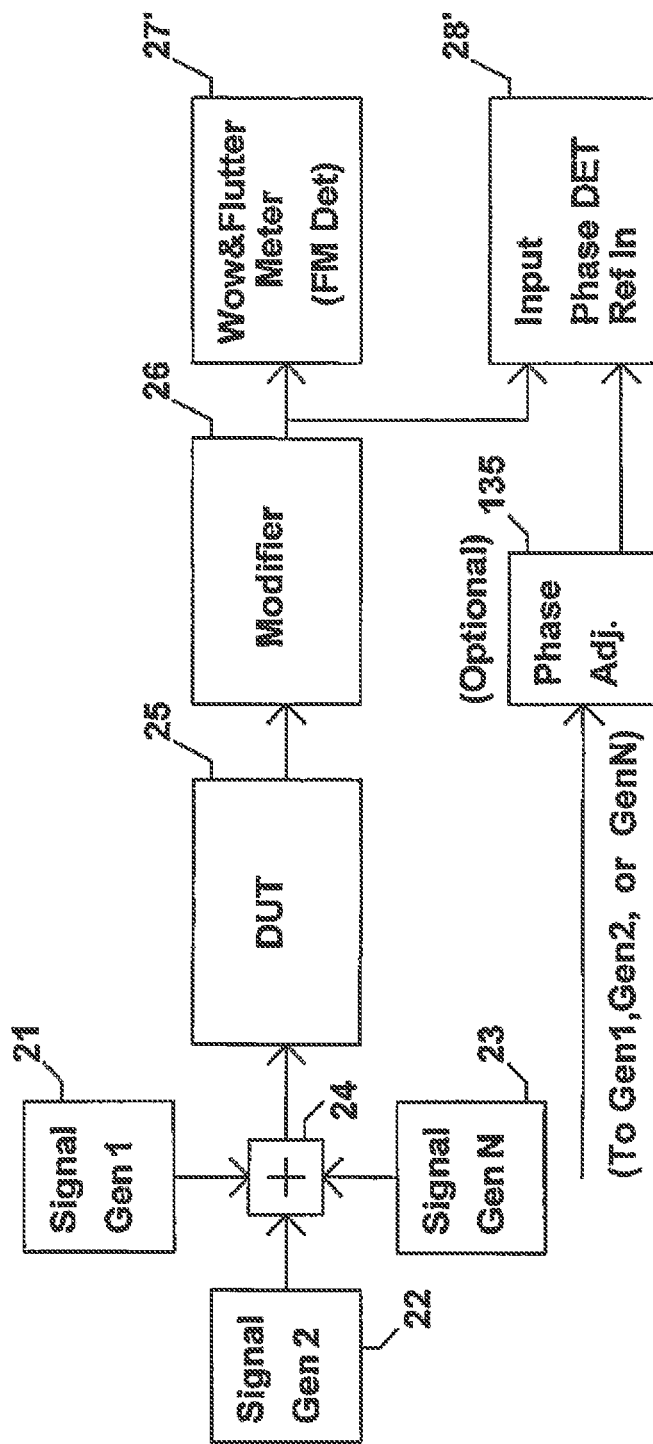
FIGS. 19, 20, 21, and 22 show examples for measuring differential phase by deriving a signal from one or more input source and coupling to a phase detector.

FIG. 19 shows an embodiment that allows measuring differential phase and or frequency modulation effects on a device under test. Signal generator 21, 22, or 23 is coupled to an optional phase shifting circuit 135. Block 135 may be needed to allow the phase detector 28' to work in its linear region or in its center region for the phase versus voltage (or current) output. It should be further noted that the DUT may include a time delay, which block 135 can be used for compensating to the phase detector. Block 135 may include an oscillator circuit that is coupled to any of the signal generators.

(For FIGS. 19 to 22, block 135 may include or be a phase lock oscillator, a phase lock loop circuit, crash locked oscillator circuit, triggered oscillator circuit, or the like, whose input of 135 is coupled to a signal generator's output e.g., to an input signal source.)

Figure 21:
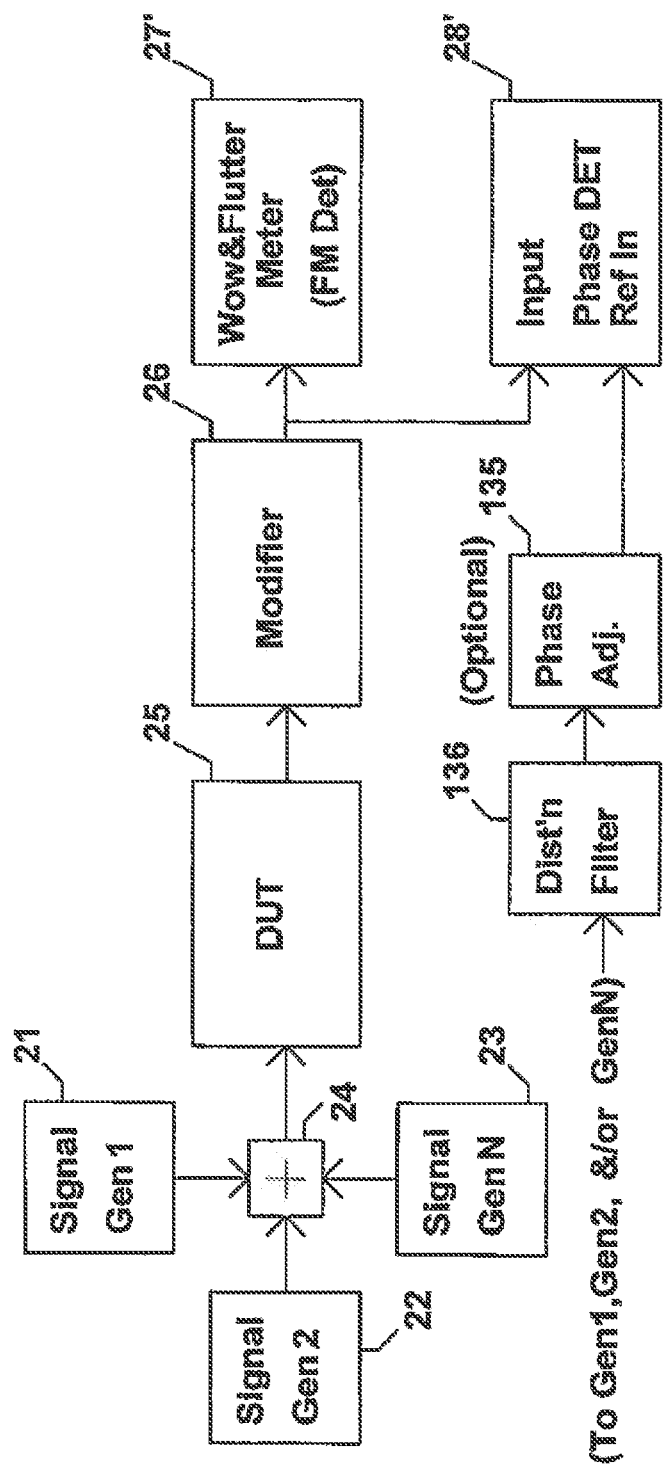
Figure 22:
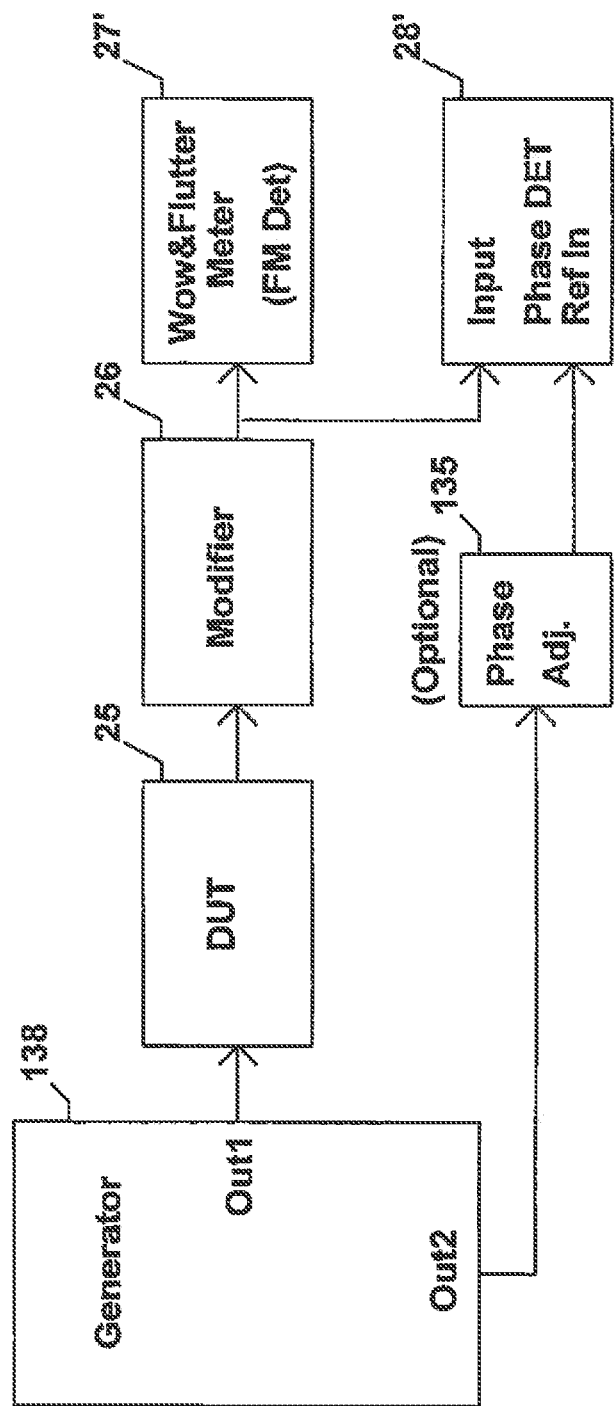

(In FIG. 21 or 22, block 135 may lock onto a fundamental frequency, harmonic or intermodulation distortion signal derived from one or more signal generators.)

The output of 135 is coupled to an input of a phase detector 28'. In general, a selected input signal is coupled to a first input of the phase detector (28'). This selected input signal coupled to the first input of the phase detector is indicative of the frequency passed through by modifier 26. As previously mentioned in FIG. 3, two or more signals are summed via summing/combining circuit 24 and coupled to the device under test (DUT), 25. The output of DUT 25 is coupled to the input of modifier 26. A modifier, 26, (at its output) removes or attenuates one or more signals of (each) selected frequency, while passing through the signal for testing phase and or frequency modulation effect(s). The output of the modifier is then coupled to a second input of the phase detector. The output of the phase detector 28' (or FM detector 27') then is generally coupled to a (suitable) filter for measurement on an oscilloscope or meter. In FIG. 19, block 27' is optional, if Wow and Flutter or a frequency modulation effect is further measured.

An example of FIG. 19 would have in a simplest form, two signals (e.g., 21 and 22, with 23 not used), Gen1 and Gen2. For instance, the frequency of Gen1 of less than the frequency of Gen2 (e.g., frequency of Gen1<=1000 Hz, frequency of Gen2>=3000 Hz). These two signals will be coupled to DUT 25 and the modifier 26 will remove the lower frequency signal, leaving the higher frequency signal to be coupled to the second input of the phase detector 28'. And, Gen2 is then coupled to the first input of the phase detector 28'. The output of 28' may include a filter that removes frequency components of Gen2 or higher for measurement on a scope or meter. On a scope for this example, the triggering is preferably locked via the Gen1 or lower frequency source.

Figure 20:
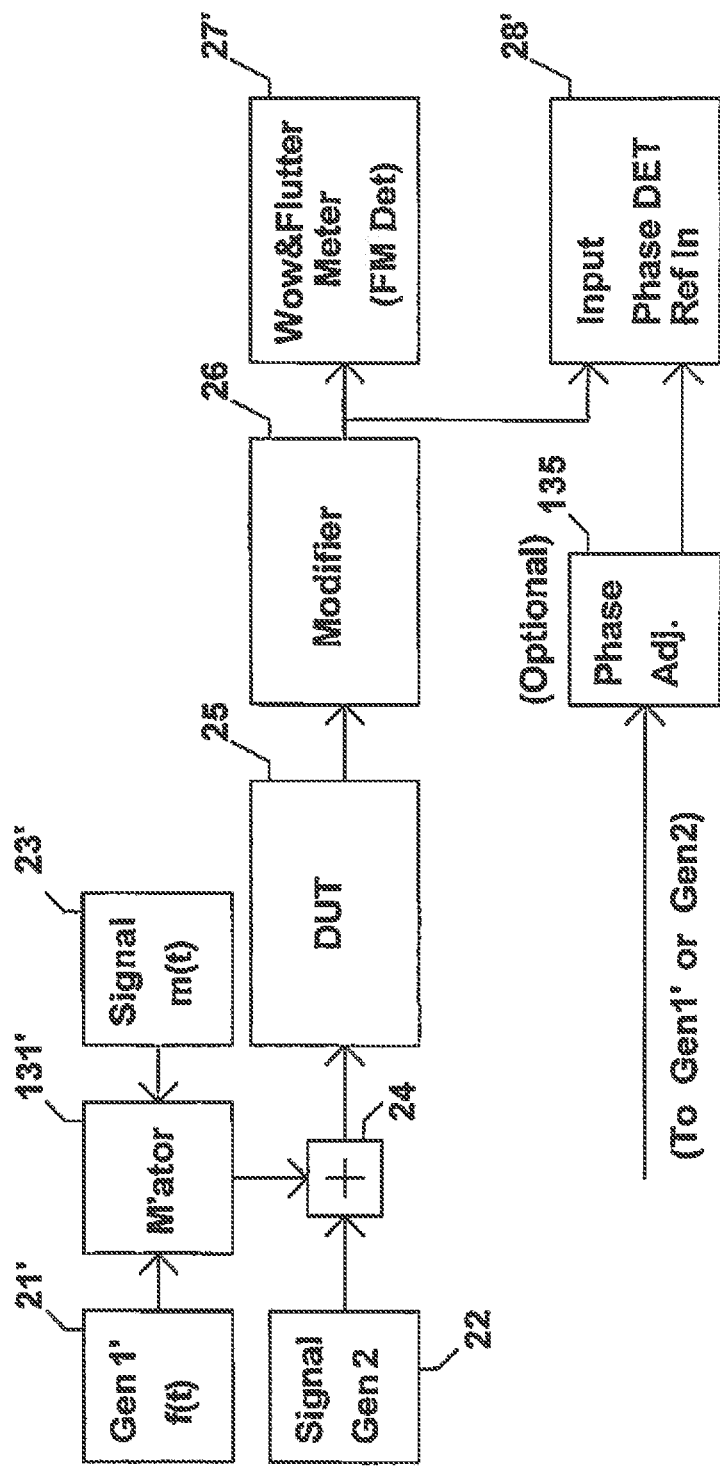

As explained previously for FIG. 3, frequency deviation or modulation effects is measured via 27, and thus, similarly for 27' in FIG. 19 (or 27' in FIGS. 20-22).

FIG. 20 shows an embodiment of the invention including a modulated signal into the DUT. Generator 23' is a modulating signal, m(t) and generator 21' is a carrier signal, f(t). Signals from 21' and 23' are coupled to a modulator, M'ator, which is block 131'. Modulator 131' may include for example an amplitude modulator (or other type of modulator).

The input of the DUT is then coupled to the output of the modulator and signal generator 22. The output of the DUT is then coupled to the modifier 26 to remove/attenuate signals related to the modulator while passing a signal related to generator 22. Again, the output of the modifier 26 is coupled to a second input of phase detector 28' while a first input of phase detector is coupled to generator 22, Gen2 for example. The output of 28' then allows measurement of phase modulation on a frequency of Gen2 based on modulating a (higher) carrier frequency. Also, via 27', frequency modulation effect(s) is measured for frequency deviation or shift on a frequency related to Gen2 based on modulating a (higher) carrier frequency. For measurement on a scope, the triggering signal is preferably coupled to m(t), the modulating signal, which causes the phase or frequency modulation effect on the DUT.

An example of FIG. 20 may include the frequency range of m(t), the modulation signal as <=1000 Hz, and a carrier frequency for f(t) as >5000 Hz, while the frequency range of Gen2 being between the frequency of m(t) and f(t). One example would have the carrier frequency (of f(t) or 21') at 16 KHz, the modulation frequency of m(t) or 23' at 500 Hz, and the frequency of Gen2 at 4000 Hz. In this example, the 500 Hz signal (amplitude) modulating a 16 KHz signal along with a 4000 Hz signal to an input of the DUT will cause a phase (or frequency) modulation at the output of the DUT for a frequency in or near Gen2 or 4000 Hz. Thus, the phase detector 28' receives a first input signal from Gen2 and a second input signal from the modifier, which removes/attenuates the 16 KHz modulated signal (e.g., carrier and sideband signals from the modulating signal), while passing a signal for Gen2 (e.g., 4000 Hz, and neighboring sidebands of Gen2). Of course other (ranges of) frequencies may be used for m(t), f(t), and or Gen2.

It should be noted that a modulated higher frequency signal (such as amplitude modulation on a higher frequency signal) causes some amplifiers to slew or nearly slew as the amplitude of the higher frequency signal is modulated upwards. When an amplifier outputs a higher frequency signal (e.g., carrier signal that is amplitude modulated) that includes conditions of non-slewing, near slewing, and or slewing, the lower frequency signal (e.g., frequency of Gen2) will exhibit phase and or frequency modulation effects. Thus, an amplifier's slewing effects or transient intermodulation distortion under varying high frequency amplitudes results in a frequency or phase modulation effect on a lower frequency signal. Slewing or transient intermodulation distortion occurs (but is not limited to) when one or more stages of an amplifier overloads, approaches clipping/cutoff/saturation, or creates gross distortion, as frequency is increased at the input, or when a fast rise time signal is applied to the input. Thus, an embodiment of the invention is to measure phase or frequency or amplitude modulation of one or more signals other than the signal that is approaching slewing (e.g., approaching its slew rate) or slewing (e.g., output is at the slew rate). For example, suppose an amplifier generates a marked increase in distortion at a particular output level of a signal at frequency of FH (e.g., frequency of FH>10 KHz, e.g., frequency of FH=15 KHz). Then a test signal may comprise or include an amplitude modulated signal at 15 KHz and a lower frequency (e.g., <15 KHz, e.g., 3 KHz) signal added and or an extra higher frequency signal added (e.g., >15 KHz, e.g., 19 KHz). This example test signal is coupled to an input of the DUT, with the output of the DUT modified to remove the amplitude modulated 15 KHz signal, or to pass through a band of frequencies around the lower frequency signal such as 3 KHz and or around the extra higher frequency signal such as 19 KHz. A phase or frequency or amplitude measurement is done (e.g., via a phase or frequency amplitude detector, or sideband/computational analysis) on the lower frequency signal and or the extra higher frequency signal. The modulation signal has a frequency typically less than the lower frequency signal, which for example may include sinewave(s), sawtooth waveform(s), or other waveform(s).

Thus, an embodiment may include for measuring phase, frequency, and or amplitude modulation effect of one or more signals from a DUT's output, coupling to the input of the DUT a first signal, which is modulated, and a second and or Nth signal whose frequency is different from the frequency of the first signal, coupling the output of the DUT to a modifier to remove a signal related to the first signal, or a modifier to pass one or more frequencies related to the second or Nth signal, and coupling the output of the modifier for measurement of phase, frequency, and or amplitude modulation effect (via the DUT) on the second or Nth signal induced by the first signal or modulated signal.

An embodiment (of the invention) includes coupling to an input of a DUT a first signal that comprises an amplitude modulated carrier signal and a second and/or Nth signal whose frequency is less than or greater than the frequency of the carrier signal, wherein the output of the DUT is modified or filtered to pass one or more frequencies around the frequency of the second or Nth signals, and wherein the modified or filter output is measured for phase, frequency, and or amplitude variation or modulation, induced by the first signal or amplitude modulated carrier. Note the modifier or filter may pass distortion product(s) or signals from the output of the DUT for measurement of phase, frequency, and or amplitude variation modulation induced by the first signal. The modulated signal may be symmetrical or asymmetrical or arbitrary; the output of the DUT (or the modulated signal at the output of the DUT) may be not clipping, clipping on one or more polarity, not slewing, near slewing, and or slew rate limiting in one or more slope (e.g., positive or negative slope), for measurement of phase, frequency, and or amplitude measurements as mentioned above.

In another example, FIG. 20 illustrates measuring phase and or frequency modulation of a modulated signal. For instance, the modifier 26 now removes frequency components related to Gen2 while passing the modulated signal comprised of f(t). If the modulator 131' is an amplitude modulator (with carrier), then 131' would preferably include a limiter amplifier or function prior to coupling into 28' second input, or to the input of 27'. For phase detector 28', a first input is (now instead) coupled to Gen1' or 21' to allow measuring differential phase (phase modulation) on a modulated signal (or a carrier signal). Similarly 27' allows measuring frequency modulation effect(s) on a modulated waveform (or a carrier signal). For measurement on a scope, preferably, the trigger signal is coupled to Gen2, which is also the signal that causes the phase and or frequency modulation effect on the DUT.

In taking the frequency example above Gen2 may include frequency of 4000 Hz or lower, while f(t), the carrier signal may include a frequency of >=12 KHz. The modulating signal m(t) may include frequency of <4 KHz. The signals from 131' and Gen2 are coupled to (an input of) DUT 25 (e.g., via summing function or circuit 24) and the output of DUT 25 is coupled to a modifier to remove or attenuate (lower) the frequency related to Gen2 (e.g., remove frequencies at 4000 Hz or lower) while passing the higher frequency signal related to the carrier signal. Preferably, a limiting amplifier is included to remove attenuate amplitude variations prior to coupling to the input of 28' or 27'. Note that 27' generally includes one or more limiting amplifiers for FM detection. For the phase measurement, the phase detector's first input is coupled to 21' or f(t), the carrier signal, while the second input is coupled to the output of modifier 26. Of course, other frequencies may be used for 21', 23', and or 22 in FIG. 20.

Previously, it was mentioned that the modulator 131' may be a phase modulator or frequency modulator. For measurement of (additional) phase and or (additional) frequency modulation effects from a DUT, a preferred method or apparatus would include having a second Wow and Flutter meter or FM detector, and or a second phase detector, both not shown in FIG. 20. Referring to FIG. 20, the second FM detector or second phase detector (e.g., second input) would be coupled to the output 131' (where there is phase or frequency modulation from M'ator). And the first input of the second phase detector would be coupled to Gen1' or Gen2. Phase adjustment block 135 is optional for the second phase detector. In this example, 27' is considered as a first FM detector and 28' is considered as a first phase detector. For 131' having a phase modulated signal, the net differential phase modulation from DUT's output is measured by differentially measuring the outputs of the first and second phase detectors. That is one phase detector coupled to the modulator prior to the DUT and another phase detector coupled to the output of the DUT (via modifier 26) and subtracting the phase detector outputs (from each other to provide a net phase modulation measurement). Similarly, for net frequency modulation measurement, the second FM detector is coupled to 131's wherein the there is frequency modulation from M'ator 131', and the first FM detector 27' is coupled as seen in FIG. 20. The net frequency modulation effect is measured from the DUT via subtracting the output from the two FM detectors (e.g., to provide a net frequency modulation measurement).

Note that net phase and or frequency modulation measurement(s) may include from 131' amplitude modulation. That is, 131' may include phase and amplitude modulation at its output, or frequency and amplitude modulation at its output. Under the example, net phase or net frequency modulation effect(s) from the DUT would be caused by more than one type of modulation (of 131'). The modulation signal for amplitude modulating the FM (frequency modulation) or PM (phase, pulse width, or position modulation) signal may be a separate signal m2(t) from m(t), or m2(t) may be related to m(t).

As previously mentioned an embodiment includes measuring phase and or frequency modulation effect(s) of one or more distortion signals from the DUT. FIG. 21 illustrates an example of measuring the differential phase (or the frequency modulation) of signal or signals from the DUT's output, wherein the frequency or frequencies of the signal(s) include the frequency (frequencies) of the input signal(s) and or one or more distortion (harmonic and or intermodulation) signal from the DUT. Here, up to N tones or signals are coupled to the input of the DUT. The output of the DUT is modified (via modifier 26) to remove or attenuate one or more signals while passing through a selected signal. This selected signal may be of distortion signal based on the N tones. For example, a selected signal may be a harmonic (signal) of Gen1 or Gen2 . . . , or GenN. Another example, a selected signal may be an intermodulation distortion product or signal of Gen1, Gen2 . . . , and or GenN. To measure differential phase of distortion product(s) or signal(s) from DUT 25, one or more input signal generator(s) is coupled to a distortion producing circuit 136 to produce the desired signal for phase detector 28'. For example, if an mth harmonic of Gen2 is produced at the output of DUT 25, the modifier 26 (whose input is coupled to the output of DUT 25) passes through this mth harmonic signal of Gen2 while attenuating one or more other signals from the DUT's output. Distortion producing circuit 136 will take input signal Gen2 and produce the mth harmonic of it and couple this mth harmonic signal (via the generator or input signal) to a first input of phase detector 28' via optional (phase adjusting) block 135. Because input signals or generators are used, the output of 136 or 135 will contain no phase modulation effect and or no frequency modulation effect. The output of modifier 26 then passes the phase and or frequency modulated mth harmonic (e.g., of Gen2) to a second input of the phase detector 28'. The output 28' then provides a differential phase measurement of an mth harmonic of a tone or signal wherein another tone or signal (e.g., one or more input signal(s) or tone(s)) causes the differential phase (variation) or phase modulation.

Similarly when an intermodulation distortion signal is provided by DUT 25, the modifier 26 will selectively pass this intermodulation distortion signal (caused by mixing or nonlinearity based on two or more signals or frequencies by the DUT) to the second input of the phase detector 28'. Distortion generator (and filter) 136 will be coupled to the two more signals or tones to produce intermodulation and thus a tone representing substantially the same frequency as the signal out of the modifier 26 (but with no phase or frequency modulation effect for output of 136 or 135). Thus, the output of 28' then provides a measurement for differential phase or phase modulation (from one or more input signals) on one or more intermodulation distortion product or signal from the output of the DUT.

Wow and Flutter meter or FM detector 27' then can be used in measuring frequency modulation effect(s) of harmonic and or intermodulation product(s) or signal(s) from the DUT via modifier 26.

There is an example where a lower frequency signal causes frequency or phase modulation of one or more higher frequency signals (including one or more fundamental frequencies and or harmonic(s)), or intermodulation signals from any combination of input signals at the output of the DUT. For example, Gen1 may be a lower frequency signal of $\leq$=1 KHz while Gen2 may be a signal$\geq$=4 KHz. The phase modulation effect on the $\geq$=4 KHz signal is induced by the $\leq$=1 KHz signal. To illustrate, set Gen1 to 600 HZ and Gen2 to 4 KHz. The DUT will output a phase and frequency modulated 4 KHz signal and if the DUT exhibits harmonic distortion, then a multiple of 4 KHz signal(s) will also be phase and or frequency modulated. For each modulated harmonic selected via the modifying block 25 (to second input of phase detector 28'), distortion circuit 136 will produce an unmodulated harmonic (via derivation of the distortion product from the input source(s)) for the phase detector's first (e.g., reference) input of 28'.

Similarly, from the output of DUT 25 (or output of 135), intermodulation component(s) may appear. These can include signal(s) that comprise of frequencies of the sum and or difference of the frequencies of Gen1 and Gen2 (e.g., in the above example, frequency of Gen1=FL and frequency of Gen2=FH, so intermodulation component(s) can include FH+/−FL, and in general, p(FH)+/−q(FL), where p and q are elements of the integer number system). The DUT 25 will include a phase or frequency modulated version of the intermodulation signal(s), whereas the output of 136 will not include phase or frequency modulation of the intermodulation signal(s). As similarly described above, modifier 26 will pass the selected intermodulation distortion signal to a second input of the phase detector, and the first input of the phase detector will be coupled to 136 for measuring differential phase or phase modulation of one or more intermodulation component or signal from the DUT's output.

In another example of measuring intermodulation more than two signals or generators may be used. For example, two higher frequency signal along with a third lower frequency signal may be used in determining phase modulation effect from a DUT for intermodulation component(s) of the two higher frequency signals (induced phase modulation from the third lower frequency signal).

Similarly, a modulated higher frequency signal and a lower frequency signal may be used to measure phase modulation of a harmonic of a lower frequency signal. Or two or more lower frequency signals and a modulated higher frequency signal may be used to test for phase modulation on intermodulation components of the two or more lower frequency signals, or of any combination of the lower frequency signal(s) and higher frequency signal. Other combinations of input sources or frequencies are possible.

FIG. 21 then allows to test for phase modulation effect from the output of the DUT for (phase modulated) distortion product(s) signal (which is coupled to a second input of a phase detector 28'). This is done by generating or providing (unmodulated or stable phase) corresponding distortion product(s) signal to a reference or first input to a phase detector 28'. Optionally, FIG. 21 allows for testing of frequency modulation from the output of the DUT for frequency modulated distortion signals via 27'.

FIG. 22 is similar as FIG. 21 with generator 138 providing the two or more signals and or modulated signals (via Out1) coupled to the input of DUT 25. Generator 138 also provides a selected fundamental, harmonic, and or intermodulation frequency signal (via Out2) that is coupled to the reference or first input of a phase detector 28'. Phase adjustment block 135 is optional to tune the overall phase so that phase detector 28' is working within a linear region (or is centered) of the phase angle versus voltage transfer function. Generator 138 may be a multiple output signal device that uses frequency synthesis to provide signals to the DUT's input but also synthesizing the corresponding signal(s) to match in frequency for the phase detector (28' reference input) so that phase modulation of the fundamental frequency and or distortion products (from DUT 25 via the modifier 26) can be measured accurately. Thus, a frequency synthesizer may be used in place of blocks 21, 22, 23, 24, and 136 of FIG. 21. Generator 138' may include a phase control, so block 135 may be bypassed.

FIG. 22 also allows testing for frequency modulation effects of the DUT via a frequency synthesizer 138. The frequency modulation effect includes frequency modulation of distortion product(s) from the DUT. The output of the modifier 26 is coupled to 27' for a frequency modulation or Wow and Flutter measurement.

For FIGS. 19, 20, 21, and or 22 the phase adjustment block 135 is optional, as previously mentioned. In another embodiment of the invention a phase shifting circuit or phase adjustment block may be incorporated in the modifier (e.g., 26) or placed/coupled prior or after the modifier.

Figure 23:
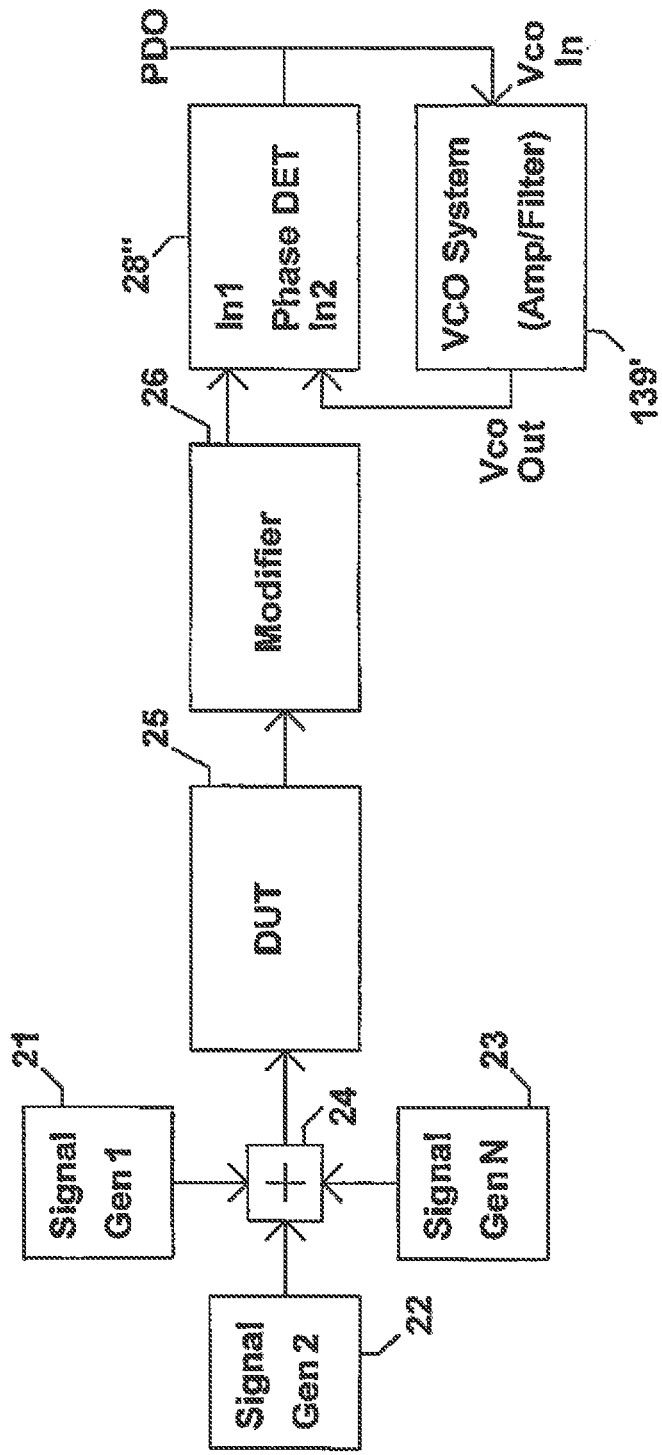
FIG. 23 shows an example of an improvement to measure differential phase.

FIG. 23 shows a way to measure differential phase via a phase lock loop circuit. This phase lock loop circuit is provided by phase detector 28", whose output is coupled to the input of VCO system 139'. The output of 139' is a continuous wave signal, which is fed back to In2 of phase detector 28". The output of modifier 26 as previously explained, which includes phase modulation from the DUT is coupled to In1 of 28". A previous attempt in using this method had a problem that showed rather incorrect results or too low of phase modulation from the DUT. The reason for this problem is that the VCO system 139' (in the previous attempt) had too much frequency deviation range, which tended to track the incoming phase modulation. It should be noted that In2 of phase detector 28" should have a stable phase signal (e.g., not a signal that follows the phase modulation of the DUT).

To improve the accuracy of measuring differential phase from DUT 25, a narrow range VCO (voltage controlled oscillator) system is used in 139'. Such a narrow range VCO may include a crystal oscillator, ceramic resonator oscillator, or high Q inductor capacitor oscillator with narrow range. (Preferably the narrow range should be in the area of <0.5% of the oscillation frequency.) This implies that the input generators' frequency that is passed through the modifier 26 must be very stable (e.g., crystal controlled) as well and should exhibit low phase noise. Also, preferably, the VCO control voltage while the PLL circuit of 28" and 139' is locked should be low in AC voltage as to not track (or track minimally) the DUT's output signal phase modulation. The output of the phase detector PDO is then coupled to a suitable filter (e.g., usually of wider bandwidth than the filter used in the VCO System, 139', to provide a signal via PDO substantially indicative of the induced phase modulation) to attenuate frequencies related to the input of the phase detector (In1 and or In2). Because in the specific case of audio testing, a low frequency VCO may include a higher frequency narrow range (e.g., low phase noise) voltage controlled oscillator followed by a suitable frequency counter or divider (e.g., a frequency divider output is coupled to the input In2 of 28").

Two or more serially coupled phase lock loop circuits may be used to provide improved average phase, which would be used in measuring the phase modulation effect on a DUT. For example, a phase lock loop comprises of an input (usually coupled to a phase detector' input) and an output (usually the output of an oscillator or an output of a counter whose input is coupled to the oscillator's output).

One embodiment of the invention would include coupling two of more phase lock loop circuits in series or cascade. The input of the first phase lock loop circuit would be coupled (via modifier 26) to the DUT. The output of the final phase lock loop would be coupled to a first or reference input of a (separate) phase detector while the second or other input of the (separate) phase detector is coupled to the output of the DUT (e.g., via a modifier 26). The output of the (separate) phase detector is then coupled via a filter to a meter or oscilloscope for measurement of phase modulation effect on the DUT.

In an alternate example, the phase lock loop system with PDO may be substituted for 28' in FIGS. 19, 20, 21, and or 22 (where block 135 or 136 is not needed).

It should be noted (however) that the method or apparatus as shown in FIGS. 19, 20, 21, and or 22 has (substantially) the highest accuracy because a derived input signal is coupled to the first or reference input of the phase detector. (Preferably FIGS. 19, 20, 21, and or 22 include a DUT that does not change the frequency of the input signal such as amplifiers, speakers, microphones).

Phase adjustment block 135 in any of these figures may include an all pass phase shifter, a filter (e.g., low pass, high pass, and or band pass), and or a regeneration oscillator.

Phase adjustment block 135 can be used as a calibrating tool for the phase measurement. For example block 135 can switch in (a phase lead or phase lag of) a phase shift angle of "x" degrees, in which the phase detector will show a corresponding voltage or signal. For instance, a change in "x" degrees via block 135 will yield "y" volts change in output of the phase detector (e.g., 28').

It should be noted that (Ref In of) an input of phase detector 28' in FIG. 19, 20, 22, and or 22 may be coupled to the input generator(s) such as Gen1, Gen2, and or GenN (or other signal sources) via summing or combining circuit 24 or via the input of the DUT 25. A phase adjustment block 135 and or filter may be included in (between) the coupling of the output of summing circuit 24 to an input to phase detector 28'.

FIGS. 19, 20, 21, and or 22 are examples of the previously mentioned passage (paragraph [0017] of US 2007/0069737 A1) of the invention pertaining to measuring (small) variation(s) in the phase (or frequency) response of a DUT with a dynamic biasing signal (e.g., lower frequency signal) to provide the variation(s) of phase (e.g., of a higher frequency signal). And the phase response is sometimes defined as the measured phase angle of the output minus the phase angle of the input of the DUT. Thus, measuring a variation of the phase response refers to phase variations of the output of the DUT as compared to phase of the input of the DUT (by definition the phase angle to the input is usually considered as zero degrees).

FIG. 23 with a narrow range (band) VCO has an additional advantage of measuring phase modulation because the DUT, which may (or may not) have a slight change in frequency at the DUT output. A DUT such as (digital) recorder at playback or a digital processor may output a slight change in frequency at its output (versus the input frequency).

In an embodiment (of the invention), while the selection of a waveform may be sinusoidal for the signal that causes the phase or frequency modulation effect on a DUT, a non sinusoidal waveform can be used (e.g., for FIGS. 3, 19, 20, 21, 22, and or 23). A waveform including one or more ramp(s) can be used, for instance. For example a linear function signal such as a simple sawtooth waveform (or triangle wave) may be used for the lower frequency signal (or the modulating signal, e.g., m(t)) that induces phase or frequency modulation effect on a DUT. Linear function signals (e.g., y=mx+b) can be used to map out a phase versus voltage transfer function. This transfer function can be decomposed in polynomial form (or power series analysis) to determine (or predict) the linear term and distortion products of phase modulation for a sinusoidal waveform when substituted in place of the linear function signal. By taking the derivative of the power series (or polynomial), the frequency modulation effect can be decomposed into a linear term plus distortion products for a sinusoidal signal instead of the linear function signal.

Note that frequency deviation (modulation) is proportional to the phase (angle) shift modulation times the frequency of the signal causing the phase modulation. So determining the range of phase shift over the voltage range at the output of the DUT may be sufficient in predicting the frequency modulation effect of the DUT.

For example, in the previous embodiments involving a low frequency signal inducing frequency modulation on a higher frequency signal (as measured from the output of the DUT), increasing the frequency of the low frequency signal results in a proportional increase in induced frequency modulation e.g., frequency deviation of the higher frequency signal.

In one example of FIG. 19, the lower frequency generator signal is a sawtooth waveform, and the higher frequency generator signal is a sinusoid. Other combinations are possible.

For example "complex" sawtooth waveform may include of two or more positive (or negative) slope segments (and or curve) to form a piecewise signal. A first or second or "N" slope segment may be used to reveal crossover distortion effect near the zero crossing of the DUT. In this example, a ramp may have a greater (steeper) slope at outside a crossover distortion region, and a smaller (shallower) slope ramp may pass though the crossover distortion region. And a suitable higher frequency signal is added to this "complex" sawtooth waveform to measure the phase and frequency modulation effect. In this example the "complex" ramp allows closer scrutiny of phase or frequency modulation effects of a DUT into the crossover distortion region.

Another embodiment (of the invention) includes measuring multiple signals at the output of the DUT for phase and or frequency modulation. For example, using a second (or N) modifier coupled to the DUT and another set of phase and or frequency detectors, one can measure how a high frequency signal (e.g., modulated carrier) induces phase and or frequency modulation on a lower frequency signal and how a lower frequency signal induces phase and or frequency modulation on a higher frequency signal (e.g., modulated or unmodulated carrier). A simultaneous measurement of both effects may reveal an interaction of transient and or steady state phase and or frequency modulation of how the signals affect each other. For example, a modulated higher frequency signal may induce (phase or frequency) modulation on the lower frequency signal, while the lower frequency signal is inducing (phase or frequency) modulation of the higher frequency signal. The effect of the modulated higher frequency signal may cause an increased effect of phase modulation on itself. That is when two or more signals are phase or frequency modulating each other, there may be a "reflecting" or interactive effect on each signal. This embodiment may include modulating both or either (e.g., lower frequency and or higher frequency) signal(s) and measuring the phase and or frequency modulation from two or more phase and or frequency detectors (via filters and or limiting amplifier or equivalent, and or spectrum analysis or a spectrum analysis system, see below).

For example for an amplitude modulated signal comprised of, (two or more) signals in the general form of S1(t)=[1+m1(t)]sin[(2piF1)t], and S2(t)=[1+m2(*t*)]sin [(2piF2)t]. S1(t)+S2(t) are coupled to a DUT, the output of the DUT is measured for phase modulation of signals around F1 and or F2. And for example, F2>F1 in frequency and m2(t) may be a lower frequency (sinusoid) waveform of frequency lower than F2 or F1. The modulating signal m1(t) may be a step function including u(t−td) or u(t−td)×g(t), where td is a delay time and g(t) is a waveform function. Alternatively m1(t) may be a pulse waveform or filtered (e.g., low pass filtered) pulse waveform, wherein the pulse waveform may include a rectangular pulse or squarewave. Because m2(t) will induce phase and frequency modulation effect on a signal around frequency F1 at the output of the DUT, by enabling m1(t) to increase the amplitude of a signal around frequency F1, the phase or frequency of the signal around F2 will shift. Because the carrier frequency F2 has shifted in phase or frequency due to the (abrupt) increase in amplitude of sin[(2piF1)t], it may be possible to measure a (slight) change in phase or frequency on a signal of frequency (around) F1 at the output of the DUT. This example shows that an increase in (amplitude) modulation at frequency F1 can result in a subsequent shift or variation in phase or frequency for F1. Other type or combination of modulation is possible for m1(t) and or m2(t), which include any combination of: Frequency Modulation, Amplitude Modulation, Position Modulation, Pulse-Width Modulation, Phase Modulation, and or no or negligible modulation (e.g., continuous wave). The DUT is not limited to two signals, and at least two modulated/unmodulated signals may be coupled to an input to the DUT for measurement of phase and or frequency modulation effect at the output of the DUT. For example, m1(t) may include phase or frequency modulation, while m2(t) may be a fixed constant. Then when S1(t) and S2(t) are coupled to an input of a DUT, the output of the DUT will show frequency modulation effect of a signal around F2 that is being phase or frequency modulated one step further.

As mentioned before, the DUT may be an analog and or digital device. It should be noted at low levels some digital devices show a marked increase in distortion, so measuring for phase and or frequency modulation effects fundamental frequency and or distortion products is relevant.

It should be noted that computational analysis of the sidebands may be substituted to a phase or frequency detector for an alternative to measuring any of the frequency or phase modulated signals from the DUT (e.g., that is induced/caused by a lower or higher frequency signal). Sideband analysis was previously mentioned in US 2007/0069739 A1, published on Mar. 29, 2007 in paragraph [0050]. One embodiment of the invention includes Fourier Analysis (e.g., Fourier or spectrum analysis includes FFT, DFT, DTFT, DCT, Fourier Transform, Fourier Series, Discrete Fourier Series, using a spectrum or waveform analyzer, filter, tuned or tunable/variable frequency filter, and or the like) to analyze one or more sideband signals around a signal whose spectrum is around FH and or FL (or distortion product(s)) out of the DUT. By calculating the energy or power of the sidebands, a calculated frequency deviation is provided.

For example, U.S. Pat. No. 5,818,240 by Cabot (incorporated by reference) shows in column 9 line 30 that Wow and Flutter or frequency deviation may be calculated as the addition of upper and lower sideband signals squared summed over N number of sideband pairs and then taking the square root of the squared sums (Wow and Flutter or frequency deviation=square root [(LSB1+USB1)^2+ . . . (LSBn+USBn)^2], where LSB is the Lower Sideband, USB is the Upper Sideband, n=number of sideband pairs, and ^2 represents raised to the second power.)

Another embodiment of the invention includes using sideband analysis (e.g., using a spectrum analysis system) to determine phase or frequency modulation effects from one or more signals from the DUT, to preferably use/couple a filter or band pass filter from the DUT's output, and couple the output of the filter or band pass filter to a limiting amplifier's input, and then perform Fourier/spectrum analysis or couple to a spectrum or waveform analyzer. The limiting amplifier (or limiter, comparator circuit, or zero crossing circuit) removes amplitude modulation sidebands to reveal any frequency or phase modulation sidebands. The output of the limiting amplifier then is coupled to a spectrum analyzer or to Fourier or spectrum analysis (system) for sideband analysis. Generally, the greater the amplitude and or number of sidebands from the limiting amplifier's output reveal in some proportion, a greater amount of phase and or frequency deviation (e.g., frequency deviation=square root [(LSB1+USB1) ^2+ ... (LSBn+USBn) ^2], where LSB is the Lower Sideband, USB is the Upper Sideband, n=number of sideband pairs, and ^2 represents raised to the second power). The filter may pass through with sufficient bandwidth (for sidebands) around FL and or FH, any distortion products from the output of the DUT. The limiting amplifier, zero crossing circuit, modifier/filter, and or Fourier or Spectrum analysis, may be implemented with analog and or digital circuits, computer, and or Digital Signal Processing (DSP).

An example filter or bandpass filter is denoted by Modifier 26 or 26A (in FIG. 3,11,14,16,19,20,21,22, or 23), or any of 31-36 or 41 (of FIGS. 4A-4F, or FIG. 5) which would be coupled to a limiting amplifier (or equivalent) such as 121, 126, or 126A in FIG. 17.

The filter or bandpass filter may be implemented by a digital and or analog filter. The limiting amplifier may be implemented by a Sgn(x) function, which for example has Sgn(x)=1 for x>0 and Sgn(x)=−1 for x<0. The limiting amplifier or comparator or Sgn(x) function serves as a zero crossing detector of the signal that is to be measured for phase or frequency modulation effect. Thus, an embodiment of the invention includes: Coupling two or more signals into a DUT's input, wherein the output of the DUT is modified by a filter or bandpass filter, and wherein the output of the filter or bandpass filter is coupled to an AM component removing circuit or function/circuit comprising a limiting amplifier, zero crossing detector, Sgn(x) function, or the like, and whereby the output of the AM component removing circuit or function is analyzed for sidebands to determine phase or frequency modulation of one or more signals from the DUT.

Analysis of sidebands and or carrier, spectrum analysis, or a spectrum analysis system may include any of the following: FFT (Fast Fourier Transform), FT (Fourier Transform), DFT (Discrete Fourier Transform) DTFT (Discrete Time Fourier Transform), Short Time Fourier Transform, Fourier Series, Discrete Fourier Series, Cosine Transform, Discrete Cosine Transform, filter, tuned filter, tunable/variable frequency filter, and or a spectrum or wave analyzer.

Filtering or modifying method or apparatus may include analog and or digital filter(s) or modifying function(s).

One or more software programs (and or storage of data) may be included in the invention. For example, software defined filter(s) or modifying function(s) may be included as part of an embodiment of any of the inventions mentioned.

As mentioned previously, an embodiment of the invention may include measuring frequency response at different offsets of a device. For example, add an offset voltage for each frequency response measurement. For instance, such as adding one or more DC voltages (Note: normally devices are measured for frequency with a zero offset voltage) with a swept frequency signal (e.g., two or more discrete tone bursts and or continuous sweeping in frequency) to measure a dynamic frequency response.

In some devices, adding a DC offset signal is not possible because of DC blocking in the device (e.g., capacitor or transformer in a signal path of an amplifier or device). Thus, one embodiment of measuring dynamic frequency response of a system or DUT is to add a lower frequency signal with a set of high frequency signals and measure the high frequency signal's amplitude (and or phase response) as a function of the lower frequency signal voltage or current. The lower frequency signal may include a stair step, ramp, sinusoidal, sawtooth, or arbitrary waveform. The set of higher frequency signals may include one or more tone bursts (e.g., multiburst), or a swept or varied frequency waveform/signal. In one embodiment of the invention, a ramp, sinusoidal, or stair step waveform is provided as the lower frequency signal, and a continuous wave signal such as a higher frequency sine wave signal that is varied over time is provided as the higher frequency signal. The lower frequency signal and the higher frequency signal are coupled to an input of the DUT, and the output of the DUT is measured for amplitude and or phase of the higher frequency signal (typically for two or more higher frequencies). Generally, the lower frequency signal nearly spans the range of the DUT's output range, or can be narrower in range (e.g., to examine dynamic frequency near the cross over distortion region of an amplifier, or quantizing distortion (range) of a digital system).

For example, a 100 Hz signal (e.g., sinewave) is summed with a signal source whose frequency can be in the range of 1 KHz to 20 KHz. Typically the lower frequency signal is set to an amplitude to span most of the voltage range of an amplifier and the higher frequency signals are lower in amplitude of the lower frequency signal. The DUT is measured at the output of the higher frequency signal (via a spectrum analyzer or voltmeter/oscilloscope/display with a modifier or filter to remove the lower frequency signal) at two or more high frequency signals. For example, a 100 Hz signal plus a 10 KHz signal is supplied to the input of the DUT with a first measurement for amplitude at 10 KHz as a function of the 100 Hz signal at the output of the DUT, and a 100 Hz signal plus a 20 KHz signal supplied to the input of the DUT with a first measurement for amplitude at 20 KHz as a function of the 100 Hz signal at the output of the DUT. The higher frequency signal may be swept, and or the lower frequency signal's amplitude is generally larger or much larger than the higher frequency signal or swept signal.

Measurement of the dynamic frequency response for a device, for example, is useful in measuring stability, phase, and or gain margin of a feedback system in a dynamic manner. For example, there are amplifiers that show very good stability and phase margin with a signal applied without offset. However, instability or peaking in (a small signal) frequency response may occur when the amplifier is near or below its maximum output range (e.g., frequency response of an AC signal when an amplifier is at an offset or temporary offset close to the maximum output range.) A lower frequency signal whose amplitude is larger or much larger than the higher frequency signal used for (dynamic) frequency response measurement, may be considered as a dynamic biasing signal.

An alternative method or apparatus to measure dynamic frequency response is to generate a lower frequency signal such as a stair step signal (or ramp signal, such as a nonlinear or linear ramp). For example, two or more (stair) steps or levels of the lower frequency signal include a combination of the following: two or more test tones (e.g., one or more tones may include a sine, pulse, squarewave, arbitrary waveform of one or more frequency, where in the two or more test tones are in sequence and or in partial or whole adding together), one or more pulse waveform (e.g., pulse waveform may include rectangular, Gaussian, sine squared, triangular), squarewave, or higher frequency signal (or may include a swept frequency signal). The lower frequency signal with signals in two or more levels or steps is coupled to an input of a DUT. The output of the DUT is measured for frequency or pulse response (e.g. pulse response may include amplitude change, ringing, overshoot, undershoot, tilt, roll off on one or more corners of the pulse), and or amplitude (and or phase) of the higher frequency signal included for two or more steps or levels. In some cases a stair step signal may be replaced with an arbitrary signal (e.g., a ramp waveform, sinewave, triangle wave, etc.), and or the higher frequency signal may include a frequency modulated or swept frequency signal.

In one embodiment (of the invention), the output of the DUT is coupled to a filter or modifier to remove or reduce the amplitude of the lower frequency signal, while passing substantially the swept or higher frequency signal (e.g., for frequency response measurement).

In another embodiment (of the invention), the higher frequency signal may include a modulated signal at two or more steps or levels of the lower frequency signal. A modulated signal may include an amplitude modulated signal provided in two or more steps or levels of a lower frequency signal, which is then coupled to an input of a DUT. An output of the DUT is measured (or examined) for envelope distortion or for extra sideband (e.g., using a Short Time Fourier Transform or spectrum analysis), envelope asymmetry, and or phase or frequency modulation of the carrier of the amplitude modulated signal on one or more levels or steps of the lower frequency signal.

For example, a lower frequency signal may include a ramp signal, a sinewave, triangle wave, or stair stepped signal. A higher frequency signal is applied to all or part of the low frequency signal to form a test signal to an input of the DUT. Generally, the lower frequency has a greater amplitude than the higher frequency signal. The output of the DUT is then coupled to a display (e.g., oscilloscope) or amplitude detector to show or measure the amplitude of one or more cycles of the higher frequency signal as function of the output range of the DUT. Generally, the frequency of the higher frequency signal is changed or varied. For example, the lower frequency signal is a triangle wave generator or source, and the higher frequency signal is a sine wave to form the test signal into the DUT. The output of the DUT may show greater amplitude of the higher frequency in one part of the triangle waveform than another location of the triangle waveform (e.g., the negative peak of the triangle waveform shows a boost in high frequency response versus in the positive peak portion of the triangle waveform). Increasing, decreasing, or varying the frequency of the higher frequency signal may then show more clearly differences in frequency response at different portion of the lower frequency waveform (e.g., triangle waveform), which for example, shows a frequency response in a localized portion of an output span of the output of the device.

Another embodiment (of the invention) is to provide an amplitude modulated waveform that is coupled to an input of the DUT and wherein the output of the DUT is measured for envelope distortion (e.g., including a partial rectification effect) phase and or frequency modulation on the carrier of the amplitude modulated signal. Phase and or frequency detectors, or spectrum analysis (system) previously mentioned may be used for the measurement of phase and or frequency variation or modulation of the carrier of the amplitude modulated (carrier) signal at the output of the DUT. For example, (the envelope distortion of) the amplitude modulated (carrier) signal at the output of the DUT is coupled to a (filter and) limiter or AM removal circuit or equivalent (e.g., Sgn(x) function, zero crossing detector, comparator, limiting amplifier), and the output of the limiter is then coupled to a phase and or frequency measurement system such as a phase or frequency detector or sideband analyzer (or spectrum analysis system) to measure phase or frequency variation on the carrier of a modulated signal. An amplifier that exhibits slewing or other distortions could be included at a DUT. Typically the amplitude modulation is less than 100% or equivalently the carrier is modulated such that the carrier is not pinched off (e.g., the amplitude modulated signal includes a (carrier with) residual carrier).

Alternatively, a second signal, different in frequency of the carrier, may be added to the amplitude modulated signal for a test signal. This test signal is then coupled to an input of a DUT, and the output of the DUT is coupled to a modifier or filter to remove/attenuate the second signal. The output of the modifier or filter then is coupled to limiter or equivalent amplitude modulation removing function, and the output of the limiter or amplitude modulation removing function measured for phase and or frequency variation of a modulated signal from the output of the DUT.

Yet another embodiment (of the invention) is to couple an amplitude modulated signal into an input of a device (e.g., audio device), and couple an output of the device to a spectrum analysis system to measure extra sidebands (e.g., beyond the first set of sidebands near the carrier of the amplitude modulated signal) to provide measuring distortion of the amplitude modulated signal from the output of the (audio) device.

In terms of measuring phase and frequency modulation effect(s) from the output of a device, the use of modulated sources can be implemented in at least three methods.

As previously stated a modulated higher frequency signal combined with a lower frequency signal coupled to the input of a device, causes the device to output an induced phase and or frequency modulation effect on the lower frequency signal.

In another (embodiment of the invention), a modulated lower frequency signal (AM, PM, and or FM) combined with a higher frequency signal is coupled to an input of the DUT. The output of the DUT is then measured for phase and or frequency modulated effect(s) on the higher frequency signal.

Yet another embodiment (of the invention) involves providing two (or more) modulated signals of different frequencies, which are coupled to an input of the device, and wherein the output of the device is measured for a phase and or frequency variation (or modulation), induced by one or the other (or both) modulated signal. For example, both modulated signals may start with amplitude modulation into the input of the device, the output of the device is then measured for phase and or frequency modulation of each carrier of the amplitude modulated signals from the output of the device. Later, at least one of the carrier signal(s) may be varied in phase or frequency for measurement of phase and or frequency variation on the other carrier signal.

Measurement of phase or frequency variation for a signal at the output of the device may include a modifier and phase or frequency detector, or Wow and Flutter meter, or by spectrum (sideband) analysis (system).

In the previously mentioned amplitude modulated signals, the carrier and or modulating source may be static or changing in frequency.

An embodiment (of the invention) includes the use of computation (such as computing a Fourier Transform). A STFT or DFT (Short Time Fourier Transform or Discrete Fourier Transform) or spectrum analysis may be used or computed for analyzing (transient) distortion at a localized portion of the DUT's transfer function. For example, a DUT may exhibit crossover or quantizing distortion. With one or more sinusoidal waveform (which may be modulated) added to a dynamic biasing signal (e.g., a lower frequency signal than any of the sinusoidal waveforms, wherein the dynamic biasing signal spans at least a portion of the output range of the DUT) and coupled to an input of a DUT, harmonic distortion, intermodulation distortion, modulation/envelope distortion, dynamic phase or frequency variation (or modulation), or other forms of distortions can be measured, computed, or displayed for a localized region of the output range of the (output of the) DUT. In the crossover distortion example, distortion measured near or within the crossover distortion region (e.g., around zero in some amplifiers) will be higher than distortion outside the crossover region.

In terms of testing for phase and or frequency modulation effect on a DUT, a testing method or apparatus utilizes multiple frequencies applied to a device under test for measuring newly discovered frequency modulation effects. An embodiment may include a lower frequency signal with a smaller amplitude higher frequency signal to test a dynamic change in frequency response, gain, frequency, and or phase. This dynamic test can reveal frequency modulation effects. Another embodiment may include the use of a multiple frequency signal to dynamically induce a time varying phase or frequency distortion for the device that has differential phase distortion. The device's output is then measured for FM or PM effects. For example, measuring is done with an FM or phase detector or computational analysis to measure shift in one of the frequencies used in the test signal or to measure frequency modulation effects of any signals, including distortion products, from the device (or system). Yet another embodiment of the invention may include biasing a device with a voltage to span the output voltage range of the device while measuring harmonic or intermodulation distortion or phase or frequency response at the various operating points.

Also as stated previously (or stated afterwards), any modulated signal may include finite, negligible, and or zero modulation.

In testing for harmonic or intermodulation distortion of a multiple channel system such as two or more channels, often testing is done with a single channel or two or more channels driven simultaneously with a signal of the same frequency. However, because often the multiple channel system shares a common power supply, other types of distortions are hidden when the same frequency signals are applied to both or multiple channels. Therefore yet another embodiment of the invention is to provide a first channel of first signal (e.g., of a first frequency) and a second channel of second signal (e.g., of a second frequency), wherein the first and second signals are substantially not the same. For example, a first signal may be modulated whereas the second signal is modulated, or a first signal has frequency of Fx, and the second signal has a frequency of Fy, where Fx is not equal to Fy. In another example, a first signal may include a signal including one or more frequencies, and a second signal may include a signal include one or more frequencies, wherein at least one frequency is different, dissimilar, or not equal in the first and second signals.

An (example) embodiment would include coupling dissimilar signals to the inputs at two or more channels of the system (e.g., amplifier, processor, etc.) and measuring for distortion (harmonic, intermodulation, phase modulation, and or frequency modulation) effect(s) caused by the signal of the other channel. For example, a low frequency (Flow) signal may be applied to the input of Channel A for an output voltage or power level on Channel A of a multiple channel (e.g., stereo) amplifier. And, a differential phase or frequency modulation test signal (e.g., signals of FL and FH, see any of the FIGS. 7A-9B) may be coupled to the other channel such as Channel B. The output of Channel B will exhibit phase and or frequency modulation effect as a function of frequency FL (or a modulated (e.g., amplitude modulation) signal frequency for "carrier" frequency FH) that is (further) varied or modulated by the Channel A signal related to frequency Flow. In a related example or embodiment, power supply ripple, and or power supply voltage variation caused by any combination of ripple and or loading effect on the power supply by one or more channels of a system, can induce one or more (extra) phase or frequency modulation effects on the channel that is coupled to the differential phase or frequency modulation test signal.

Similarly, intermodulation and or harmonic distortion measured on one channel may have modulated intermodulation and or harmonic distortion product(s) that is induced by another channel or by power supply ripple. For example, power supply rejection on a system in feedback systems generally is proportional to the amount of feedback and open loop gain. The higher the open loop gain with feedback the greater the power supply rejection that occurs, and less voltage variation from the power supply is coupled to the output of the feedback system. However, some systems include circuits or functions that include crossover distortion, which causes a significant drop in open loop gain for the feedback system. So at or near the crossover distortion region, the power supply rejection is much poorer when compared to power supply rejection outside the crossover distortion region(s). Thus, distortion components near or at the crossover region are generally high in amplitude, which can be further varied in phase and or amplitude induced by power supply voltage variation. Again, power supply voltage variation is caused by any of the channels having a loading effect on the power supply and or power supply ripple. A varying voltage in the power supply for the system or amplifier generally induces at least a small amount in gain variation in one or more stages of the system or amplifier. This gain variation induces a change in distortion (amplitude and or phase) at the system's output and a change in phase or amplitude for one or more signals at the output of the (feedback) system.

Thus, an embodiment (of the invention) includes a method for testing for distortion in a multiple channel system or amplifier. This includes coupling a first signal to a first channel of the system or amplifier, and coupling a second signal to a second channel of the system or amplifier. Wherein the first signal is different from the second signal, and wherein harmonic, intermodulation, (differential) phase modulation, frequency modulation, and or differential gain effect or distortion is measured from the first channel includes an induced effect (e.g., modulation) of one or more signals or frequencies from the second channel is included.

The system may include crossover distortion or a crossover distortion region. A signal from the output of the system that is located near or in a portion of the crossover distortion region may be affected in the following manner. A variation in the power supply, or a voltage variation of the power supply induced by one or more channels operating induces/provides a variation of harmonic distortion, intermodulation distortion, phase modulation, frequency modulation, and or differential gain distortion in or near the crossover distortion region.

Differential gain (as an embodiment of the invention) may be measured by providing a low frequency signal and higher frequency signal coupled to an input of a system (e.g., audio system). Wherein the higher frequency signal is measured in amplitude over a span of output range of the system (e.g., the low frequency signal is modified or removed or attenuated at the output of the system) or measured as a function over time. For example, a higher frequency signal may be above the known higher frequencies, 6000 Hz or 7000 Hz, used in SMPTE IM test (two sinusoidal waveforms, a low frequency signal at 60 Hz or 70 Hz, and a higher frequency signal at 6000 Hz or 7000 Hz), or standard intermodulation distortion test signals. In particular, a higher frequency signal set >7000 Hz (e.g., 10 KHz to 20 KHz) with a lower frequency signal (for audio systems) is suitable for revealing more types of distortions in a system.

As an example, a lower frequency signal may include a signal above 400 Hz or a signal whose frequency is less than 7000 Hz. Typically, the lower frequency signal includes a linear portion such as a waveform of a ramp, triangle wave, stair step, stepped, and or sawtooth waveform. The lower frequency waveform (e.g., of any frequency) may include a sinusoid waveform, non-sinusoid waveform, ramp waveform, stepped waveform, and or an arbitrary waveform.

In terms of an improvement in the current SMPTE IM testing methods, an embodiment of the invention may include providing >7000 Hz as the higher frequency signal plus a lower frequency signal to measure intermodulation distortion. For example, a higher frequency signal in a range of 10 KHz to 20 KHz provides improved measurement for intermodulation distortion for a system and or amplifier. The lower frequency signal may be a signal whose frequency is equal or less than 7000 Hz. In the SMPTE IM test, the lower frequency signal has been 60 Hz or 70 Hz. And in another SMPTE IM test, the lower frequency is 400 Hz (with 4000 Hz for the higher frequency signal). An embodiment of the invention can include a lower frequency of greater than 60 Hz, 70 Hz, or 400 Hz. For example, the inventor had observed that phase modulation in some systems actually increase (or in another system, the phase modulation decreases) with raising the lower frequency signal, which implies intermodulation distortion around the higher frequency signal would increase (or decrease) if the lower frequency signal is raised in frequency.

Alternatively, as an embodiment (of the invention), differential gain may be measured by: providing a low to mid frequency signal and a modulated (e.g., amplitude, phase, and or frequency modulation) signal. The modulated signal typically has a carrier frequency that is higher than the low to mid frequency signal to an input of a system (e.g., an audio or RF system). And wherein the modulation frequency is typically lower than the frequency of the low to mid frequency signal. The amplitude of the low to mid frequency signal is measured (e.g., over time) via an output of the system.

Yet another embodiment of the invention is to measures one or more distortion effect using a modulated carrier waveform (e.g., differential phase and or frequency modulation distortion. The modulated waveform is coupled to an input of a system (e.g., audio system, amplifier, and or processor). The output of the system is measured for distortion products (e.g., harmonic and or intermodulation), extra sideband distortion product(s), (extra) phase modulation of the carrier, and or (extra) frequency modulation of the carrier. For example, an amplitude modulated signal is coupled to an input of a system. The output of the system is analyzed/measured for one or more extra sidebands related to the carrier of the amplitude modulated signal. The output of the system (DUT) may be analyzed/measured for distortion products including intermodulation, harmonic, differential phase, frequency modulation, and or signal(s) whose frequency is related to the modulation frequency or harmonic(s) of the modulation frequency. The output of the system may be analyzed/measured for phase and or frequency modulation of one or more of the following: The carrier of the modulated signal, any distortion products at the output of the system, signal(s) related to the modulation frequency or harmonic(s) of the modulation frequency. Phase and or frequency modulation measurement technique(s) may include any of the previously mentioned methods such as using in any combination: a phase detector, amplitude modulation removal/reducing circuit, limiter, filter, modifier, synchronous detection, frequency detector/discriminator, phase lock loop circuit, Sgn(x) or Sgn(t) function, and or spectrum analysis.

For example, an amplitude modulated signal or an AM signal (e.g., wherein the modulation percentage is <100%, leaving a residual carrier, or wherein the modulation percentage equal or greater than 100%) is coupled to an input of an audio system or amplifier. The output of the audio system or amplifier is coupled to a phase detector and or frequency to voltage converter (or frequency detector) to measure a phase and or a frequency modulation effect of the carrier. The output of the phase or frequency detector provides a signal indicative of a phase or frequency modulation effect (e.g., of the carrier) from the output of the audio system or amplifier. It should be noted that spectrum analysis may be used to measure phase and or frequency modulation. It was observed experimentally that a phase and or a frequency modulation effect (e.g., of the carrier of the AM signal) does indeed exist in an audio amplifier when an AM signal is used as a test signal (AKA Quan effect #4). This AM test signal allows measuring (unwanted) phase and or frequency variation of the AM (test) signal. Real world signals such as musical notes or phrases are raised in level or lowered in level (e.g. amplitude modulated) wherein when music is amplified (via a DUT), phase and or frequency modulation can occur in the musical notes or phrases.

A second signal may be combined with the AM signal, which is then coupled to a system or amplifier. At the output of the system or amplifier, one or more distortion product such as harmonic, intermodulation, and or cross modulation is measured. Generally, cross modulation distortion is tested in RF systems, but is reapplied to audio systems because of the changing in loudness of one part of music while another part of the music is not changing in loudness (e.g., in the same manner). The second signal may be a static amplitude signal, which at the output of the system or amplifier, cross modulation is measured. Cross modulation distortion in a (static or constant amplitude) signal is related to the amount of amplitude modulation induced by an AM signal to a static amplitude signal. The output of the system may be measured for phase and or frequency modulation on the AM signal, the second signal (e.g., an originally static amplitude signal), and or any distortion signal (e.g., one or more frequency translated version of the AM signal, harmonic and or intermodulation distortion signal related to the AM signal and the second signal).

Another embodiment (of the invention) may include two or more modulated signals coupled to an input of a system or amplifier. The output of the system or amplifier may be measured for harmonic distortion, intermodulation distortion, cross modulation distortion (e.g., onto each other modulated signal), phase variation on any signal (via the output of the system or amplifier), and or frequency variation on any signal (via the output of the system or amplifier). For an example of modulated signals, two or more AM signals may be applied or coupled to an input of a system or amplifier. Any modulated signal may be amplitude, frequency, phase, and or pulse modulated (e.g., in time succession and or in a simultaneous manner). The amount of modulation may be zero and or finite (e.g., on any of the two or more modulated signals coupled to the input of the system or amplifier).

It should be noted that a low frequency signal, or a modulating signal (e.g., for modulating any carrier signal), may include one or more (or a plurality) of the following: a sinusoidal waveform, a ramp signal, a sawtooth signal, a triangle waveform, a step or staircase waveform, and or an arbitrary signal.

Another embodiment (of the invention) includes a sampled or gated phase detector in FIG. 23, block 28", to measure induced phase modulation from a DUT. To avoid tracking the phase modulation from the output of the DUT to the VCO System 139' by use of a continuous phase detection circuit, a sampled or gated or sample and hold type phase detector may instead be used. The sampling or gating signal may be derived from the lower frequency signal that is coupled to the input of the DUT. Or the sampling or gating signal is provided by filtering/modifying the output of the DUT to pass the lower frequency signal. A sampling, gating, or timing signal is then provided or derived for the gated or sampled phase detector circuit. For example, the PDO signal may be coupled via a sampling or gating circuit to Vco in of 139'. Sampling or gating the Vco avoids tracking the induced phase modulation shifts from the DUT.

Thus, an embodiment (for example see FIG. 23) includes providing two or more signals coupled into an input to a DUT, and further comprises coupling an output of the DUT to a modifier. The modifier passes a signal of a selected frequency or frequency band that is coupled to a phase lock loop circuit. The phase lock loop circuit includes a voltage controlled oscillator that is coupled to a sampled or gated signal from a first phase detector output signal (e.g., this sampled or gated signal is an added characteristic of 28" or a sampling or gating circuit is inserted or added between the output of 28" and input of VCO 139'). The first phase detector outputs (via a filter) a signal to provide a signal indicative of induced phase modulation from the DUT.

Should the first phase detector in the phase lock loop circuit include a gated output or input circuitry, then a second phase detector is included. A first input of the second phase detector is coupled to the output of the Vco and a second input of the second phase detector is coupled to the output of the modifier (e.g., block 26). The output (e.g., via a filter) of the second phase detector provides a signal indicative of the induced phase modulation from the DUT.

An alternative to a phase lock loop circuit, to provide a substantially stable phase signal source to measure induced phase modulation (e.g., differential phase) from the DUT, includes coupling a narrow band filter to the output of the DUT to "flywheel" or average out the induced phase modulation. For example, a crystal or crystal filter may be coupled to the output of the DUT to provide a stable phase signal that is substantially the average phase of the induced phase modulation signal. Frequency translation (via multiplier and or mixing circuit) can be used to mix or move up and or down in frequency the induced phase modulated signal, and is supplied to an input of a (narrow band) filter. The output of the filter is coupled to a frequency translation circuit and or a phase detector (with filtering) to provide a signal that is indicative of the phase modulation from the DUT.

A crash lock or triggered oscillator (which may include a gated input from the modifier's (26) output) may be coupled to the output of the modifying circuit 26 to provide a stable phase signal much like a phase lock loop circuit. The output of the crash lock or trigger oscillator provides a signal to one input of a phase detector, and a second input of the phase detector is coupled to the output of modifier 26. The output of the phase detector (with filtering) then provides a signal indicative of the induced phase modulation from the DUT.

In some cases where the DUT generates distortion from a lower frequency signal into the spectrum of a higher frequency signal. The modifier such as block 26 may (then) include one or more filters, to remove/attenuate signal at or near the frequency around the lower frequency signal and or around the lower frequency signal's distortion product(s) as to provide a more accurate measurement of phase and or frequency modulation effect on the higher frequency signal. Preferably, the lower frequency signal may be chosen so that its harmonic (or distortion product(s)) does not fall too closely to the sidebands or carrier of the higher frequency signal so that filtering may be done to separate/attenuate adequately one or more distortion products from overlapping into the (phase or frequency modulation) spectrum of the higher frequency signal (e.g., as to improve accuracy of the phase and or frequency modulation measurement of the higher frequency signal). For example, a comb bandpass and or comb notch filter may be used.

Similarly, if a higher frequency signal has distortion product(s) that bleeds or overlaps into the spectrum of a lower frequency signal's spectrum, filtering for modifier (e.g., block 26), as mentioned previously may be used to improve accuracy of the phase and or frequency modulation measurement (e.g., for the lower frequency signal).

It should be noted or reiterated that an embodiment may comprise a subset or portion of FIG. 3, FIG. 10, FIG. 11, FIG. 12, FIG. 13, FIG. 14, FIG. 15, FIG. 16, FIG. 17, FIG. 19, FIG. 20, FIG. 21, FIG. 22, and or FIG. 23. For example, an embodiment of a novel and unique Wow and/or Flutter meter may or may not include a modifier such as exemplified by block(s) 26, 26A, 31, 32, 33, 34, 35, and or 36 (and Wow and Flutter Meter 27), wherein the embodiment measures induced Wow and or Flutter from a device under test (DUT). The (input of the) device or DUT is coupled to a signal source comprising at least two signals; for example, a first signal and a second signal, and or an Nth signal; a first, second, and or Nth signal including a modulated or unmodulated signal; or a signal source comprising at least one modulated signal. A modifier may (substantially) pass a band of frequencies pertaining to the frequency of a first signal or a second signal or an Nth signal. Typically, the frequency of the first signal is not equal to the frequency of the second signal. Or typically, the signal source includes signals of two or more different frequencies, e.g., wherein (typically) the spectrum analysis of the signal source, for example, that is coupled to an input of the DUT, includes two or more different frequencies (e.g., via a first, second, and or Nth signal, or via a modulated signal). Such a novel Wow and/or Flutter meter may include a module/function/generator/signal source to provide at least two signals such as the first, second, or Nth signal (e.g., two or more signals and or a modulated signal that is coupled to a DUT).

Alternatively, a modifier may (substantially) pass a band of frequencies pertaining to one or more distortion products from any combination of the one or more signals coupled to the input of the device (DUT), or a modifier may (substantially) pass a band of frequencies pertaining to any distortion signal from an output of the device. For example, a modifier may pass frequencies around any harmonic distortion product from the output of a device, wherein frequency (and or phase) modulation or deviation or Wow and or Flutter is measured at one or more harmonic distortion product(s) from the DUT. Similarly, a modifier may pass one or more intermodulation distortion product(s) from the DUT for measurement of frequency modulation or deviation or Wow and or Flutter.

An example of two signals may include a first signal of a first frequency and a second signal of a second frequency, wherein the first signal may be unmodulated or modulated, and or the second signal may be unmodulated or modulated. In general, N number of signals coupled to an input of a DUT includes a first signal of a first frequency, and/or a second signal of a second frequency, and/or an Nth signal of an Nth frequency. A modulated signal may comprise a signal that is modulated (e.g., changed) in amplitude, phase, pulsewidth, position, and or frequency.

An embodiment of a novel and unique Wow and or Flutter meter comprises a limiter (circuit, function, or module) for reducing or removing amplitude variations from an output of a DUT which is coupled to an input of the Wow and or Flutter meter, wherein an amplitude modulated signal is coupled to an input of the DUT. The Wow and or Flutter meter (with the limiter circuit/function/module) measures frequency modulation of the carrier of the amplitude modulated signal output from the DUT. The amplitude modulated signal may have a carrier frequency within the audio bandwidth such as any (carrier) frequency in the range of 1 Hz to 20,000 Hz, or a (carrier) frequency greater than or equal to 20,000 Hz. In this example embodiment, a novel and unique Wow and Flutter meter, or frequency modulation measurement system, may include a generator, function, circuit, and or module for providing one or more amplitude modulated signal(s) (e.g., that is typically coupled to an input of a DUT). It should be noted that a standard Wow and Flutter meter is used in a novel way when an amplitude modulated signal (instead of a single unmodulated tone) is utilized to measure Wow and Flutter output from a DUT.

An embodiment may include a new use of a conventional Wow and Flutter meter to measure induced Wow and Flutter from a device's output terminal, wherein an input of the device is coupled to two or more signals or a modulated signal (e.g., two or more signals simultaneously coupled to an input of the DUT, or a modulated signal coupled to an input of the DUT). It is noted that a conventional Wow and Flutter meter couples only one signal, a single tone, to a device for measuring Wow and Flutter.

The term "Wow and/or Flutter meter" may comprise or may equate to a frequency modulation measurement system, a frequency deviation measurement system, or the like. It should be noted that measuring for Wow and or Flutter, or frequency deviation, or frequency modulation may include any combination of a frequency modulation detector (e.g., for a direct measurement), a frequency spectrum analysis such as sideband analysis, and or a phase detector. For example, for an indirect measurement, an output of the phase detector is coupled to an input of a differentiator/ derivative function/circuit/module, wherein an output of the differentiator/derivative function/circuit/module provides a measurement for frequency deviation or frequency modulation).

For example, FIG. 20 may include an amplitude modulated signal (via modulator block 131' and summer block 24) that is coupled to an input of the DUT 25, with Signal Gen2 set to zero or near zero. The output of the DUT 25 is coupled to an input of an FM detector, spectrum analysis function, a phase detector, and or a Wow and/or Flutter meter (e.g, block 27' and or block 28') to provide measurement of Wow and/or Flutter, phase modulation, and or frequency modulation in the signal from the DUT.

Because Signal Gen2 is set to zero or near zero, which does not provide an "interfering" signal to phase or frequency detectors, modifier 26 may be bypassed in this example, so modifier 26 is optional. Modifier 26 may include a filter to pass a band of frequencies related to the fundamental carrier frequency and or to harmonics of the carrier frequency, so that phase and or frequency modulation effect(s) in a signal from the DUT is measured at the fundamental carrier frequency and or one or more harmonics of the carrier frequency.

For example, a signal with a carrier set at 6 KHz is amplitude modulated (e.g., where modulation frequency includes 150 Hz) and is coupled to an input of a DUT. An output of the DUT may provide an amplitude modulated signal around 6 KHz and or harmonics of the amplitude modulated signal of the 6 KHz carrier, such as one or more amplitude modulated signal centered around 12 KHz, 18 KHz, and or 24 KHz. A modifier 26 can provide band pass filtering to allow a Wow and/or Flutter meter, phase detector, and or frequency modulation detector (which may include spectrum analysis of sidebands) to measure for the DUT's respective distortions of Wow and/or Flutter, differential phase, and or frequency modulation effect (e.g., frequency shift) at 6 KHz, 12 KHz, 18 KHz, and or 24 KHz. Other carrier, modulation, and or test frequencies may be used for this example.

In another embodiment, Signal Gen2 is enabled and produces a signal that is combined with a modulated signal that is coupled to an input of a DUT. An output of the DUT is coupled to a Wow and/or Flutter meter, phase detector, frequency modulation detector, and or spectrum analysis function, for measurement of differential phase and or frequency modulation from the DUT of one or more signals. The signals may include an intermodulation distortion signal, harmonic distortion signal, and or a fundamental frequency signal of any of the input signals.

As noted previously, an input of a device under test may be coupled to a modulated signal source for measuring one or more phase and or frequency modulation effect from the output of the device under test. For example, a phase or frequency modulated signal, s(t), may include a carrier signal f(t) that is phase or frequency modulated by a signal mpf(t). The phase or frequency modulated signal, s(t), may then be coupled to an input of a DUT, wherein an output of the DUT is coupled (via an optional modifier) to a first input of a phase detector. A second input of a phase detector is coupled to the phase or frequency modulated signal, s(t). An output of the phase detector is coupled to a filter to provide a signal that is indicative of phase modulation from the DUT. It should be noted that if the DUT is bypassed, both inputs of the phase detector receive essentially the same signal from s(t), and even though s(t) includes phase or frequency modulation of its carrier, the resulting differential phase would be cancelled out or close to zero. Therefore, with the DUT between one input of the phase detector and s(t), measurement of differential phase from an output of the DUT is measured, wherein the modulating signal, mpf(t) causes the DUT to exhibit (extra) phase modulation. The output of the phase detector may be coupled to a differentiator circuit or function (e.g., a high pass filter) to provide a signal from an output of the differentiator circuit or function that is indicative of frequency modulation (effect(s)). It should be noted that the phase and or frequency modulated signal s(t) may include amplitude modulation that is amplitude modulated by signal m2am (t). The modulating signals mpf(t) and m2am (t) may be related in phase and or frequency, or may be (two) independent signals. For example, a phase, frequency, and or amplitude modulated signal, spfa(t), may be used in place of s(t) for testing the DUT (e.g., wherein signal mpf(t) provides phase and or frequency modulation and or signal m2am (t) provides amplitude modulation for signal spfa(t)).

In another embodiment, a test signal such as s(t) may include a signal that is amplitude, frequency, and or phase modulated, wherein the test signal is coupled to an input of a DUT, and wherein an output of the DUT is measured for differential phase distortion. For example, an output of the DUT is coupled to a first input of a phase detector, and a second input of the phase detector is coupled to the test signal (e.g., via a limiter circuit or function should the signal s(t) include amplitude modulation). An output of the phase is filtered to provide a signal indicative of any phase modulation or differential phase distortion from the DUT.

An example of a device under test (DUT) may include any combination of: an amplifier of class A, B, AB, C, D, G, and or H, wherein the amplifier may include a modulated or unmodulated power supply, a system that converts an analog signal to a digital signal, and or a system that converts a digital signal to an analog signal, and or a digital signal processor with data compression (e.g., using Discrete Cosine Transforms, Wavelet Transforms, filter banks, Discrete Fourier Transforms, and or Fourier Transforms).

A device under test (DUT) may include an audio device.

In particular, a class G or class H amplifier includes a modulated power supply that may switch from one voltage or another in a discrete manner, or a modulated power supply that varies or tracks the input signal. In either class G or H amplifiers, the voltage modulation from the power supply may induce a dynamic phase and or frequency effect at an output of the class G or H amplifier. A class D switch amplifier that normally includes a high frequency pulse width modulated waveform to deliver a signal to its output load, may exhibit differential phase or frequency modulation distortion. Class AB, B or C amplifiers include crossover distortion, which can exhibit a phase or frequency modulation distortion greater at a crossover region than elsewhere in the transfer function of the class B or C amplifier. In some class A amplifiers, maximum and minimum gain or output impedance occurs at extremes of the output signal's range (e.g., output voltage or current swing), which leads to phase and or frequency modulation distortion. Thus, an embodiment is to test any class of amplifiers for differential phase and or frequency modulation distortion.

Another embodiment may include frequency and or time scaling (at least a portion) of video signals, such as color bars, a modulated ramp or stairstep, a multipulse, multiburst, modulated (sine squared) pulse such as 20T or 12.5T, an amplitude modulated signal superimposed on a voltage level, etc., to audio frequencies. For example, a video signal may be scaled (e.g., increased) in time by about 200 times (or in a range of 20 to 2000 times) to provide a test signal to an input of a DUT.

An embodiment may include quadrature phase detectors (e.g., I and Q demodulators) to display or decode a phase modulated signal added to a stepped waveform (of equal or non equal step size) to provide a vectorscope display (e.g., display of a signal in terms of a magnitude and an angle, or display of a signal in polar coordinates). For example, an audio bandwidth color bar signal is coupled to an input of a DUT, wherein an output of the DUT is coupled to a vectorscope to display phase or amplitude shifts from the DUT.

An embodiment may include a test signal, that includes a first signal that is multiplied or amplitude modulated by a second signal, plus a third signal. This test signal for example, is coupled to an input of a DUT, wherein an output of the DUT is coupled to a phase detector, a frequency modulation detector or a spectrum analysis measurement system, to measure phase and or frequency modulation distortion from the DUT. The third signal may be derived from the first and or second signal.

For example, a test signal may have a first signal that includes a sinusoid waveform of a low frequency and second signal that includes a sinusoidal waveform of a high frequency, wherein the third signal (e.g., a sinusoidal waveform or an arbitrary waveform such as any combination of a modulated signal, a continuous wave signal, and or a pulsed signal) is derived from the first signal.

Another example of a test signal comprising three or more signals for measuring differential phase and or frequency modulation distortion.

For example, one test signal includes two high frequency signals, a first high frequency signal of frequency FH1 and a second high frequency signal of frequency FH2 combined with a lower frequency signal of frequency FL1. These three signals are coupled to an input of an audio device and an output of the audio device is coupled to a modifier to remove or attenuate from the output of the audio device, high frequency signals related to frequencies FH1 and or FH2, while passing a signal of(e.g., at least) frequency FL1 to a phase and or frequency detector for measuring differential phase and frequency modulation distortion induced by the first and or second high frequency signal. The phase and or frequency modulation effect from the amplifier may include a frequency related to |FH1-FH2|. In one embodiment, the for example, first and second high frequency signals have frequencies above (e.g., about) 3 KHz to (e.g., about) 10 KHz; for another example, the CCIF Twin Tone test signal comprising a 19 KHz (FH1) signal and a 20 KHz (FH2) signal (of course other frequencies for FH1 and FH2 may be used) may be utilized for the first and second high frequency signals. The low frequency signal may include a signal whose frequency is less than the lower of FH1 or FH2. For example, the lower frequency signal has a frequency FL1<19 KHz. For example only, the lower frequency signal includes a signal whose frequency is <=10 KHz such as 3 KHz to 10 KHz. When the three signals are coupled to an input of an amplifier, the "beating" effect of the two high frequency signals with frequencies FH1 and FH2 will induce phase and or frequency modulation of the signal with frequency FL1 a modulation frequency related to FH1-FH2, or if FH1=19 KHz and FH2=20 KHz, then |FH1-FH2|=1 KHz=a related modulation frequency onto the signal whose frequency is FL1. Therefore in this example, a CCIF Twin Tone test signal is combined with a lower frequency signal and fed to an audio device to determine or measure the differential phase and or frequency modulation distortion of the lower frequency signal whose frequency is FH1 from an output of the audio device.

Note that a frequency detector may include a Wow and Flutter meter.

An embodiment may include: A system for measuring an induced phase or frequency modulation effect of a device, wherein the device has an input and an output, comprising: a generator for providing a first higher frequency signal, a second higher frequency signal, and a first lower frequency signal for coupling to the input of the device, wherein the output of the device is coupled to an input of a modifier, further comprising the output of the modifier passes signals related to the lower frequency signal while attenuating signals related to the first and or second higher frequency signals to a phase and or frequency detector for measuring differential phase, phase modulation and or frequency modulation related to one or more signals related to the lower frequency signal from the output of the device, and wherein the phase or frequency modulation effect on the lower frequency signal from the output of the device is caused or induced by one or both of the higher frequency signals coupled to the input of the device.

A variation of a test signal for measuring differential phase and or frequency modulation distortion may include two (or more) lower frequency signals with frequencies FL1A and FL1B and a higher frequency signal with frequency FH1A.

These three signals are coupled to an input of an amplifier and an output of the amplifier is coupled to modifier to remove or attenuate signals related to FL1A and or FL1B. The output of the modifier passes a signal related to FH1A to a phase and or frequency detector to determine or measure differential phase and or frequency modulation distortion of a signal related to FH1A from the amplifier's output induced by any combination of the two lower frequency signals.

Another embodiment includes a test signal for determining differential phase and or frequency modulation distortion includes a first signal combined with a second signal. The first signal (e.g., when decomposed via Fourier or spectral analysis) includes a fundamental frequency signal and at least one harmonic of the first signal. The second signal has a frequency that is higher than the fundamental frequency of the first signal. An audio device (or DUT) is coupled to the first and second signals will then produce differential phase and or frequency modulation induced by the second signal. It was found that phase and frequency modulation effect can be varied by the varying the amplitude of the second signal, and generally, the higher the amplitude of the second signal, the higher the deviation in phase and frequency of signal(s) related to the first signal. Therefore, one other embodiment includes modulation of the second signal by for example amplitude, phase, frequency, and or pulse modulation. To measure differential phase and or frequency modulation of the audio device, an output of the audio device is coupled to an input of a modifier such that an output of the modifier passes a band of frequencies related or near the fundamental frequency and or a harmonic frequency of the first signal. The output of the modifier is then coupled to a phase detector and or frequency modulation detector for measuring differential phase and or frequency modulation at one or more frequencies related to the first signal. The differential phase and or frequency modulation distortion includes distortion induced by the second signal at the input of the audio device and or at the output of the audio device. One or more of the figures and or descriptions (e.g., any combination of FIGS. 3 to 23) involving modifiers, receivers, tuners, filters, frequency translators or mixers, limiters, phase detectors, and or frequency detectors previously mentioned may be utilized for measuring phase or differential phase and or frequency modulation with the test signal including the first signal and the second signal. For example, one or more phase and or frequency detectors may be utilized to provide measurement the phase and frequency modulation effect from an audio device at the fundamental frequency and or one or more harmonics of the first signal, or for measuring differential phase and or frequency modulation distortion related to the second signal. Therefore, an embodiment may include that differential phase and or frequency modulation distortion may be measured for one or more signals related to the (e.g., frequency of) first and or second signal from an output of the audio device. The one or more signals related to the first and or second signal may include one or more distortion product(s) from the first and or second signal (e.g., wherein the audio device provides one or more distortion products at its output).

The first signal that is coupled to the input of the audio device may (or may not) include filtering such as low pass, high pass, band reject, and or band pass to for example shape the frequency response of the first signal. For example, the first signal that is coupled to the audio device may include a low pass filter to attenuate harmonics of the first signal and or a band reject filter to attenuate or remove one or more harmonics from the first signal prior to coupling into the input of the audio device. Any previous, present, and subsequent descriptions of the first signal may (or may) not include filtering as described in this paragraph. It should be noted that any previous, present, and subsequent descriptions of the second signal may (or may not) include an arbitrary waveform, a pulsed waveform, and or a modulated waveform, where the modulated waveform may include any combination of phase, frequency, pulse, and or amplitude modulation.

Yet another test signal for determining differential phase and or frequency modulation distortion(s) is to utilize a pulsed waveform and sine wave signal. The sine wave induces differential phase and or frequency modulation distortion onto the pulsed waveform or at a frequency or band around the fundamental frequency of the pulsed waveform, and or a harmonic signal of the pulsed waveform. The pulse waveform and sine wave signal is coupled to an audio device. The output of the audio device is coupled to an input of a modifier (e.g., a modifier may include one or more filters). The modifier's output terminal passes a band of frequencies to a phase detector and or frequency detector for determining differential phase and or frequency modulation distortions from the audio device (e.g. audio amplifier or audio amplifier within a device). The differential phase and or frequency modulation distortion may be measured for signals related to the (e.g., frequency of) first and or second signal from an output of the audio device. Also, note that a phase or frequency detector may include a limiter circuit or limiter function to limit the modified signal from the modifier.

One example of a test signal that comprises of a pulsed signal as a first signal combined with a second signal. A pulsed waveform that may include a squarewave signal (e.g., first signal) combined with a sine wave or arbitrary signal. For example, in the Audio Engineering Society paper, "A Method for Measuring Transient Intermodulation Distortion (TIM)", by Eero Leinonen, Matti Otala, and John Curl, Journal of the Audio Engineering Society, Oct. 30, 1976, shows a transient intermodulation distortion (TIM) test waveform comprised of a 3.18 KHz squarewave and a 15 KHz sine wave. This TIM test waveform is utilized to measure the amplitudes of intermodulation distortions of an amplifier. However, this Audio Engineering Society (AES) paper from Oct. 30, 1976 does not teach nor mention using this TIM test signal for measuring differential phase and or frequency modulation distortions. New use of this TIM waveform can be utilized for measuring differential phase and or frequency modulation distortion of one or more signals related to a pulsed waveform or a squarewave or the sine wave or arbitrary signal. For example the TIM test signal may or may not include a filtered squarewave that is combined with the second signal. In the AES paper mentioned the squarewave signal is low pass filtered (e.g., low pass filtered at 30 KHz or 100 KHz) and then combined with a 15 KHz sine wave signal to provide the TIM test signal. An embodiment includes a test signal for measuring differential phase and or frequency modulation distortion is comprised of the TIM test signal as described in this paragraph. Another embodiment includes coupling the TIM test signal into an input of an audio device. An output of the audio device outputs a signal including a squarewave or filtered squarewave or a squarewave with modified rise and or fall times, plus a sine wave signal. The output of the audio device is coupled to a modifier to remove or attenuate signals related to the sine wave signal and or to remove or attenuate one or more signals related to the squarewave signal. The output of the modifier is coupled to a phase and or frequency modulation detector to measure differential phase and or frequency modulation of a signal related to the squarewave signal from the output of the audio device.

For example, an embodiment may comprise a 3.18 KHz squarewave signal and a 15 KHz signal (e.g., the squarewave or pulsed signal and or sine wave may be of another frequency) for the TIM test signal to measure differential phase and or frequency modulation distortion at 3.18 KHz, 3×3.18 KHz, 5×3.18 KHz, Nx3.18 KHz and or 15 KHz, where N=an integer (e.g., 1, 2, 3, 4, 5, 6, 7, 8, 9, and or so on). The (e.g., unexpected) phase and modulation frequency for this example is found to be [5×3.18 KHz 15 KHz]= [15.90 KHz 15 KHz]=900 Hz. Other frequencies may be utilized. For example the pulsed waveform frequency set at 3 KHz, and the sine wave frequency set at 14.15 KHz, which yields a (e.g., unexpected) phase and frequency modulating frequency of [5×15 KHz-14.15 KHz]=850 Hz. An apparatus or method to measure the differential phase and or frequency modulation of an audio device comprises of coupling the TIM test signal to an input the audio device, coupling an output of the audio device to a modifier to remove or atteneunate one or more signals or to a modifier to pass one or more bands of frequencies related to the pulse waveform frequency (e.g., 3.18 KHz or Nx3.18 KHz or 3 KHz or Nx3 KHz) to one or more phase detectors and or to one or more frequency detectors that convert(s) the differential phase and or frequency deviation into a current or voltage signal. For example, a filter or nulling or cancellation circuit may be used to remove sine wave signal (e.g., at 15 KHz or 14.15 KHz) from the output of the amplifier prior to coupling to a phase and or frequency detector to measure the differential phase at Nx3.18 KHz or Nx3 KHz, where N=an integer. The filter may include any combination of low pass, high pass, band pass, and or band reject filter. For example, a low pass filter may be coupled to the output of the amplifier to attenuate signals above the fundamental frequency of the squarewave while still pass at least one sideband above the squarewave's fundamental frequency. The sideband(s) around the fundamental frequency and or harmonics of the first signal will be typically distanced or away from the fundamental frequency or harmonics of the first signal by Mx[modulating frequency], where M=integer, or a multiple (e.g., 1, 2, 3, . . . etc.) of the phase and or frequency modulation frequency such as [5×3.18 KHz–15 KHz]= [15.90 KHz–15 KHz]=900 Hz or [5×15 KHz–14.15 KHz]= 850 Hz from either side (e.g., upper or lower sideband) of the fundamental frequency or harmonics of the first signal. The modulating frequency in general is =|Nxf1–f2|<f3, where N is an integer, f1 is the frequency of the first signal or pulsed waveform (e.g., squarewave), f2 is the frequency of the second signal or sine wave signal, and f3 is an upper frequency limit and for example, f3 is generally less than 2 KHz. A 4 KHz to 6 KHz low pass filter may be utilized as a filter to pass a band of frequencies to measure phase and frequency modulation distortion at the pulsed waveform or squarewave frequency of 3.18 KHz or 3 KHz. Alternatively, a band pass filter may be used at 3.18 KHz or 3 KHz, 9.54 KHz or 9 KHz to measure differential phase and or frequency modulation of an amplifier at any of these frequencies (e.g., wherein the differential phase and frequency modulation is induced by the 15 KHz or 14.15 KHz sine wave signal).

Alternatively, a low pass filter in the range of 10 KHz or higher (e.g., 11 KHz to13 KHz) may be utilized to remove the sine wave signal of 15 KHz or 14.15 KHz to determine or measure the differential phase and or frequency modulation of a pulsed waveform comprising the fundamental frequency and at least one of its harmonics. For example, an 11 KHz to 13 KHz low pass filter will pass the fundamental frequency and up to the $3^{rd}$ harmonic of the pulsed waveform or squarewave signal to provide measuring differential phase and or frequency modulation of a "filtered" pulse waveform or filtered squarewave wherein the differential phase and or frequency modulation is induced by the sine wave signal (e.g., 15 KHz or 14.15 KHz signal).

An embodiment may include coupling the TIM test signal that includes a first signal and second signal to an input of an audio device, wherein the first signal comprises a pulsed waveform, further coupling an output of the audio device to an input of a filter or a cancellation circuit that attenuates or removes a signal at the output of the audio device related to the second signal, further coupling an output of the filter or cancellation circuit to a phase and or frequency detector to measure differential phase and or frequency modulation distortion from the audio device that is induced by the second signal. For example, the TIM test signal comprising a 3.18 KHz or 3 KHz square wave signal combined with a 15 KHz or 14.15 KHz sine wave signal (e.g., respectively) is coupled to an input of an audio device (e.g., amplifier), an output of the audio device is coupled to an input of a modifier such that at an output of the modifier, the 15 KHz or 14.15 KHz signal is attenuated while passing the 3.18 KHz or 3 KHz squarewave from the output of the audio device to a phase and or frequency detector for measuring differential phase and or frequency modulation distortion that is induced by the second signal. Therefore, the differential phase and or frequency modulation distortion of the pulsed waveform or squarewave from the output of the audio device or amplifier is measured. A cancellation circuit may include adding an out of phase portion of the second signal derived from a generator that provides the second signal to the input of the amplifier to combine with the output signal of the audio device such that the second signal at the output of the audio device is nulled or attenuated.

Another embodiment may include a modified TIM test signal. An example of a modified TIM test signal comprises a first signal such as a (e.g., 3 KHz) pulsed waveform (e.g., a waveform of duty cycle between 0% and 100%, or a squarewave, or a waveform of wherein 1/[duty cycle] or the reciprocal of the duty cycle is a whole number or integer) that is combined with a second signal whose frequency is higher than the $5^{th}$ or Nth harmonic, where N=integer. For example, a 3 KHz signal such as a squarewave (or pulsed waveform) is utilized for the first signal and a 20 KHz signal (e.g., sine wave or arbitrary waveform) is utilized for the second waveform. The 3 KHz signal may or may not include filtering when combined with the 20 KHz signal to form or provide a modified TIM test signal. The modified TIM test signal is coupled to an input of an audio device. An output of the audio device is coupled to an input of a modifier and an output of the modifier provides removal or attenuation of the 20 KHz signal from the output of the audio device. Also the output of the modifier provides signals related to the first signal for measuring differential phase and frequency modulation distortions at 3 KHz, and Nx3 KHz, where N=integer. For example, the modifier then passes signals related to the pulsed waveform at 3 KHz, 9 KHz, and or 15 KHz to allow measuring differential phase and or frequency modulation at 3 KHz, 9 KHz, and or 15 KHz. The modifier may include one or more band pass filters to provide one or more outputs to pass separately signals centered around 3 KHz, 9 KHz, and or 15 KHz. Each or at least one band pass filter output may be coupled to phase and or frequency detectors to measure the differential phase and or frequency modulation distortion at one or more frequencies (e.g., 3 KHz, 9 KHz, and or 15 KHz), wherein the phase and frequency modulation frequency is |Nxf1−f2|<f3, where N is an integer, f1 is the frequency of the first signal or pulsed waveform (e.g., squarewave), f2 is the frequency of the second signal or sine wave signal, and f3 is an upper frequency limit and for example, f3 is generally less than 2 KHz. In this example, f1=3 KHz, N=7, f2=20 KHz, which results in 7×3 KHz 20 KHz=1 KHz=modulation frequency. Of course the modified (e.g., TIM) test signal may include frequencies other than 3 KHz for f1 and or frequencies other than 15 KHz for f2.

An embodiment may include second modified TIM signal that includes a first signal comprising a filtered pulsed waveform or a non symmetrical pulse in terms of duration and a second signal. The first signal comprises signals of the fundamental frequency and harmonics with at least one harmonic (e.g., Nth harmonic) attenuated by filtering or attenuated by the non symmetrical duration (e.g., if the reciprocal of the duty cycle is a whole number, P, then the pulse will provide a signal of the fundamental frequency and its harmonics except signals related to the Pth harmonic and except signals whose frequency is every harmonic that is a multiple of P) and the frequency of the second signal may include a frequency in the range between the (N−1) or (P−1) harmonic and the (N+1) or (P+1) harmonic. This second modified TIM signal is then coupled to an input of an audio device and an output of the audio device is coupled to a modifier to remove one or more signals related to the first and or second signals. The modifier also passes signals related to the first signal from the audio device that is coupled to a phase and or frequency detector to measure differential phase and or frequency modulation (e.g., effects) of one or more signals related to the first signal from the output of the audio device.

And embodiment may include: An embodiment may include: A system for measuring an induced phase or frequency modulation effect of, an audio device, wherein the audio device has an input and an output, comprising: a first generator for providing first signal comprising a pulsed waveform and a second generator for providing a second signal whose frequency is higher than the frequency of the first signal to an input of the audio device; wherein the output of the audio device is coupled to a Wow and Flutter meter, a phase detector, and or a frequency modulation detector; measuring via the phase detector and or the frequency modulation detector the induced phase or frequency modulation effect of one or more signals related to the pulsed waveform at the output of the audio device; and wherein the phase or frequency modulation effect on one of the input signals is caused or induced by the second signal coupled to the input of the audio device.

Figure 24:
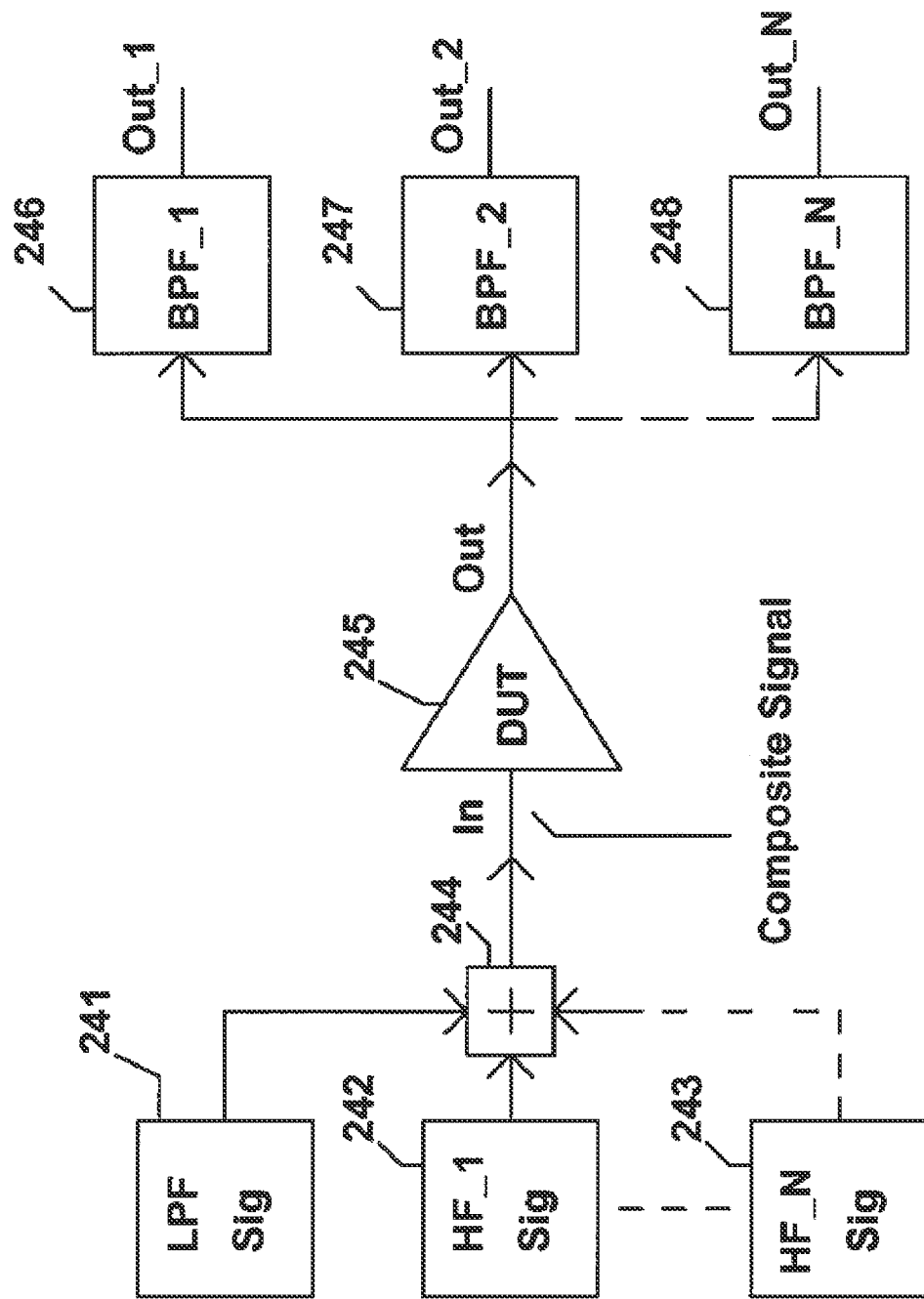
FIG. 24 shows an example of using filter banks to measure time varying distortion.

FIG. 24 shows a low frequency generator, 241, that is combined or summed via 244 with one or more higher frequency generator(s), 242 and or 243. Generator 243 represents an Nth higher frequency generator. A lower frequency generator (e.g., generator 241) may include an arbitrary waveform, a sinusoidal waveform, a pulsed waveform, a stairstep or staircase waveform, bipolar waveform, and or (e.g. low pass) filter. The output of the summer 244 is then connected or coupled to the DUT (device under test). An output of the DUT, 245 is then coupled to one or more bandpass filters 246, 247, and or 248. Note: the higher frequency test tones or test signals may include frequency or frequencies of Fi and or Fj. The bandpass filters are tuned or provide(s) a bandpass to frequency or frequencies of the harmonic (e.g., frequency or frequencies of n×Fi) or intermodulation (e.g., frequency or frequencies of m×Fi+/−p×Fj) distortion signals. For example, if one of the higher frequency tones is 1 kHz, the filters may be tuned or allow to pass signals at 2 kHz, 3 kHz, and or n×1 kHz, etc. where n>=2 for example. The bandwidth of the filters in the filter bank (e.g., 246, 247, and or 248) may be sufficiently wide to avoid ringing. That is if the bandpass filters are narrow in bandwidth, erroneous readings may occur because of ringing effects from the low frequency signal (e.g., where a low frequency signal includes a stairstep signal or 2 or more levels). One example of bandwidth is in the order or 20% or more of the bandpass frequency. Of course other bandwidth numbers may be used for minimizing ringing while providing an accurate real time analysis of the distortion.

The filter bank may (e.g., optionally) include one or more band reject filters. For example, the filter bank may include a notch or band reject filter that attenuates the one or more of the signals from an output of the DUT (Device Under Test).

One or more outputs from the filter bank (e.g., filters) is coupled to a display or measurement device to show the relative level or amplitude of at least one distortion signal or distortion product.

One or more outputs from the filter bank (e.g., filters) is coupled to a phase and or frequency demodulator/detector to measure for differential phase, phase modulation, and or frequency modulation distortion from one or more distortion signal(s) or distortion product(s) from the DUT or device (e.g., via a device's or DUT's output terminal).

For example with a 6 kHz test tone and a stairstep signal (e.g., 20 ms period or 5 steps), the bandpass filter at 12 kHz (e.g., second harmonic of 6 kHz) has a 4 kHz or more bandwidth. Note: An FFT analysis that places the harmonic or intermodulation distortion in a bin typically will have narrow band characteristics that may cause an inaccuracy in the measurement of time varying harmonic and or intermodulation distortion.

Figure 25:
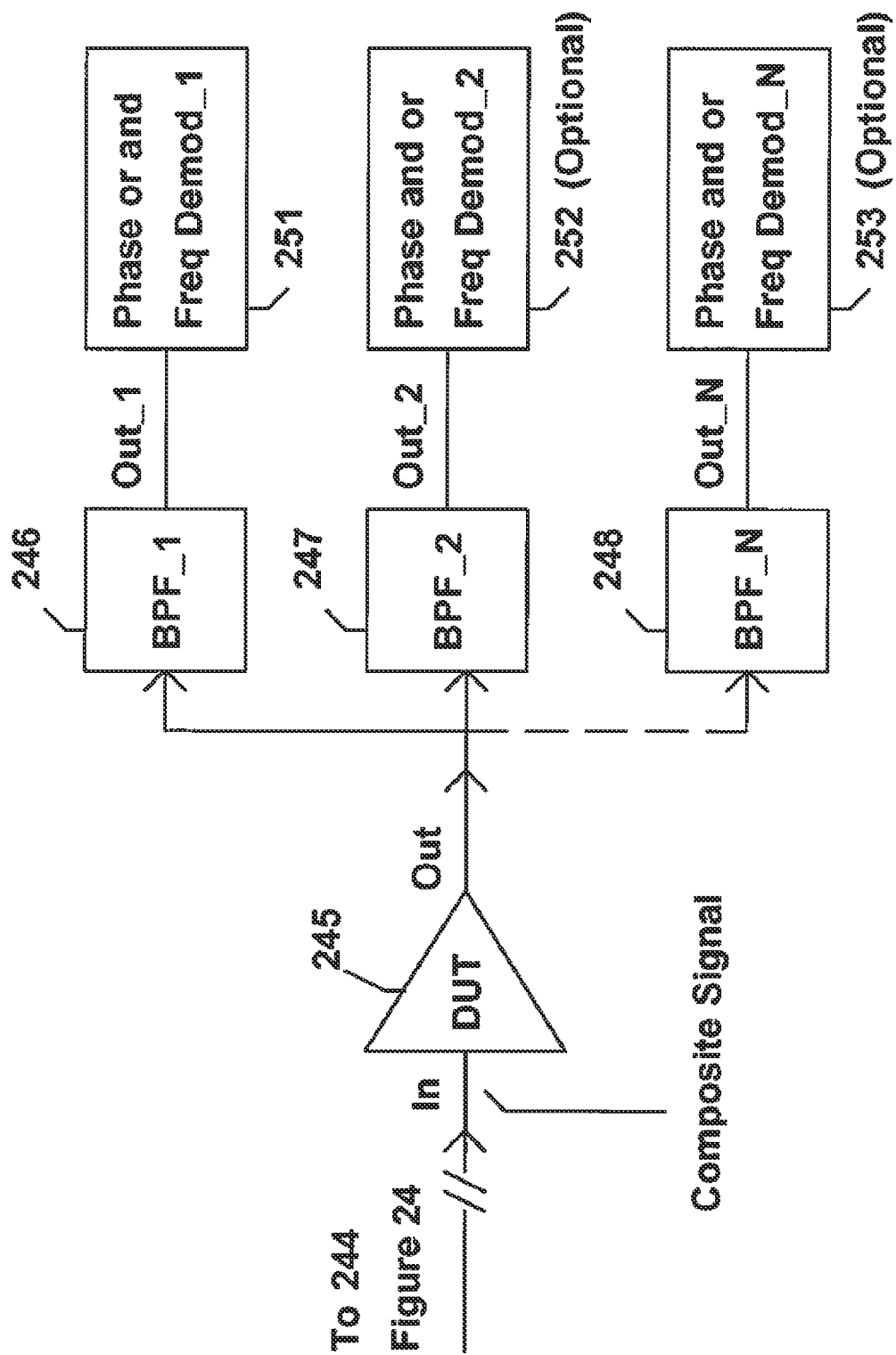
FIG. 25 shows an example of using filter banks including a phase and or frequency modulation detector or demodulator to further measure phase and or frequency modulation effect(s) from distortion signal(s).

FIG. 25 shows that phase and or frequency modulation effects from one or more of the distortion signal from one or more of bandpass filters. Phase modulation and or frequency modulation detectors or demodulators shown in 251, 252, and or 253 allow(s) measurement of dynamic phase shift and or frequency shift from the harmonic and or intermodulation distortion from the DUT. For example, the dynamic phase shift or frequency shift is provided via the lower frequency signal inducing time varying offset levels, which then causes some devices to produce varying amounts of harmonic and or intermodulation distortion as a function of the offset voltage, which then can provide time varying phase and frequency shifts in the harmonic and or intermodulation distortion signal(s). Phase or frequency demodulator 252 or 253 may be optional. Phase or frequency demodulator 251 may be coupled to the output of any one of the bandpass filters or any portion of the filter bank. One or more bandpass filters may form or provide a filter bank. In terms of bandwidth of the bandpass filters that comprise a filter bank, sufficient bandwidth is required to allow passage of sufficient sidebands around the frequency of the distortion product as to allow proper or accurate phase and or frequency demodulation. For example, too narrow a bandwidth will produce erroneously low readings on the phase and or frequency modulation effect from the DUT.

FFT may also be used to measure time varying harmonic and or intermodulation distortion.

Also note that the filter banks may be implemented in any combination of analog circuits, digital circuits, software, digital signal processing, and or computational apparatus.

Alternatively, an FFT (Fast Fourier Transform) or DFT (Discrete Fourier Transform) may be taken at any portion or interval of the lower frequency signal (e.g., block 241 in FIG. 24) at the output of the DUT to measure for harmonic and or intermodulation distortion. For example, if a stepped signal is used, filter banks as previously described may be used to measure time varying harmonic and or intermodulation distortion. Alternatively, an FFT can be applied during a portion of one or more of the steps of the stepped signals to provide a measurement of harmonic and or intermodulation distortion.

Figure 26:
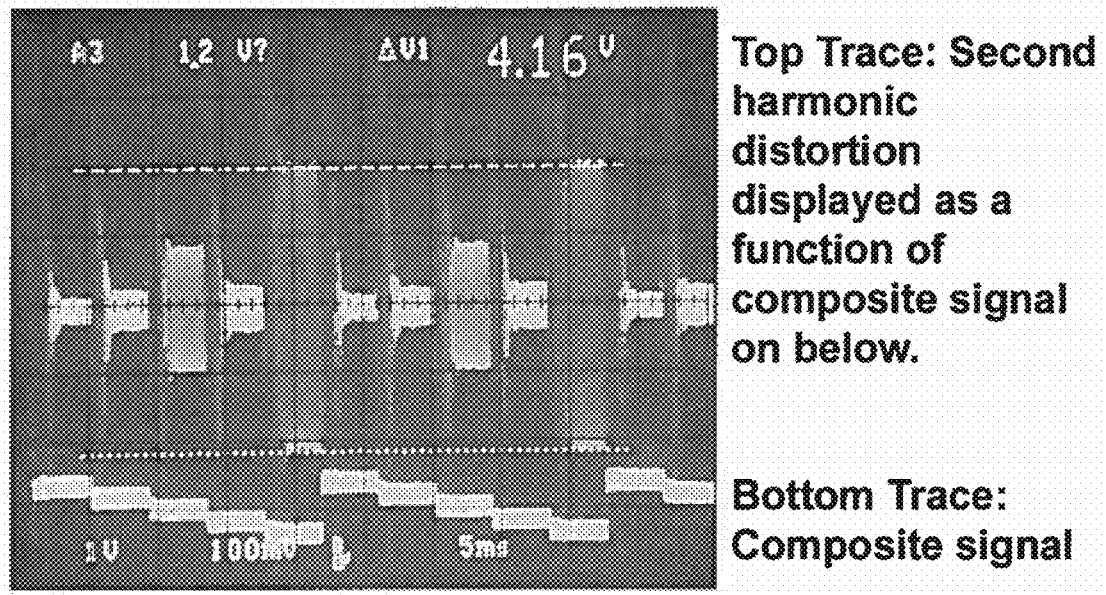
FIG. 26 shows an example of the time varying harmonic distortion or intermodulation distortion when a composite waveform comprised of a stairstep signal and higher frequency signal is utilized.

FIG. 26 shows an example measurement from a device under test (e.g., an op amp such as a TL082 op amp). The top trace shows harmonic distortion for a 5 step signal example. The bottom trace shows the test signal waveform, a 5 step staircase low frequency signal combined with a higher frequency signals (e.g., a sinewave whose frequency is within an audio bandwidth of 22 kHz). The distortion displayed from the output shows more distortion on the third step where the offset or stairstep voltage is zero than at other steps where there is a transient DC offset voltage on the first or second or fourth step. Note the fifth step which represents measuring harmonic distortion where the output signal is near the negative rail or power supply, the harmonic distortion is largest in this example. The harmonic distortion displayed in FIG. 26 may be the nth harmonic where n>=2.

Alternatively, a five step stairstep signal may be replaced with an N-step stair step signal, where n>=2. This stairstep signal may include even or uneven levels and or the steps themselves may include a flat or non-flat slope. The step can include another waveform riding on top of a step. The waveform may be stepping in levels up, level, and or down.

The stairstep signal may be replaced or included with a ramp signal, a triangle wave signal, a sawtooth signal, wherein a ramp portion may be linear or nonlinear.

Yet an alternative to a stairstep signal includes a sinusoidal signal that is modulated or unmodulated, or another alternative includes a ramp signal.

Yet another alternative is to and one or more higher frequency signals with a lower frequency arbitrary signal as a test signal. This test signal is measured for dynamic harmonic and or intermodulation distortion. Any of the one or more higher frequency signals and or the lower frequency signal may include an unmodulated and or modulated signal. Examples of modulated signals includes one or more of the following type(s) of modulation in any combination of one or more including: frequency modulation, pulse code modulation, delta modulation, phase modulation amplitude modulation, I and or Q modulation, quadrature modulation, vestigial sideband modulation, single sideband modulation, double sideband modulation with or without carrier, and or one or more modulation signals.

Any harmonic distortion signal can also be tested for one or more frequency shift(s) or phase shift(s) due to a stairstep signal or another signal that may include an arbitrary waveform.

Figure 27:
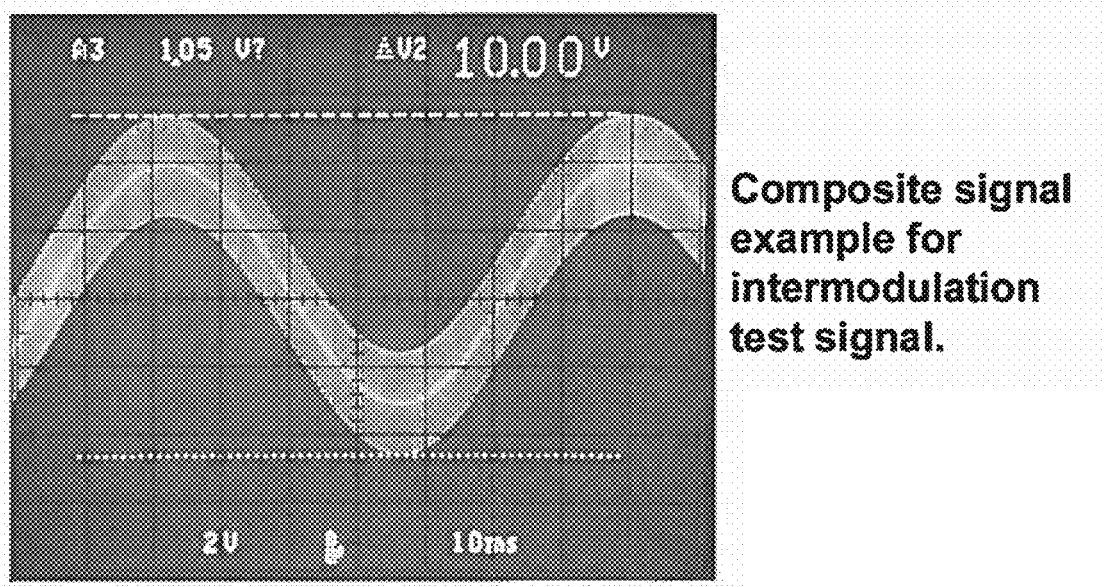
FIG. 27 shows an example test signal for measuring time varying intermodulation distortion, or for measuring time varying harmonic distortion.

FIG. 27 shows a different example of a low frequency signal. A low frequency sine wave replaces the stairstep waveform and two or more test signals of higher frequencies are combined or added to the low frequency sine wave signal to provide a test signal for evaluating time varying intermodulation distortion of the nth order where n>=2. For example, the lower frequency signal may have a frequency <1 kHz, and the two or more test signals added to the lower frequency signal may be >10 kHz. Of course other frequencies may be used.

Figure 28:
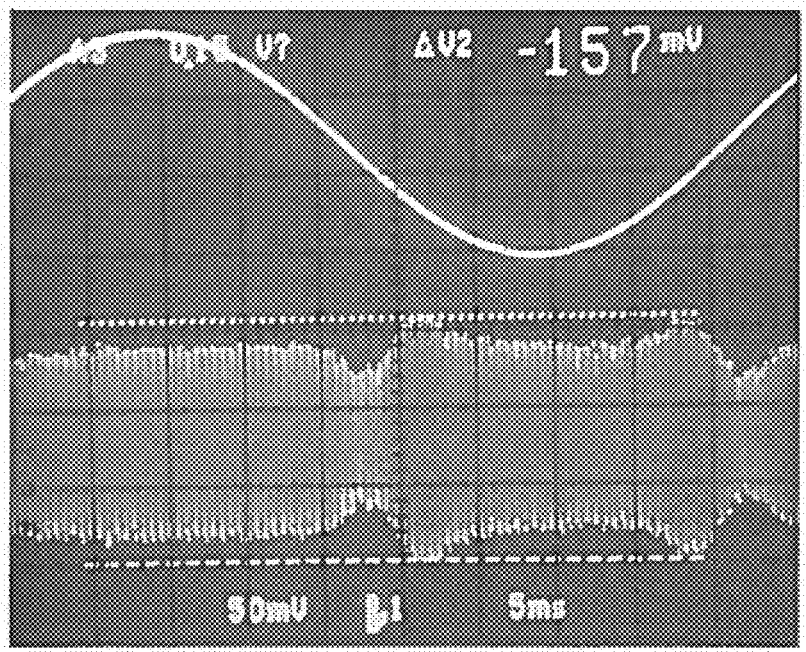
FIG. 28 shows an example of measured time varying intermoduation distortion such as (e.g., but not limited to) a function of a low frequency signal or as a function of input or output signal amplitude.

FIG. 28 shows an example of time varying intermodulation distortion from an amplifier or audio device (e.g., an LM1458 op amp). The top trace shows the low frequency sine wave signal and the bottom trace shows intermodulation distortion (e.g., $2^{nd}$ order intemodulation distortion or nth order intermodulation distortion) that is time varying. At near the zero crossing of the lower frequency signal on the top trace, the intermodulation distortion is at a minimum, and the bottom trace also shows that during the positive cycle of the lower frequency signal, the intemodulation distortion is lower than during the negative cycle. Also note that the time varying intermodulation distortion in this example resembles a "dumb-bell" pattern during the negative cycle of the lower frequency signal (e.g., sinewave on top trace).

Note that the low frequency signal that causes the time varying intermodulation distortion (e.g., from the two or more higher frequency signals) is not limited to a sinewave signal. Other waveforms may be used. For example, any of the following may be used in any combination (e.g., with another or by itself): an arbitrary waveform, a stairstep signal, sinusoidal waveform, pulse waveform, ramp waveform, modulated waveform, etc.

From the intermodulation distortion signal, not only the amplitude can be measure for determining time varying (e.g., strength or amplitude) amount(s) of intermodulation signal, but also optionally, phase and or frequency modulation can be measured from any (e.g., or one or more) of the intermodulation distortion signals.

In general, the pattern of the time varying harmonic and or intermodulation distortion is hard to predict and direct measurement is used to determine the "pattern" or distribution of the time varying or dynamic harmonic and or intermodulation. For example, there are some amplifiers that will show harmonic distortion in one or two of the five steps (or N) of a five (or N) step staircase or stairstep signal. But other amplifiers will show a different distribution of distortion over the different steps. Likewise in some amplifiers, there will be little or close to zero intermodulation distortion during one cycle of the lower frequency signal, and quite measureable intermodulation distortion in the other cycle of the lower frequency signal.

An alternative to measuring differential phase, phase modulation, and or frequency modulation is to couple a distortion signal (e.g., harmonic or intermodulation) to a spectrum analyzer and determine by the sideband content which may include phase information of the sidebands of the distortion signal to measure phase and or frequency modulation in the distortion product. The distortion product may be filtered and coupled to a limiting circuit (e.g., to remove AM distortion components while passing phase or frequency modulation distortion) before coupling to a spectrum analyzer, wherein the spectrum analyzer may include an FFT or FT (Fast Fourier or Fourier).

Determining time varying harmonic and or intermodulation distortion may include: A method and or apparatus of measuring a time vary or dynamic harmonic and or intermodulation distortion (e.g., signal) from an audio device, wherein the audio device has an input and an output, comprising: providing a first signal comprising a pulsed waveform and a second signal whose frequency is higher than the frequency of the first signal to an input of the audio device; coupling the output of the audio device to an input of one or more bandpass filters (e.g., may include a filter bank), wherein the one or more bandpass filter provides a filter bank, and wherein the one or more bandpass filters includes at least one output terminal; measuring the harmonic and or intermodulation distortion via measuring or displaying the amplitude level from one or more output terminals of the bandpass filters to provide a time varying harmonic and or intermodulation distortion measurement of the audio device. Or any of the harmonic and or intermodulation distortion signals may be coupled to any of: a phase demodulator, phase detector, frequency demodulator, and or the like, to measure for phase modulation, time varying phase, differential phase, time varying frequency, and or frequency modulation from any of the harmonic and or intermodulation distortion signals (e.g., from the output of a DUT, device under test). It should be noted that: Any of the harmonic and or intermodulation distortion signals may be coupled to an amplitude modulation (AM) signal demodulator or detector to measure for differential gain or time varying amplitude from any of the harmonic and or intermodulation distortion signals (e.g., from the output of a DUT, device under test). Or any of the harmonic and or intermodulation distortion signals may be coupled to an amplitude detector for measuring differential gain or time varying amplitude from any of the harmonic and or intermodulation distortion signals (e.g., from the output of a DUT, device under test).

One or more outputs from the filter bank (e.g., filters) or filters is coupled to a display or measurement device to show the relative level or amplitude of at least one distortion signal or distortion product (e.g., any Nth order intermodulation distortion product or any Nth order harmonic distortion product and or wherein N is a whole number) from the device or DUT (e.g., via a device's or DUT's output terminal).

One or more outputs from the filter bank (e.g., filters) is coupled to a phase and or frequency demodulator/detector to measure for differential phase, phase modulation, and or frequency modulation distortion from one or more distortion signal(s) or distortion product(s) from the DUT or device (e.g., via a device's or DUT's output terminal). A distortion product may include for example any Nth order intermodulation distortion product or any Nth order harmonic distortion product.

For testing dynamic harmonic distortion, a test signal may include a low frequency signal (e.g., arbitrary signal) combined with one or more sine wave signals (e.g., including having a higher frequency than the lower frequency signal). This test signal is coupled to an input of a DUT (Device Under Test), and an output of the DUT is coupled to a filter bank or a short time Fourier Transform. A filter bank outputs at least one signal that is indicative of a distortion product or distortion signal. For example, the distortion signal may include a harmonic distortion signal. This distortion signal from the filter bank may be time varying in amplitude, phase, and or frequency. The distortion signal from the filter bank is coupled to an amplitude, phase modulation, and or frequency modulation measurement device (e.g., amplitude detector/demodulator, phase detector/demodulator, and or frequency detector/demodulator). The measurement device will provide a time varying signal indicative of time varying amplitude, phase, and or frequency of the distortion signal. A short time Fourier Transform provides measurement of (e.g., time varying) amplitude, phase modulation, and or frequency modulation of the distortion signal.

For testing dynamic intermodulation distortion, a test signal may include a low frequency signal (e.g., arbitrary signal) combined with two or more signals (e.g., including having a higher frequency than the lower frequency signal). This test signal is coupled to an input of a DUT (Device Under Test), and an output of the DUT is coupled to a filter bank or a short time Fourier Transform. Filter bank outputs at least one signal that is indicative of a distortion product or distortion signal. For example the distortion signal may include an intermodulation (or harmonic) distortion signal. This distortion signal from the filter bank may be time varying in amplitude, phase, and or frequency. The distortion signal from the filter bank is coupled to an amplitude, phase modulation, and or frequency modulation measurement device (e.g., amplitude detector/demodulator, phase detector/demodulator, and or frequency modulation detector/demodulator). The measurement device will provide a time varying signal indicative of time varying amplitude, phase, and or frequency of the distortion signal. A short time Fourier Transform provides measurement of (e.g., time varying) amplitude, phase modulation, and or frequency modulation of the distortion signal. A limiter function or limiting circuit may precede the phase demodulator, frequency modulation demodulator, and or spectrum analysis or (e.g., short time) Fourier Transform. For example, the output of one of the filter banks is coupled to the input of a limiter circuit and the output of the limiter circuit is coupled to the phase demodulator, frequency modulation demodulator, and or spectrum analyzer or (e.g., short time) Fourier Transform to measure for phase modulation and or frequency modulation effects of a distortion signal (e.g., a harmonic and or intermodulation distortion signal(s)).

Other unexpected results in measuring for phase and frequency modulation distortions include:

1) Differential phase in some amplifiers increase when the low frequency signal is increased in frequency. In many cases increasing the amplitude gives an increase in differential phase distortion. However in some cases increasing the frequency of the low frequency signal increases the amount of differential phase or phase modulation and or the amount of frequency modulation (e.g., frequency shift). Furthermore, in some cases the frequency the signal from the phase and or frequency demodulator is twice the frequency of the low frequency signal. For example, for the signal seen in FIG. 7A with a low frequency signal whose frequency is FL is combined with a higher frequency signal whose frequency is FH, by increasing FL (e.g., FL→K× FL=FL', where K>1), the measured differential phase increased and or the measured differential phase waveform included a frequency that comprise a fundamental frequency (e.g., FL) and or a multiple frequency of FL (e.g., N×FL, where N=1 and or N>=2) of FL, for example 2×FL (or for example, 2×FL'). Some amplifiers having a differential pair amplifier in the input stage exhibited this twice frequency (e.g., 2×FL) waveform from the phase or FM detector. By having the differential phase distortion dependent on the lower frequency test signal (e.g., FL), this resulted in some cases in an accelerated increase in FM distortion (e.g., when the lower frequency signal with for example, frequency FL, is increased). Normally the FM distortion rises linearly with the linear increase in frequency of the lower frequency signal (e.g., when the amplitude of the low frequency signal is essentially or substantially constant in amplitude). However, when the amplitude or amount of differential phase also increases with frequency, the frequency modulation (e.g., frequency shift of the higher frequency signal whose frequency is FH) distortion rises more rapidly (e.g., beyond rising in a linear relationship). The doubling in frequency distortion can be reduced by linearizing further the input stage of the amplifier by changing device from bipolar to field effect transistors or vacuum tubes, or by adding (e.g., local) feedback in the input stage (e.g., adding diodes and or resistors in series with the emitters of the differential pair input stage).

2) In the TIM test for phase and frequency modulation distortion, the phase modulation and frequency modulation distortion was more substantial when compared to AM distortion. For example, the sidebands around fundamental frequency and harmonics of the squarewave signal (e.g., 3 kHz or 3.18 kHz) are primarily due to phase or frequency modulation (e.g., via a smaller amplitude higher frequency signal at typically >3 kHz or 3.18 kHz added to the pulse waveform or squarewave signal). For example, if a band pass filter is place at the fundamental frequency (or a harmonic frequency of the fundamental frequency) of the pulse or squarewave signal (e.g., 3 kHz or 6 kHz or N×3 kHz, where N is a whole number) after the DUT, the resulting signal in some cases will show very little amplitude modulation or variation, but will instead show quite measurable phase and or frequency shift or modulation. One or more amplifiers that did exhibit phase and or frequency modulation distortion included a sinusoidal phase and or frequency modulation (e.g., with a TIM test signal). One or more amplifiers that did exhibit phase and or frequency modulation distortion included a sinusoidal phase and or frequency modulation (e.g., with a TIM test signal) whose frequency was typically less than 3 kHz.

3) Cross-modulation with phase modulation occurs a two (or more) signals are coupled to a device or DUT (e.g., amplifier or audio device or audio amplifier) wherein at least one of the signals (e.g., at least one of the signals is an audio signal or signal that fall within an audio bandwidth) includes modulation (e.g., AM, FM, phase modulation, PAM (pulse amplitude modulation), PSK (Phase Shift Keying), FSK (Frequency Shift Keying). In at least one instance the cross-modulation distortion induced from another signal may include more phase and or frequency modulation than amplitude modulation. And in another instance the cross-modulation distortion induced from another signal may include more amplitude modulation than phase and or frequency modulation. If there are relative phase shifts between the frequencies of the two or more signals coupled to the device or DUT, the cross-modulation distortion (e.g., cross-modulation distortion signal or product) may include substantially more phase and or frequency modulation than amplitude modulation. For example, a modulated signal (e.g., including amplitude modulation) with a carrier frequency f2, and another signal with frequency, f1, is coupled to an input of the device or DUT. If there the relative phase shift through the device or DUT (e.g., comparing the input and output phase of signals at f1 and f2) is approximately 90 degrees between the signals with frequencies f1 and f2, at the output of the DUT or device may include a modulated signal whose frequency is f1 that includes substantially phase and or frequency modulation distortion compared to amplitude modulation distortion. One example may include where f1<f2, and or yet another example includes where f1>f2.

4) A higher carrier frequency AM signal combined with a lower frequency signal into a device can produce phase and or frequency modulation effects on the lower frequency signal. If the frequency of the modulation signal for the AM signal is $F_{mod}$, for some devices such as amplifiers, the resulting phase and or frequency modulation on the lower frequency signal will have a frequency that includes twice the modulation frequency or $2 \times F_{mod}$. In some cases the $2 \times F_{mod}$ phase or frequency modulating signal for the lower frequency signal is large in amplitude than the fundamental frequency signal (e.g., that also phase and or frequency modulates the lower frequency signal.)

One embodiment includes as an example a method or apparatus for measuring a time varying or dynamic harmonic and or intermodulation distortion from an audio device, wherein the audio device has an input and an output, comprising providing a first signal comprising an arbitrary waveform and a second signal comprising at least one signal whose frequency is higher than the frequency of the first signal to an input of the audio device; coupling the output of the audio device to an input of one or more bandpass filters, wherein the one or more bandpass filter provides a filter bank, and wherein the one or more bandpass filters includes at least one output terminal; measuring the harmonic and or intermodulation distortion via measuring or displaying the amplitude level from one or more output terminals of the bandpass filters to provide a time varying harmonic and or intermodulation distortion measurement of the audio device.

As another example, at least one signal of the harmonic and or intermodulation distortion is further coupled to a phase demodulator and or frequency modulation detector to measure phase modulation, differential phase, and or frequency modulation in the harmonic and or intermodulation distortion signal.

As yet another example, at least one signal of the harmonic and or intermodulation distortion is further coupled to a Fourier Transform or short time Fourier Transform to measure for phase modulation, differential phase, and or frequency modulation in the harmonic and or intermodulation distortion signal.

Another example would include wherein the Fourier Transform or short time Fourier Transform includes any combination of a Fast Fourier Transform, Discrete Fourier Transform, continuous time Fourier Transform, and or Discrete Time Fourier Transform.

Note for example that at least at least one signal associated with the harmonic and or intermodulation distortion is coupled to a spectrum analyzer for spectrum analysis for measuring phase modulation, differential phase, and or frequency modulation in the at least one signal associated with the harmonic and or intermodulation distortion. It should be noted that for example, the first signal includes any combination a pulse waveform, stairstep waveform, a ramp waveform, a sinusoidal waveform, and or a modulated waveform and or that the second waveform includes one or more sinusoidal waveforms.

As a another example, at least at least one signal associated with the harmonic and or intermodulation distortion is coupled to a spectrum analyzer for spectrum analysis for measuring phase modulation, differential phase, and or frequency modulation in the at least one signal associated with the harmonic and or intermodulation distortion. As another example, the first signal includes any combination of a pulse waveform, stairstep waveform, a ramp waveform, a sinusoidal waveform, and or a modulated waveform. It should be noted that as another example, the second waveform includes one or more sinusoidal waveforms. Yet another example would include that the second waveform comprises one or more arbitrary waveforms.

Figure 29:
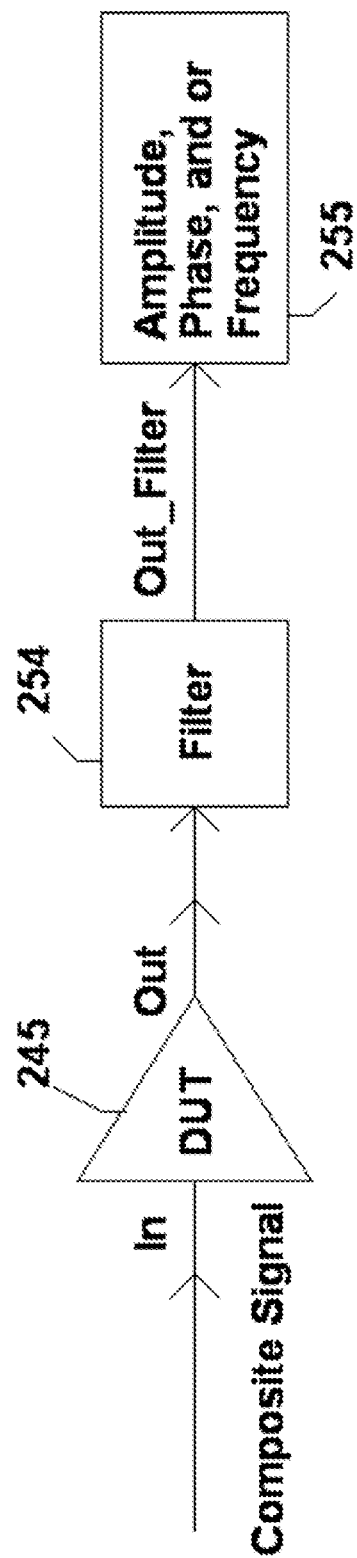
FIG. 29 shows an example of measuring time varying distortion as a function of time and or a function of input or output voltage, power, or current.

FIG. 29 shows another example of measuring for time varying distortion. A composite signal of two or more signals (e.g., a composite signal may be provided from the output of 244 in FIG. 24 along with signal generators summed or combined into inputs of 244) is coupled to an input of DUT 245. The output of the DUT is coupled to block 254, which is labeled as an example of a filter. Block 254 may include a filter and or a modifier such as described in FIGS. 4A, 4B, 4C, 4D, 4E, 4F, and or 18A. For example, block 254 may include any combination of FIGS. 4A (e.g., band pass filter(s)), 4B (e.g., high pass filter(s), 4C (e.g., low pass filter(s)), 4D (e.g., band reject filter(s)), 4E (e.g., filter), 4F (e.g., nulling and or replacing circuit), 18A (e.g., modulator), comb filter, and or one or more modifier(s).

Block 254 may include a band reject or notch filter and or other types of filters such as band-pass, low pass, high pass, and or comb (e.g., filter). The output of block 254 is coupled to an input of block 255. Block 255 may include an amplitude measuring apparatus and or block 255 may include a phase and or frequency demodulator or detector.

One example of FIG. 29 is to couple two or more signals to the input of the DUT 245. The output of the DUT is coupled to two or more notch filters. For example the notch filters are tuned to the fundamental frequencies of the two or more input signals. The output of block 254 passes the harmonic and or intermodulation distortion signals to a display or signal amplitude measurement device (e.g., block 255) that for example presents or provides the amplitude of time varying harmonic and or intermodulation distortion(s).

Block 254 may include a one or more band reject filters and or one or more band band-pass, low pass, and or high pass filters. For example, a combination of band reject filter(s) with other filters as described in this paragraph allows block 255 to display time varying partial or total harmonic distortion, and or time varying partial or total intermodulation distortion. In one example, the composite signal into the DUT has two signals with frequencies F1 and F2. The output of the DUT is fed to filter with band reject or band attenuation at F1 and or F2. If block 254 includes a modifier that attenuates signals at or around the frequencies F1 and F2, the output of block 254 will provide for block 255 an apparatus or method to measure time varying harmonic and or intermodulation distortion.

It should be noted that a DUT may include an audio device. An audio device may include an amplifier, recording device, or an analog and or digital audio device. Analog and or digital compression may be included in a DUT. For example, a DUT may include digital signal processing such as MP3 compression or other forms of audio compression (e.g., reducing data or data rate).

Any of the apparatuses, waveform, and or methods described in terms of dynamic distortion testing such as FIG. 24, FIG. 25, FIG. 26, FIG. 27, FIG. 28, and or FIG. 29 may be used to test for other types of dynamic distortion(s) such as dynamic cross modulation distortion and or dynamic triple beat or N beat distortion (e.g., for audio devices or audio bandwidth devices, or electronic devices), where N>=2. As an example for measuring for time varying cross modulation distortion three signals may be used, a low frequency signal (e.g., any combination of at least one stairstep, pulse, arbitrary, sinewave, triangle wave, and or ramp signal), a modulated signal, and a (e.g., continuous or an arbitrary) signal. A modulated signal may include any combination of amplitude, phase, frequency, and or pulse code modulation.

Dynamic or time varying distortion, which may include any of time varying varying harmonic, intermodulation, cross modulation, and or N-beat distortion testing, can be applied to devices that include thermal effects such as a thermal gradient in integrated circuits or a output biasing devices in an amplifier.

For example, a stairstep signal may include not only substantial equal interval for each step, but each step may be assigned a particular duration such that at least two steps or durations are not the same. In this example, the stairstep signal may spend or or less time at a particular offset voltage to allow the thermal effects of an electronic device to reveal time varying distortion or dynamic distortion.

Dynamic or time varying distortion includes measuring for different values of distortions as a function of time and or input or output voltage. In one example, certain circuit topologies such as complementary symmetry, quasi-complementary symmetry, balanced, differential or push-pull circuits generally produce in theory no even order distortion when tested with standard distortion measurement methods. Dynamic or time varying distortion methods or apparatuses as described such as in FIG. 24, FIG. 25, FIG. 26, FIG. 27, FIG. 28, and or FIG. 29, allows showing such balanced, differential, or push pull circuits to produce even order distortion, or even and odd order distortion. In another example if negative feedback is applied to a balanced, differential or push pull circuit (e.g., amplifier), lowered or reduced (e.g., time varying or offset voltage dependent) even order distortion may be provided via negative feedback, but the negative feedback may cause a rise or increase in higher order dynamic or time varying distortion (e.g., higher order time varying or offset voltage dependent harmonic, intermodulation, cross modulation, and or N-beat distortion) or the negative feedback may cause a rise or increase in (e.g., time varying or voltage dependent) re-entrant distortion. The lowering of type one distortion (e.g., second order distortion or Nth order distortion) and the increase in higher order distortion is sometimes named, re-entrant distortion.

Another embodiment may include at least one band pass filter to measure time varying distortion. For example, a (e.g., single) band pass filter as shown in FIG. 24 or FIG. 25 may be used to measure timing varying harmonic, cross modulation, N-Beat, triple beat, and or intermodulation distortion. For example if the band pass filter is set to reject or to attenuate the signals from the (e.g., output of the) DUT of the fundamental frequencies of signals from the test generators (e.g., blocks 241, 242, and or 243) the output of the band pass filter may be coupled to measuring device to provide the measurement of time varying distortion.

Other types of test signals or waveforms may be used for determining any dynamic or time varying distortion (e.g., (but not limited to) of audio devices or of audio bandwidth devices), and or used for determining phase modulation and or frequency modulation effects of a device (e.g., DUT). One embodiment of a test signal can be characterized as: TestSignal(t)=$k_1$ [$k_2$ m(t)+$k_3$]$f_1$(t)+$k_4$ m(t), where $k_1$, $k_2$, $k_3$, and $k_4$ are constants, m(t) is a modulating signal, and $f_1$(t) is a carrier signal. Or alternatively another embodiment of a test signal can be characterized as: TestSignal'(t)=$k_1$ [$k_2$m(t+(t))+$k_3$]$f_1$(t+$\varphi_2$(t))+$k_4$ m(t+$\varphi_3$(t)), where $k_1$, $k_2$, $k_3$, and $k_4$ are constants or time varying, m(t) is a modulating signal, and $f_1$(t) is a carrier signal, and where $\varphi_1$(t), $\varphi_2$(t), and $\varphi_3$(t) denote a phase shift or time varying phase shift.

For example if $k_1$=1, $k_2$=1, $k_3$=1, and $k_4$=1, and m(t) is a sinewave signal and $f_1$(t) is a higher frequency sinewave signal (e.g., when compared to m(t)), a composite signal such as FIG. 30 is provided. Note that other values of $k_1$, $k_2$, $k_3$, and $k_4$ can be used, and or other types of waveforms, phases, amplitudes, and or frequencies can be used for m(t)

and or $f_1(t)$. FIGS. 31 and 32 show other values of $k_1$, $k_2$, $k_3$, and or $k_4$. The test signals shown in FIGS. 30, 31, and or 32 may be periodic or non-periodic. For example, a sine squared pulse or Gaussian pulse or bell shaped curve waveform may be used as a modulating signal and or a carrier signal. A modulating signal can be used as a test signal that includes any combination of amplitude, phase, and or frequency modulation.

In another example, the composite signal includes a pulsed waveform and higher frequency signal (e.g., a signal or tone with a frequency of F2). The pulse waveform may include a two or more level stepped signal. For example the stepped signal may include a binary signal or a multilevel signal. A multilevel signal may include a stairstep signal or an arbitrary signal. This composite signal is coupled to the DUT and an output of the DUT is coupled to an input of a modifier (e.g., block 254). The modifier attenuates or substantially removes the stepped signal (e.g., such as a stairstep signal) and the modifier attenuates or substantially remove the signals around frequency F2. The output of the modifier then is fed to a block 255 that measures at least the amplitudes of harmonic and or intermodulation distortion products or signals as a function of the DUT output voltage and or as a function of time. As an example, the modifier may include a high pass filter (e.g., to attenuate the stepped signal) and a notch filter (e.g., to attenuate the fundamental frequency of the higher frequency signal). Block 255 may include a display device such as an oscilloscope or equivalent device to show time varying harmonic and or intermodulation distortion. Alternatively, the output of block 254 may be sampled to provide amplitude information of distortion as function of time or output voltage of the DUT.

In another example, two, or three or more signals are coupled to an input of the DUT. The output of the DUT is fed to an input of a modifier and the modifier's output removes via filtering such as high pass filtering and or notch or band reject filtering to allow for measuring time varying amplitude of one or more or partial or total of harmonic and or intermodulation distortion.

For example, the output of block 254 allows for the (e.g., time varying) measurement of one or more harmonic distortion signals. The one or more harmonic distortion signals measured may be of a particular harmonic or combination of harmonics. Alternatively, the (e.g., time varying) measurement of harmonic distortion may include substantially total harmonic distortion (e.g., harmonic distortion measured as a function of time or distortion measured as a function of output signal level from the DUT).

In another example, the output of block 254 allows for the (e.g., time varying) measurement of one or more intermodulation distortion signal(s). The one or more intermodulation distortion signals measured may be of a particular intermodulation distortion product or signal (e.g., second order or Nth order intermodulation) or combination of intermodulation distortion signals or products. Alternatively, the (e.g., time varying) measurement of intermodulation distortion may include substantially total intermodulation distortion (e.g., intermodulation distortion measured as a function of time or distortion measured as a function of output signal level from the DUT).

An example embodiment includes (e.g., but not limited to) one or more signal generators or signals (e.g., block 241, 242, and or 243, or a composite signal) coupled to an input of a DUT have one or more frequencies within an audio bandwidth and or beyond an audio bandwidth. For example, the DUT receives signals whose frequency or frequencies of less than (or equal to or greater than) about 20 kHz and or 1 MHz. Of course other frequencies may be used.

Another example embodiment includes at least one signal source or generator (e.g., signal source or generator coupled to an input of a DUT) induces time varying or voltage offset distortion (e.g., time varying distortion or distortion as a function of input or output voltage). For example, a lower frequency signal induces or provides time varying distortion for at least one higher frequency signal (e.g., from an output of the DUT). For example, in FIG. 24, block 241, which can include a lower frequency source or signal, is utilized to provide or induce time varying or offset signal dependent distortion(s) related to higher frequency signals such as block 242 and or 243.

Another example embodiment would include a system for measuring phase modulation or frequency modulation effects of a cross-modulation distortion product or signal from an output of a device (e.g., audio device) comprising: combining a first and second signal (e.g., wherein at least one of the signals includes an audio bandwidth signal) to an input of the (e.g., audio) device, wherein the first and or second signal includes at least one modulated signal; further comprising coupling an output signal from the (e.g., audio) device to an input of a filter, coupling an output of the filter to a phase detector and or frequency modulation detector to measure for phase and or frequency modulation distortion of a cross-modulation distortion product or signal, wherein the output of the filter includes a cross-modulation distortion signal. For example, the first and or second signal includes an amplitude modulated signal, or for example, the amplitude modulated signal includes the multiplication of a modulating signal and carrier signal. In terms of amplitude modulation, for example, the amplitude modulated signal includes a carrier signal and or a modulated signal. As another example (e.g., related to cross-modulation and or to audio frequencies), the first and or second signal includes a signal of any combination of amplitude modulation, double sideband suppressed carrier amplitude modulation, single sideband amplitude modulation, frequency modulation, phase modulation, pulse code modulation, pulse amplitude modulation, pulse position modulation, and or pulse width modulation.

One embodiment may include a test for cross-modulation or intermodulation distortion(s) that include a high frequency signal that may be modulated plus at least one lower frequency signal, or two or more higher frequency signals and at least one lower frequency signal. The lower frequency signal(s) may be measured for amplitude modulation distortion or phase modulation distortion, and or frequency modulation distortion.

One example of an embodiment includes an amplitude modulated signal with a carrier frequency, $f_c$, that is higher that a lower frequency signal of frequency $f_a$. The amplitude modulated signal is modulated at a low frequency, $f_{mod}$. The amplitude modulated signal including the lower frequency signal is coupled to an input terminal of a device under test (e.g., DUT). An output terminal of the device under test is measured for cross-modulation or intermodulation distortion on the lower frequency signal (e.g., lower frequency signal whose frequency is $f_a$). For example, for the cross-modulation test, any combination of amplitude modulation, phase modulation, and or frequency modulation effect(s) of the cross-modulation distortion signal is measured. In another example, the modulation frequency of the amplitude modulated signal is lowered in frequency such that if the DUT's output signal at frequency $f_a$ has sidebands that provides cross-modulation distortion, the frequency or phase modulation effect on the cross-modulation distortion signal may be more noticeable (e.g., by hearing) than the amplitude modulation effect on the cross-modulation distortion. For example, if the AM modulating frequency, $f_{mod}$, is less than 100 Hz (e.g., between 1 Hz and 25 Hz, but other frequencies can be used for $f_{mod}$), the frequency modulation (or phase modulation) effect of the cross-modulation distortion signal will have a noticeable pitch variation (e.g., as heard from a human) on the frequency $f_a$, while the amplitude variation of the cross-modulation distortion signal will have a less noticeable (e.g., hearing) effect. Note that frequency or frequencies, $f_{mod}$ and or $f_c$ may be time varying or time invariant (e.g., as part of an embodiment).

Alternatively another embodiment may include two or more higher frequency signals (e.g., whose frequencies are $f_b$, $f_d$, and or $f_e$ or more frequencies) and a lower frequency signal whose frequency is $f_a$. The two or more higher frequency signals (e.g., whose frequencies are $f_b$, $f_d$, and or $f_e$ or more frequencies) and the lower frequency signal whose frequency is $f_a$ are coupled to an input of a DUT. An output of the DUT is measured for cross-modulation distortion signal or intermodulation distortion signal around frequency, $f_a$. Amplitude modulation effect(s), phase modulation effect(s), and or frequency modulation effect(s) may be measured for the cross-modulation distortion signal (e.g., pertaining to frequency $f_a$) and or for the intermodulation distortion signal (e.g., pertaining to frequency, $f_a$). For example, sideband(s) whose frequency or frequencies around $f_a$ may include any combination of: $f_a$ plus and or minus $n \times |f_b - f_d|$, where n is an integer. One or more of these sidebands (e.g., whose frequency or frequencies being $f_a$ plus and or minus $n \times |f_b - f_d|$) may be any combination of amplitude modulation and or frequency modulation sideband(s). In one embodiment frequencies $f_b$ and $f_d$ are close such that for example, $|f_b - f_d| < 2$ kHz, but other frequencies than 2 kHz may be used. For example, if $|f_b - f_d|$ is less than 30 Hz (or some other frequency, which is not limited to 30 Hz), the cross-modulation distortion signal around frequency $f_a$ may allow for the ear to hear the frequency or phase "wobble" of $f_a$ more than the amplitude variation effect (e.g., amplitude modulation) of the signal whose frequency is at or around $f_a$. Also another embodiment may include that the (e.g., frequency) spacing between $f_b$, $f_d$, and or $f_a$ may be time invariant or time varying. Any frequency $f_a$, $f_b$, and or $f_d$ may be time varying or time invariant. For example, as previously mentioned, one or more test signals may include amplitude, phase, and or frequency modulation, which may be included here.

An example is presented with frequencies as follows (e.g., these frequencies can be other frequencies) $f_a=3$ kHz, $f_b=19.000$ kHz, and $f_d=19.019$ kHz. Again these frequencies are presented as example frequencies only, and other frequencies may be used. In this example, $|f_b - f_d| = 19$ Hz. If an amplitude or DUT's input is coupled to a test signal comprising a 3 kHz signal, a 19 kHz signal, and a 19.019 kHz signal, the output of the DUT may include a cross-modulation distortion signal around 3 kHz and or an intermodulation distortion signal around $|f_b - f_d| = 19$ Hz. Because the 19 Hz intermodulation distortion signal is at such a low frequency, it will be less likely heard than the cross-modulation distortion signal at around 3 kHz. If the cross-modulation distortion signal has amplitude modulation at around 19 Hz (or its harmonics), it (e.g., amplitude modulation effect on 3 kHz signal) is also less likely to be noticed by hearing compared to the cross-modulation distortion signal with phase and or frequency modulation at a 19 Hz (or its harmonics) rate of the 3 kHz signal. That is the phase or pitch variation at 3 kHz is more discernable than amplitude variations of the 3 kHz cross-modulation distortion signal. Again, the frequencies (e.g., 3 kHZ, 19.000 kHz, and 19.019 kHz) mentioned are examples only, other frequencies may be used.

For negative feedback amplifier whose transfer function is characterized as:

$$\frac{Vout(j\omega)}{Vin(j\omega)} = \frac{H(j\omega)}{[1 + F(j\omega)H(j\omega)]},$$

where for example
$H(j\omega)$=open loop transfer function including its DC (direct current) gain
$F(j\omega)$=feedback factor such as a resistive voltage divider circuit or an equalization feedback network (e.g., NAB or RIAA).

If the phase response of the demominator, $[1+F(j\omega)(H(j\omega)]$ approaches 90 degrees (e.g., for at least one of the test frequency at the input, Vin), then the feedback amplifier (e.g., with nonlinearities) will have a cross-modulation distortion effect wherein the amplitude modulation effect is lessened, while the phase and or frequency modulation effect dominates. If the phase response of $[1+F(j\omega))(H(j\omega))]$ approaches 0 degrees, then the cross-modulation distortion signal will exhibit mostly amplitude modulation effects. If the phase response of $[1+F(j\omega)(H(j\omega)]$ is between 0 degrees and 90 degrees, then the cross-modulation distortion will have some or any combination of amplitude modulation and or phase or frequency modulation effect(s).

Input or test signals for testing or measuring for cross-modulation distortion (e.g., which may have or include amplitude modulation effect, phase modulation effect and or phase or frequency modulation effect), can be characterized or included as:

Vin=$[1+m_1 \cos(\omega_m t)]\cos(\omega_c t)+\cos(\omega_a t)$, an amplitude modulation signal where $m_1$, a modulation index may include 0 or a real number.

In terms of the cross-modulation distortion signal for an amplitude modulation signal, an output of the amplifier or DUT may be characterized as:

Vout=$[1+m_2 \cdot \cos(\omega_m t)]\cos(\omega_a t+\varphi(t))=CM_{FM\_AM}$=Cross-Modulation (e.g., distortion) signal with frequency and or phase and or amplitude modulation effect(s).

For $\varphi(t)$ that represents phase modulation, the derivative of it over time, or d $\varphi(t)/dt \rightarrow$ or yields a frequency deviation or FM (e.g., frequency modulation).

Alternatively another test signal, a multiple tone input signal may be characterized or included as:

$Vin = K_1 \cos(\omega_b t) + K_2 \cos(\omega_d t) + K_3 \cos(\omega_a t)$

In terms of the cross-modulation distortion signal for a multiple tone or multiple signal coupled to an input of an amplifier or DUT, an output of the amplifier or DUT may be characterized as:

Vout=$[1+m_3 \cdot \cos(\omega_m t)]\cos(\omega_a t+\varphi(t))=CM_{FM\_AM}$=Cross-Modulation (e.g., distortion) signal with frequency and or phase and or amplitude modulation effect(s).

The modulating frequency am may be characterized as $|\omega_b - \omega_d|$, (e.g., or a difference of $\omega_b$ and $\omega_d$).

For $\varphi(t)$ that represents phase modulation, the derivative of it over time, or d $\varphi(t)/dt \rightarrow$ or yields a frequency deviation or FM (e.g., frequency modulation).

In practice, the resulting modulating signal, $m_2 \cdot \cos(\omega_m t)$ in the example including an amplitude modulated input signal, or $m_{3'} \cos(\omega_m t)$ in the example including a multiple signal or tone input signal, may be limiting because the output signal in either or both cases may include a complex waveform of the modulating signal pertaining to the cross-modulation distortion signal. For example, this complex waveform for the modulating signal can be characterized or included as:

$$V_{out} = [1 + m(t)] \cos(\omega_a t + \varphi(t))$$

Where $m(t) = \Sigma\ a_n \cos(n\ \omega_m t + \Phi_n)$
and $\varphi(t) = \Sigma\ \varphi_n \cos(n\ \omega_m t + \theta_n)$
For n=0, 1, 2, 3, . . . .
Where $\omega_m$=the modulating frequency (e.g., in radians per second) of an amplitude modulation (e.g., input) signal or $\omega_m = |\omega_b - \omega_d|$.

The cross-modulation distortion signal from the DUT or amplifier may be coupled to any combination of an amplitude modulation demodulator, a phase modulation demodulator, and or a frequency modulation demodulator. Note a detector may be a demodulator. Any output of the demodulator(s) or detector(s) may be compared to each other in terms of (e.g., time domain) waveform and or frequency spectrum such as an FFT or FT (e.g., Fast Fourier Transform or Fourier Transform) or spectrum analyzer.

Measuring for cross-modulation distortion may include a lower frequency sinusoidal or non-sinusoidal wave plus at least one higher frequency signal(s). For example, if the non sinusoidal signal has a fundamental frequency and or at least one harmonic frequency, the cross-modulation distortion signal is measured at the fundamental frequency and or at one or more of the (e.g., associated) harmonic frequency. Measurement(s) may include amplitude modulation, phase modulation, and or frequency modulation effect(s) of the cross-modulation distortion signal. Should the DUT or amplifier include a negative feedback element such that a transfer function is characterized as:

$$\frac{V_{out}(j\omega)}{V_{in}(j\omega)} = \frac{H(j\omega)}{[1 + F(j\omega)H(j\omega)]}$$

$H(j\omega)$=open loop transfer function including ifs DC (direct current) gain
$F(j\omega)$=feedback factor such as a resistive voltage divider circuit or an equalization feedback network (e.g., NAB or RIAA).

If the phase response of the demominator, $[1+F(j\omega)(H(j\omega)]$ or open loop transfer function approaches 90 degrees (e.g., for at least one of the test frequency at the input, Vin), then the feedback amplifier (e.g., with nonlinearities) will have a cross-modulation distortion effect wherein the amplitude modulation effect is lessened, while the phase and or frequency modulation effect dominates. If the phase response of $[1+F(j\omega)(H(j\omega)]$ or open loop transfer function approaches 0 degrees, then the cross-modulation distortion signal will exhibit mostly amplitude modulation effects. If the phase response of $[1+F(j\omega)(H(j\omega)]$ or open loop transfer function is between 0 degrees and 90 degrees, then the cross-modulation distortion will have some or any combination of amplitude modulation and or phase or frequency modulation effect(s).

For example, a non sinusoidal waveform or signal can include a pulse signal (e.g., at 3.18 kHz frequency or other frequency) and a higher frequency signal can include a 15 kHz signal or other frequency signal. This example test signal (e.g., pulse signal and higher frequency signal) is coupled to an amplifier or DUT input terminal, and an output of the amplifier or DUT is measured for amplitude modulation, phase modulation, and or frequency of a cross-modulation distortion signal of the fundamental frequency and or harmonic(s) of the non sinusoidal waveform. For example the cross-modulation distortion signal(s) is measured at 3.18 kHz (or other frequency) and or at n×3.18 kHz (or other frequency), where n is an integer. Depending on the phase response of the open loop gain or $[1+F(j\omega)(H(j\omega)]$, the cross-modulation distortion signal(s) will have a combination of amplitude modulation, phase modulation, and or frequency modulation effect(s).

Another embodiment may include program material such as music and or voice combined with a one or more test signals (e.g., at above 3 kHz) to form a composite test signal. The one or test signals may include modulated signal(s) and or un-modulated signal(s). The composite test signal is coupled to an input of an amplifier or DUT. An output of the amplifier or DUT is coupled to a transducer (e.g., via a speaker or headphone amplifier) for listening to the program material. A filter (e.g., between the amplifier or DUT and the transducer) may be used to attenuate or remove the one or more test signals. For example program material including music and or voice may be band limited or not band limited is combined with an amplitude modulated signal (e.g., at >10 kHz or other frequency) and or multiple signals (e.g., whose frequencies >10 kHz or other frequency) form a composite signal that is coupled to an input of an amplifier or DUT. The output of the amplifier is coupled to a transducer for listening tests. If the amplifier has distortion, the one or more test signals may induce amplitude modulation, phase modulation, and or frequency modulation effect(s) on the program material. For example if the program material includes music, the one or more test signals can induce frequency variation or frequency shifts to at least part of the music. For example the phase and or frequency shift can cause the music to sound "sour" or off key, or sound as if there is "Wow and or Flutter" in the music.

For instance a composite signal includes music and or voice combined with an amplitude modulated signal whose carrier frequency includes 18 kHz (or another frequency) and or multiple signals that include frequencies at 19.000 kHz and 19.019 kHz (or other frequency or frequencies). The amplitude modulated signal may be modulated at frequency of less than 3 kHz (e.g., 15 Hz or another frequency). This example composite test signal is coupled to an input of an amplifier or DUT. An output of the amplifier or DUT is coupled to a transducer for listening test(s) to observe any amplitude modulation, phase modulation, and or frequency modulation effect(s) on the music and or voice signal(s).

Another embodiment may include adding one or more test signal(s) to a program audio source (e.g., music and or voice) that is coupled to an input of an amplifier or DUT. An output of the amplifier or DUT is coupled to a modifier (e.g., which may be including a filter) to provide a span or band of frequencies for allowing listening (e.g., for amplitude modulation, phase modulation, and or frequency modulation effect(s)) on a portion or portions of the spectrum of the program audio source from the amplifier or DUT. The test signal or signals may include modulated and or un-modulated signal(s) or waveform(s).

When the cross-modulation distortion signal is measured with an amplitude modulation demodulator (e.g., envelope detector or synchronous detector), phase modulation demodulator, and or frequency modulation demodulator, the output of one or more of these demodulators can be measured for spectrum analysis.

For example, it was found in some tests for a cross-modulation distortion signal wherein phase and or frequency modulation effect was present and amplitude modulation effect was diminished (e.g., or when the phase response of the open loop transfer function or of $[1+F(j\omega)(H(j\omega)]$ approached 90 degrees), the spectrum of the output of the phase modulation demodulator and or frequency modulation demodulator showed the fundamental frequency amplitude greater than the second harmonic's amplitude. However, when applying spectrum analysis to the amplitude modulation demodulator, the output showed that one or more harmonics was (e.g., or were) greater in amplitude than the fundamental frequency's amplitude. The input test signal included an amplitude modulated signal or a multiple signal (e.g., multiple tone signal of at least frequencies of $f_b$ and or $f_d$ or other signal(s)), which may or may not be added to lower frequency signal such as a frequency $f_a$.

In another example, it was found in some tests for a cross-modulation distortion signal wherein phase and or frequency modulation effect was not dominant and amplitude modulation effect was more dominant (e.g., or when the phase response of the open loop transfer function or of $[1+F(j\omega)(H(j\omega)]$ approached 0 degrees or less than 45 degrees), the spectrum of the output of the phase modulation demodulator and or frequency modulation demodulator showed the fundamental frequency amplitude less than the one or more harmonic's amplitude. However, when applying spectrum analysis to the amplitude modulation demodulator, the output showed that one or more harmonics was (or were) smaller in amplitude than the fundamental frequency's amplitude. The input test signal included an amplitude modulated signal or a multiple signal (e.g., multiple tone signal of at least frequencies of $f_b$ and or $f_d$ or other signal(s)), which may or may not be added to lower frequency signal such as a frequency $f_a$.

Another embodiment includes measuring sidebands around or near the cross-modulation distortion signal's frequency before and after limiting. The limiting may include a limiter circuit. For a cross-modulation distortion signal with primarily phase modulation and or frequency modulation effect, the sidebands referenced to the center frequency or carrier frequency's amplitude will show little (or no) change in amplitude before and after limiting. For a cross-modulation distortion signal having primarily (or at least some) amplitude modulation effect, the amplitude of the sidebands referenced to the carrier frequency's amplitude before and after limiting will show a noticeable change such as ≥2 dB (e.g., after limiting one or more sidebands is reduced in amplitude (e.g., by ≥2 dB or by some other amount) referenced to the carrier level or carrier's amplitude).

The devices tested for cross-modulation distortion may include audio circuit(s) and or the frequencies involved in testing for cross-modulation distortion may be audio frequencies (e.g., video and radio frequencies may be excluded) such as within but not limited to the range of 1 Hz to 22 kHz.

Providing or combining additional test signal(s) to the audio device (e.g., with other previously mentioned signal(s)) can induce a time varying cross-modulation distortion signal from an output of the audio device. This time vary cross-modulation distortion signal may be measured with an amplitude modulation demodulator, phase modulation demodulator, and or a frequency modulation demodulator.

An embodiment may include an apparatus for measuring a phase modulation or frequency modulation effect of a cross modulation distortion signal from an audio device, wherein the audio device has an input and an output, comprising providing at least two signals comprising at least a first signal, and a second signal comprising an amplitude modulation signal whose carrier frequency is higher than the frequency of the first signal to an input of the audio device and whose amplitude modulating frequency is less than the frequency of the first signal, coupling the output of the audio device to an input of a modifier, and wherein the modifier provides an output terminal measuring the cross modulation distortion signal from the output terminal of the audio device with a phase modulation demodulator or a frequency modulation demodulator, and wherein the cross-modulation distortion signal is related to the first signal. This embodiment may or may not include (but not limited to) any combination of: The first signal includes a tone or a musical note from a musical instrument, and or wherein the output terminal of the audio device is coupled to a transducer for listening to the tone or musical note for phase modulation or frequency modulation effect, and or wherein the amplitude modulating frequency is less than 100 Hz (or some other frequency) to provide increased sensitivity in hearing for the phase modulation effect or frequency modulation effect of the tone or musical note, and or wherein the cross-modulation distortion signal is further coupled to an input of an amplitude modulation demodulator that provides a time domain waveform and or spectrum analysis from an output of the amplitude modulation demodulator, and or wherein the phase modulation demodulator provides for an output signal for time domain analysis or for spectrum analysis, or the frequency modulation demodulator provides for an output signal for time domain analysis or for spectrum analysis.

An embodiment may include an apparatus for measuring a phase modulation or frequency modulation effect of a cross modulation distortion signal from an audio device, wherein the audio device has an input and an output, comprising providing at least two signals comprising at least a first signal, and a second signal comprising two or more signals that are higher than the frequency of the first signal to an input of the audio device, wherein the two or more signals have at least frequencies $f_b$ and $f_d$ where an absolute value of $(f_b-f_d)$ represents a difference frequency, $|f_b-f_d|$, is less (or equal to or greater) than the frequency of the first signal, coupling the output of the audio device to an input of a modifier, and wherein the modifier provides an output terminal, measuring the cross modulation distortion signal from the output terminal of the audio device with a phase modulation demodulator or a frequency modulation demodulator, and wherein the cross-modulation distortion signal is related to the first signal. This embodiment may or may not include (e.g., but not limited to) any combination of: Wherein the first signal includes a tone or a musical note from a musical instrument, and or wherein the output terminal of the audio device is coupled to a transducer for listening to the tone or musical note for phase modulation or frequency modulation effect, and or wherein the difference frequency, $|f_b-f_d|$, is less (or equal to or greater) than 100 Hz to provide increased sensitivity in hearing for the phase modulation effect or frequency modulation effect of the tone or musical note, and or wherein the cross-modulation distortion signal is further coupled to an input of an amplitude modulation demodulator that provides a time domain waveform and or spectrum analysis from an output of the amplitude modulation demodulator, and or wherein the phase modulation demodulator provides for an output signal for time domain analysis or for spectrum analysis, and or the frequency modulation demodulator provides for an output signal for time domain analysis or for spectrum analysis.

An embodiment may include an apparatus for measuring a phase modulation or frequency modulation effect of a cross-modulation distortion signal from an audio device, wherein the audio device has an input and an output, comprising: providing at least two signals comprising at least a first signal that is a non sinusoidal signal, and a second signal whose frequency is higher than the fundamental frequency of the first signal, to an input of the audio device and whose amplitude modulating frequency is less than the frequency of the first signal, coupling the output of the audio device to an input of a modifier, and wherein the modifier provides an output terminal, measuring the cross modulation distortion signal from the output terminal of the audio device with a phase modulation demodulator or a frequency modulation demodulator, and wherein the cross-modulation distortion signal is related to the first signal. The embodiment may or may not include (e.g., but not limited to) wherein the first signal includes a tone or a musical note from a musical instrument, and or wherein the output terminal of the audio device is coupled to a transducer for listening to the tone or musical note for phase modulation or frequency modulation effect, and or wherein the output of the audio device is coupled to an input of an amplitude modulation demodulator wherein an output of the amplitude modulation demodulator provides for time domain analysis or provides for spectrum analysis, and or wherein the first signal includes a pulse whose fundamental frequency is $f_p$ and wherein the second signal has a frequency $f_h$, and or wherein the pulse includes a squarewave comprises odd order harmonics and wherein the phase modulation or frequency modulation effect includes a frequency of $|mf_p-f_h|$, wherein m is an integer (e.g., m=2, or 3, or 4, or 5, or 6, or 7, or ... integer ...), and or wherein the output of the audio device is coupled to a transducer wherein the phase modulation or frequency modulation effect is at a wobbling frequency of $|mf_p-fh|$, wherein the wobbling frequency $|mf_p-fh|$, (e.g., including m=2, or 3, or 4, or 5, or 6, or 7, or ... integer ...) may be less than or equal to 100 Hz or some other frequency. It should be noted that if the device includes negative feedback or includes an open loop phase shift transfer function or phase response of $[1+F(j\omega)(H(j\omega)]$ for a feedback amplifier previously described, cross-modulation effects may be dependent on the open loop phase shift or phase of $[1+F(j\omega)(H(j\omega)]$. For example, should the phase shift or phase response approach 90 degrees for one or more frequencies that pertain to the input signal(s) or test signal(s), the cross-modulation distortion will show diminished amplitude modulation effect(s), while including phase modulation and or frequency modulation effect(s). If the phase response of $[1+F(j\omega)(H(j\omega))]$ or open loop transfer function approaches 0 degrees, then the cross-modulation distortion signal will exhibit mostly amplitude modulation effects. If the phase response of $[1+F(j\omega) (H(j\omega)]$ or open loop transfer function is between 0 degrees and 90 degrees, then the cross-modulation distortion will have some or any combination of amplitude modulation and or phase or frequency modulation effect(s).

A cross-modulation distortion signal from an (e.g., output of an) amplifier or DUT that includes amplitude modulation, phase modulation, and or frequency modulation effect(s) may be a result of any combination of (e.g., memory and or memory-less) nonlinearity, slew induced distortion, slew rate limiting, near slew rate limiting, below slew rate limiting, transient intermodulation distortion, and or stress (e.g., overdrive or below overdrive) on one or more amplifying stages of the (e.g., audio) amplifier or DUT.

The devices tested for cross-modulation distortion may include audio circuit(s), audio transducers; and or wherein the frequencies involved in testing for cross-modulation distortion may be audio frequencies (e.g., video and radio frequencies may be excluded) such as within but not limited to the range of 1 Hz to 22 kHz, other frequencies or frequency ranges may be used. In some other testing, a signal whose frequency exceeds audio range frequencies may be used.

Time varying distortion signal(s) may include time varying phase, amplitude, and or frequency for any one (or any combination) of one or more: cross-modulation distortion signal(s), intermodulation distortion signal(s), harmonic distortion signal(s), N-beat distortion signal(s), and or triple beat distortion signal(s).

In some previous embodiments that pertained to testing for cross-modulation, an AM test signal was combined with a second signal to measure cross-modulation effects on the second signal (e.g., via or from a DUT's output). Another embodiment may include for testing cross-modulation that comprises a phase modulated or frequency modulated signal combined with a second signal, wherein cross-modulation effect(s) is measured via the second signal from a DUT's output. Yet another embodiment may include as the test signal any combination of an amplitude modulation signal, multiple tone signal, phase modulated signal, and or frequency modulated signal combined with a second signal to measure cross modulation effect(s) of the second signal via a DUT's output. It should be noted that amplitude modulation or AM may include single sideband, double sideband suppressed carrier, standard amplitude modulation, and or vestigial sideband. Cross modulation effect(s) may include amplitude modulation, phase modulation, and or frequency modulation.

In another embodiment a test signal can include a frequency or phase modulated signal. For example, a first modulating signal provides a frequency or phase modulated signal is coupled to an input of a device, and the output of the device is coupled to an amplitude demodulator, or detector (e.g., AM detector or envelope detector or amplitude measuring apparatus or method), frequency (e.g., modulation) demodulator and or a phase detector or demodulator. The output of the frequency (e.g., modulation) demodulator and or the phase detector or demodulator is compared or measured with the first modulating signal in terms or amplitude, phase, and or frequency variations or differences. In another embodiment, the amplitude demodulator, or detector (e.g., AM detector or envelope detector or amplitude measuring apparatus or method), frequency (e.g., modulation) demodulator and or a phase detector or demodulator may be coupled to a (e.g., an input of a) filter or filter bank that passes signal or signals of the fundamental frequency of the first modulating signal and or one or more harmonic frequency of the first modulating signal. The output of the filter or filter bank provide or provides amplitude, phase, and or frequency information that is static or time varying related to the first modulating signal. For example, the one or more signal(s) from the filter bank including the fundamental frequency of the first modulating signal and a harmonic (e.g., frequency) of the first modulating signal can be compared for static or time varying amplitude(s) or phase(s) between output signals of the filter bank. Or the first modulating signal (e.g., that provides the modulation) can be compared or measured with any output of the filter or filter bank to provide amplitude, phase, or frequency measurement(s) or comparison(s).

Another embodiment includes cascading one or more filters or filters banks to further provide measurements or examination of waveforms. For example in FIG. 24 a composite signal is coupled to a DUT (e.g., 245), and the DUT's output is coupled to one or more input(s) of a (e.g., first) filter or (e.g., first) filter banks denoted by as example filters 246, 247, and or 248. One or more output(s) of the filters that can include an arbitrary filter or bandpass filter. The one or more outputs of the filters can be further coupled to and input of an amplitude detector or demodulator, a phase detector or demodulator, and or a frequency modulation demodulator. One or more output(s) of the amplitude detector or demodulator, a phase detector or demodulator, and or a frequency modulation demodulator can then be further coupled to an input of one or more of another (e.g., second) filter or (e.g., second) filter bank.

In an embodiment example for an intermodulation testing method or apparatus, two or more signals provide a (e.g., composite) test signal. The two or more signals may include modulated and or unmodulated signal(s). The composite signal is coupled to a DUT (e.g., device under test which can include an electronic, mechanical, and or electromechanical device). The output of the DUT is coupled to a first filter or first modifier to pass a signal indicative of any signal related to the composite signal and or any distortion signal from the DUT (e.g., harmonic, intermodulation, and or cross-modulation distortion signal). One or more distortion signal(s) from the DUT is coupled to an amplitude demodulator (e.g., AM detector or envelope detector, or amplitude measurement apparatus or method), phase detector (e.g., differential phase distortion measurement apparatus or method), and or frequency (e.g., modulation) demodulator or FM detector (or FM demodulator). The output(s) of the amplitude demodulator (e.g., AM detector or envelope detector, or amplitude measurement apparatus or method), phase detector (e.g., differential phase distortion measurement apparatus or method), and or frequency (e.g., modulation) demodulator or FM detector (or FM demodulator) can display or measure amplitude, phase, and or frequency distortion such as amplitude error, phase error (e.g., which may include time varying phase or differential phase distortion or static phase offset), and or frequency error (e.g., which may include frequency shift) of for example signal(s) related to the composite signal and or distortion signal(s) from the DUT (e.g., distortion signal(s) may be related from one or more signals related or included in (e.g., providing) the composite signal. One example can include a composite signal comprised of signals of a frequency of $f_L$ and a frequency $f_H$. The composite signal having at least these two frequencies $f_L$ and $f_H$ is coupled to an input the DUT. The output of the DUT is coupled to an input of a filter or modifier that passes signals around $f_H$ such as signals with frequencies around $f_H +/- N \times f_L$, where N=at least one whole number such as 0, 1, 2, 3, and or n. An output of the filter is then coupled to amplitude measurement apparatus or method such as an AM detector or envelope detector to for example measure a static or time varying effect on the amplitude of the signal whose nominal frequency is $f_H$ from the output of the DUT. In one instance, the amplitude the signal out of the filter will have a type of amplitude modulation, that include sinusoidal or non sinusoid envelope. For example, the lower frequency signal envelope that amplitude modulates a higher frequency signal as illustrated in FIG. 28, lower trace, shows that the envelope includes a "dumbbell" effect on the higher frequency signal. Thus, in this example in FIG. 28, the envelope is AM detected to provide the modulating signal, which is related to for example the low frequency sine wave signal in top trace of FIG. 28. This example then shows that the envelope in FIG. 28 lower trace includes fundamental and or harmonic signals related to the lower frequency signal on the top trace of FIG. 28. An embodiment with further analysis as stated previously includes analyzing the envelope waveform from the AM detector with spectrum analysis. Spectrum analysis can include in combination of filter (e.g., filter for spectrum analysis), filter bank (e.g., filter bank for spectrum analysis), filter banks (e.g., filter banks for spectrum analysis), Fourier Transform, FFT, or the like. For example, if one or more filter or filter banks is used for spectrum analysis, a more "real-time" spectrum analysis in terms of amplitude, phase, and or frequency variation(s) can be measured and or compared with any of the signals related to the input signal (e.g., any signal included in the composite signal that is coupled to the DUT) or any signals from the input and output of the DUT that could include distortion signals, or any signal from the output of the filter or filter banks (e.g., filter or filter banks coupled to an AM, PM, or FM demodulator). For example, one or more outputs from the filter or filter banks for spectrum analysis may be coupled to one or more amplitude, phase, and or frequency (e.g., FM) detector(s) or demodulator(s). One or more outputs from the filter or filter banks for spectrum analysis may be coupled to one or more amplitude, phase, and or frequency (e.g., FM) detector(s) or demodulator(s) to provide information or measurement of amplitude, phase, and or frequency error or modulation effect (e.g., effect compared with a low or high frequency signal, part of the input composite signal, or effect between signals from one or more filter(s) or filter bank(s) used for spectrum analysis).

As another embodiment example, can include a composite signal comprised of signals of a frequency of $f_L$ and a frequency $f_H$. The composite signal having at least these two frequencies $f_L$ and $f_H$ is coupled to an input the DUT. The output of the DUT is coupled to an input of a filter or modifier that passes signals around $f_H$ such as signals with frequencies around $f_H +/- N \times f_L$, where N=at least one whole number such as 0, 1, 2, 3, and or n. An output of the filter is then coupled to phase measurement apparatus or method such as an phase detector or differential detector to for example measure a static or time varying effect on the phase of the signal whose nominal frequency is $f_H$ from the output of the DUT. In one instance, the phase the signal out of the filter will have a type of phase modulation, that include sinusoidal or non sinusoid envelope. For example, the lower frequency signal envelope that amplitude modulates a higher frequency signal as illustrated in FIG. 28, which may include phase and or frequency modulation on the higher frequency signal. This example then shows that the envelope in FIG. 28 lower trace includes fundamental and or harmonic signals related to the lower frequency signal on the top trace of FIG. 28, which may mean that the phase and or frequency modulation on the higher frequency signal in FIG. 28 may or may not include sinusoidal modulation. An embodiment with further analysis as stated previously includes analyzing the output of the phase and or frequency (e.g., FM) detector(s) with spectrum analysis. Spectrum analysis can include in combination of filter (e.g., filter for spectrum analysis), filter bank (e.g., filter bank for spectrum analysis), filter banks (e.g., filter banks for spectrum analysis), Fourier Transform, FFT, or the like. For example, if one or more filter or filter banks is used for spectrum analysis, a more "real-time" spectrum analysis in terms of amplitude, phase, and or frequency variation(s) can be measured and or compared with any of the signals related to the input signal (e.g., any signal included in the composite signal that is coupled to the DUT) or any signals from the input and output of the DUT that could include distortion signals, or any signal from the output of the filter or filter banks (e.g., filter or filter banks coupled to an AM, PM, or FM demodulator). For example, one or more outputs from the filter or filter banks for spectrum analysis may be coupled to one or more amplitude, phase, and or frequency (e.g., FM) detector(s) or demodulator(s). One or more outputs from the filter or filter banks for spectrum analysis may be coupled to one or more amplitude, phase, and or frequency (e.g., FM) detector(s) or demodulator(s) to provide information or measurement of amplitude, phase, and or frequency error or modulation effect (e.g., effect compared with a low or high frequency signal, part of the input composite signal, or effect between signals from one or more filter(s) or filter bank(s) used for spectrum analysis).

Figure 33:
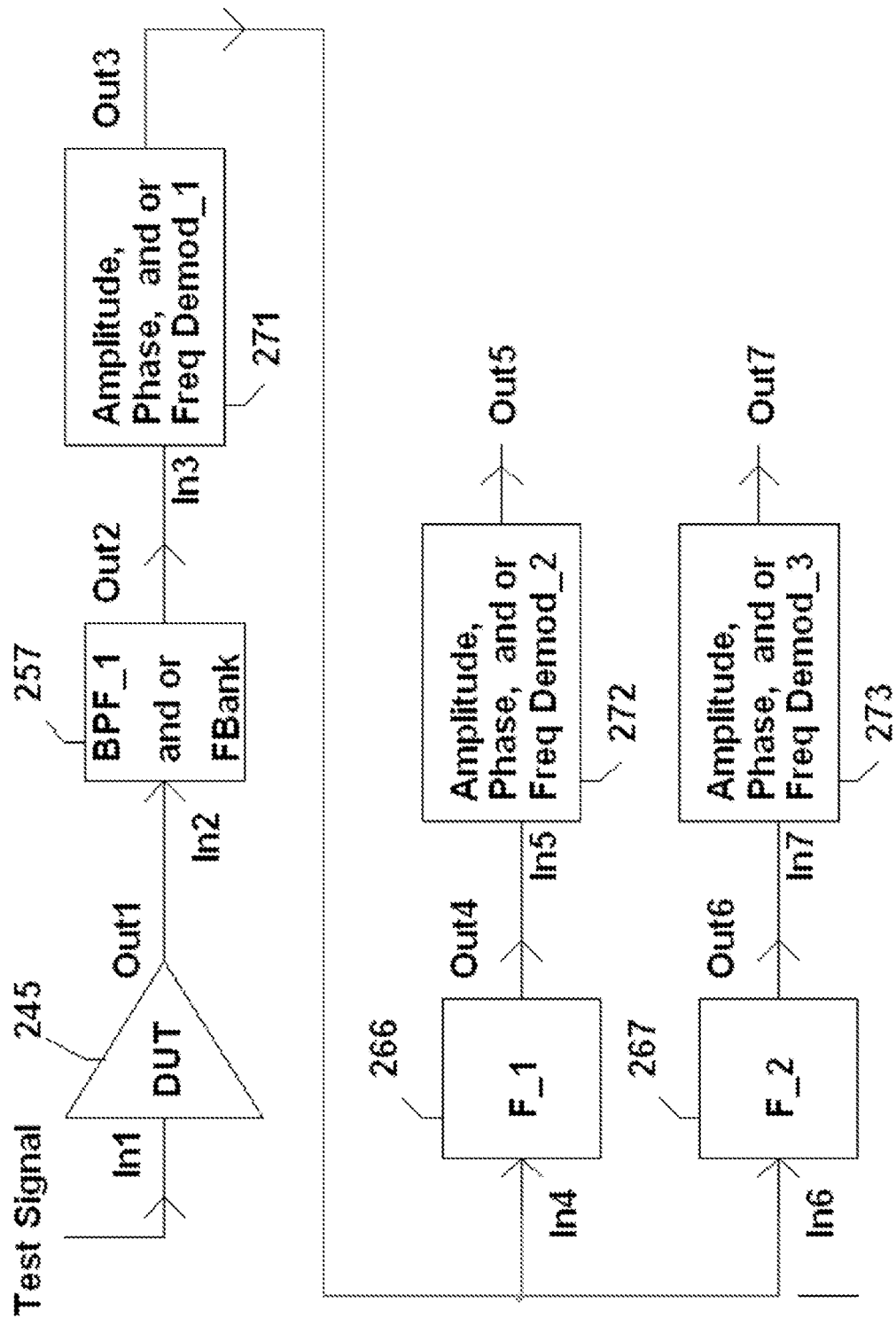
FIG. 33 shows an example embodiment including or comprising two or more filters or filter banks in cascade to further examine distortions in the DUT.

FIG. 33 shows an example of an embodiment that includes two or more filters coupled or cascaded. An input of a first filter, 257 (e.g., including a BPF_1, a band pass filter, high pass filter, low pass filter, and or band reject filter; or including a filter bank, FBank) is coupled to an output of a device under test, DUT, 245. A test signal which includes one or more signals is coupled to an input of the DUT. The output of the first filter is coupled to an input of a first demodulator for amplitude, phase, and or frequency (e.g., demodulation for modulation or magnitude). An output of the first demodulator is coupled to input(s) of a second and or third, and or Nth filter such as F_1, 266 and or F_2, 267. The second, third, and or Nth filter(s) may form a filter bank or may provide spectrum analysis in terms of amplitude, magnitude, and or phase information of a signal from the first demodulator. For example, a signal from the output of the first demodulator (e.g., 271), may include signal(s) via Out3 related to a modulating signal related to a the test signal coupled to the input of the DUT, or a sum and or difference frequency signal related to the test signal coupled into the DUT. The Out3 signal may be distorted such as including one or more harmonic(s) and or including one or more intermodulation or cross-modulation distortion signal(s). A filter or filter bank via such as 266, 267, and or another filter (e.g., F_N) can provide spectrum analysis of the signal at Out3. A filter or filter bank provides real time analysis of amplitude and or phase and or frequency. For example, by using a filter or filter bank coupled to the output of the first demodulator, time varying amplitude, phase, and or frequency of the fundamental and or harmonic frequency of the signal from the first demodulator can be measured and or compared with any filter or filter bank or input signal. To analyze or measure amplitude, phase, and or frequency from each filter, an input of a second and or a third demodulator is or are coupled to the output of the filter(s) F_1 and or F_2. For example, the output of filter F_1 is coupled to an input of a second demodulator, 272; and or the output of filter F_2 is coupled to an input of a third demodulator, 273. An output signal (e.g., Out5) of the demodulator 272 and or output signal (e.g., Out7) of demodulator 273 then provide(s) magnitude or amplitude, phase, and or frequency analysis or modulation measurements. Signals from Out5 and or Out7 provide amplitude, phase, and or frequency modulation (e.g., effect(s)) for fundamental and harmonic frequency (or frequencies) via the filter(s) 266 and or 227. Signals can be compared (e.g., in terms of amplitude, phase, and or frequency; or in terms of amplitude modulation, phase modulation, and or frequency modulation) with any combination of a signal related to the test signal coupled to the input of the DUT, and or a signal from Out4, Out5, Out6, and or Out7. Signals can be compared (e.g., in terms of amplitude, phase, and or frequency; or in terms of amplitude modulation, phase modulation, and or frequency modulation) with any combination of a signal from Out4, Out5, Out6, and or Out7. Alternatively, Out3, the output of the first demodulator may be coupled a spectrum analyzer, Fourier Transform, FFT (Fast Fourier Transform), or any variant of spectrum analysis including wavelets, DFT (Discrete Fourier Transform), or the like. Output signal(s) from demodulator(s) 272 and or 273 may provide one or more signal(s) that include amplitude modulation, phase modulation, and or frequency modulation from one or more filter output signals(s) such as Out4 and or Out6.

Yet another embodiment includes using filter or filter banks to measure static or time varying effects of a DUT on a modulating or an inducing signal. These time varying effects include examining or measuring amplitude, phase, and or frequency modulation effect(s). The inducing signal can include a modulating signal (e.g., amplitude, phase, and or frequency modulating signal as at least part of the test signal that is coupled to the input of the DUT). In another example, an inducing signal may be provided by combining two or more signals. For example, an inducing signal may include two signals such that when they are coupled to the input of the DUT, the DUT's output will include distortion(s) that may be in the form of intermodulation distortion, cross-modulation, and or modulation distortion on any combination of the signals comprising the test signal (e.g., coupled to the DUT's input terminal). For example, two signals of frequencies $f_1$ and $f_2$ can produce a modulation effect whose frequency is $N \times |f_1 - f_2|$, where N is a whole number. The modulation effect frequency may be a complex waveform with fundamental and or harmonics related to a frequency of $N \times |f_1 - f_2|$.

In another example of modulation effect (e.g., FIG. 33), two signals of a lower frequency $f_L$ and a higher frequency of $f_H$ are coupled to an input of the DUT (e.g., 245). The output of the DUT (e.g., 245) may provide an amplitude, phase, and or frequency modulation effect on the higher frequency signal. The amplitude, phase, and or frequency modulation effect may include a waveform related to the lower frequency signal and or related to the lower frequency signal and or harmonics of the lower frequency signal. In this example, an amplitude modulation waveform or envelope on the higher frequency signal (e.g., via an amplitude modulation detector or demodulator) may be complex and or have signals related to the lower frequency signal and or the lower frequency signal with harmonics. In this example, a phase modulation waveform or signal on the higher frequency signal (e.g., via phase detector or demodulator) may be complex and or have signals related to the lower frequency signal and or the lower frequency signal with harmonics. In this example, a frequency modulation waveform or signal on the higher frequency signal may be complex and or have signals related to the lower frequency signal and or the lower frequency signal with harmonics.

Yet another embodiment includes using filter or filter banks to measure static or time varying effects of a DUT on a modulating or an inducing signal. These time varying effects include examining or measuring amplitude, phase, and or frequency modulation effect(s). The inducing signal can include a modulating signal (e.g., amplitude, phase, and or frequency modulating signal as at least part of the test signal that is coupled to the input of the DUT). In another example, an inducing signal may be provided by combining two or more signals. For example, an inducing signal may include two signals such that when they are coupled to the input of the DUT, the DUT's output will include distortion(s) that may be in the form of intermodulation distortion and or modulation distortion on any combination of the signals comprising the test signal (e.g., coupled to the DUT's input terminal). For example, two signals of frequencies $f_1$ and $f_2$ can produce a modulation effect whose frequency is $N \times |f_1 - f_2|$, $N \times |f_1|$, $N \times |f_2|$, and or $N \times |f_1 + f_2|$, where N is a whole number. The modulation effect may be simple or complex or complicated with fundamental and or harmonics where N=1 and or N=2, and or N=3, and or N=n and or so on.

Another embodiment may include a modulated signal with another signal such as a second signal providing as the Test Signal coupled to DUT 245 in FIG. 33. The modulated signal may comprise or include any combination of an amplitude modulated, phase modulated, and or frequency modulated signal. The modulated (e.g., carrier or higher frequency) signal may include a modulating signal. The modulating signal may include at least one modulation frequency. Filters 266 and and or 267 may pass signals that are within a band pass frequency spectrum of the modulating frequency and or harmonic of the modulating frequency. The filter 257 in FIG. 33 may pass a signal whose frequency or frequencies include the frequency and or sideband(s) of the another or second signal.

In FIG. 33, the blocks 272 and or 273 can include amplitude, phase, and or frequency demodulators or detectors. As an example, in terms of 272 and or 273 including phase detectors for measuring differential phase or phase modulation distortion, a phase detector shown in FIG. 23, block 28", may be used or included for phase measurement in FIG. 33, block(s) 271, 272, and or 273. Phase detector 28" of FIG. 23 has two input terminals, In1 and In2, and an output terminal, PDO (e.g., phase detector/demodulator output).

For example, phase detector 28" of FIG. 23 may have its In1 input terminal coupled to the output a filter bank such as F_1, block 266 of FIG. 33, and its In2 input terminal to the output of another filter banks such as F_2, block 267 of FIG. 33. In this example the phase detector's output terminal, PDO (see FIG. 23 block 28"), provides measuring phase, phase differences, and or time varying phases between the signal from each of the filters (e.g., 266 and 267, or any two filters) in FIG. 33. Another example embodiment is that In1 of phase detector 28" is coupled to one of the test signals in FIG. 33. The Test Signal shown in FIG. 33 may be a signal that includes one or more signals and or a modulating signal. For example, either input terminal In1 or In2 of phase detector 28" may be coupled to the one or more signals or modulating signal(s) included in the Test Signal of FIG. 33. The remaining input terminal of phase detector 28" can be coupled to a filter output terminal such as the output terminal or F_1, block 266, or F_2, block 267, or another filter (e.g., F_N). The PDO terminal from the phase detector 28" provides a measurement of phase or time varying phase between an input signal and an output from a filter, wherein the input of the filter (e.g., In4 or In6 in FIG. 33) is coupled to an output of an amplitude, phase, and or frequency demodulator (e.g., block 271, Out3 of FIG. 33).

As an example or illustration in which other frequencies may be used, FIG. 33 may be used to measure phase differences between different frequencies from filter(s) 266 and or 267 after AM, PM, or FM demodulation via block 271. For example, if the test is signal includes a low frequency signal and a higher frequency signal such as 800 Hz and 15 kHz signals that are coupled to an input of the DUT, 245. The output of the DUT (245) is coupled to a first filter (e.g., 257 in FIG. 33) that removes or attenuates the low frequency signal while passing the higher frequency signals along with its associated sideband(s) whose frequencies are near the frequency of the higher frequency signal (e.g., sidebands near 15 kHz, or sidebands near another higher frequency signal). The output of the first filter, 257, is then coupled to a first demodulator, 271, for demodulation of amplitude, phase, and or frequency modulation via the DUT. In one example, demodulator 271 includes an AM detector. In another example for demodulator 271, it demodulates phase modulation or measures differential phase distortion. The output of first demodulator 271 is coupled to the input terminal(s) of one or more filters such as second filter 266 and or third filter 267. And yet in another example for demodulator 271, it demodulates frequency modulation. As in one example, demodulator 271 can demodulate an AM or amplitude modulated signal. (But of course demodulator 271 can demodulate a phase modulated or a frequency modulated signal.) For example in FIG. 33, filter 266 includes a band pass filter at the frequency of the lower frequency signal such as 800 Hz, and in FIG. 33, filter 267 includes a band pass filter at the frequency of a harmonic of the lower frequency signal such as 1600 Hz (or N×800 Hz where N≥2). By using the phase detector in FIG. 23, block 28", its In1 phase detector input terminal can be coupled to the output of filter 266 in FIG. 33; and the FIG. 23 phase detector 28" other input terminal In2 can be coupled to the output of filter 267 of FIG. 33. The PDO output terminal of the phase detector 28" of FIG. 23 then provides phase measurement of signals between the two filters at the fundamental and harmonic frequencies of the low frequency signal. For example, the phase detector (e.g., block 28" of FIG. 23) provides phase measurement (e.g., static or time varying) between the 800 Hz and N×800 Hz signals from the band pass filters F_1 and F_2 in FIG. 33. Alternatively, one of the phase detector's input terminal may be coupled to one of the input test signals such as the low frequency test signal (e.g., an 800 Hz test signal or test signal of another frequency), while the remaining input of the phase detector may be coupled to the output of filter F_1 or F_2 of FIG. 33. In this example, the phase error or phase modulation measurement between the lower frequency test signal and any one of the outputs from filters (e.g., 266 or 267 or other filter) after demodulation via 271 is provided. Note that the lower frequency signal such as the 800 Hz signal will induce distortion into the DUT. Alternatively, the lower frequency signal may have a different frequency from 800 Hz, and or the higher frequency signal may have a different frequency from 15 kHz.

Figure 34:
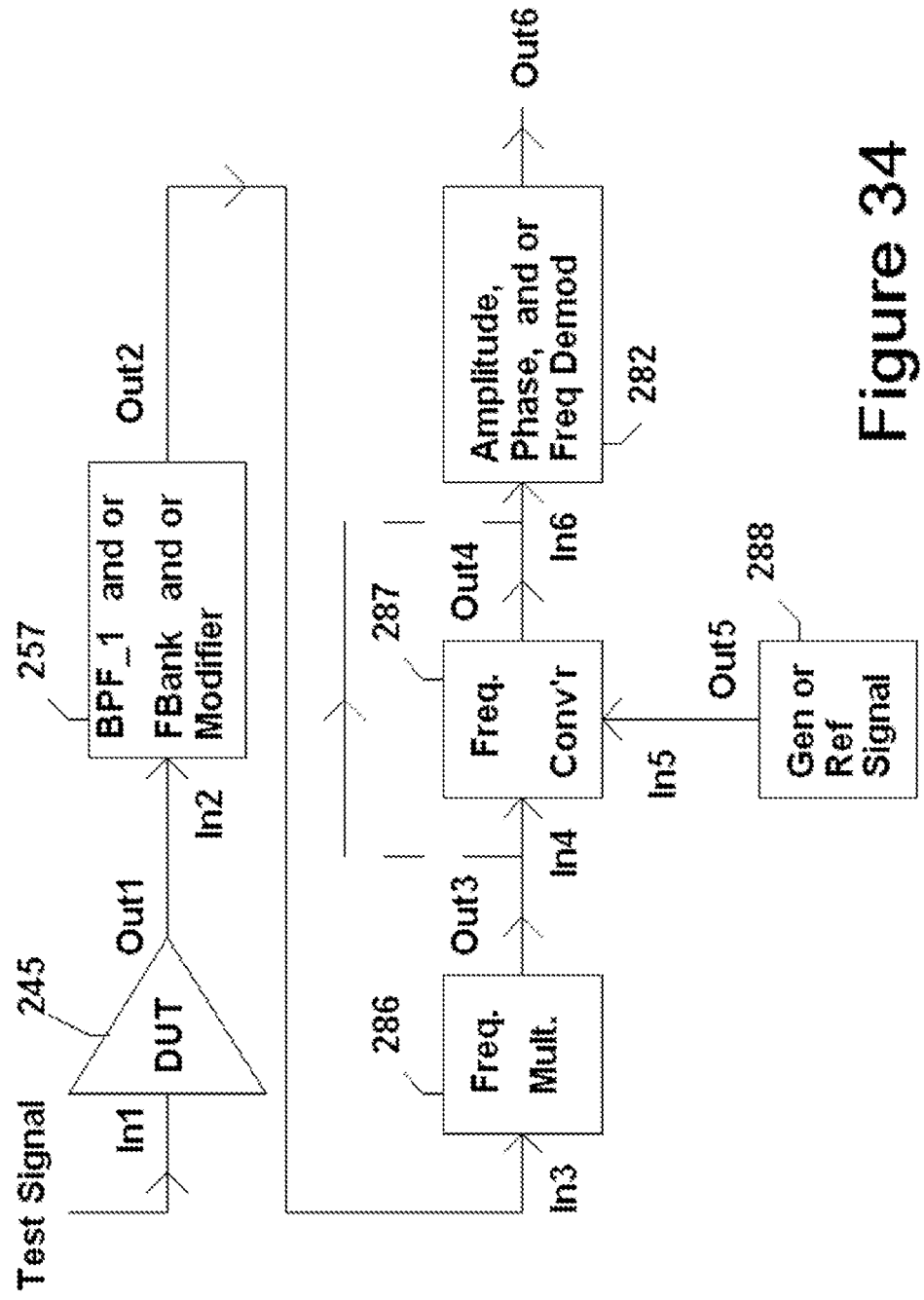
FIG. 34 shows an example embodiment including a frequency multiplier circuit, system, or method to increase resolution or sensitivity for measuring phase modulation distortion and or frequency modulation distortion, and or differential phase distortion.

In another embodiment increased sensitivity in measuring phase modulation and or frequency modulation distortion is provided by including a frequency multiplier circuit. FIG. 34 shows an example apparatus or method for increasing resolution or sensitivity for measuring phase modulation, differential phase, and or frequency modulation (e.g., frequency deviation of a signal). A test signal is coupled to an input terminal of a DUT (e.g., 245). The test signal may include one or more signals. In one example of a test signal, the test signal can include signals combined such as shown in FIG. 24, blocks 241, 242, and or 243, along with a combiner circuit or function 244 to provide a test signal to a DUT. An output terminal of the DUT is coupled to a filter, filter bank, and or modifier (e.g., 257) to pass a signal whereby amplitude, phase, and or frequency distortion is measured. To increase sensitivity for measuring for example smaller amounts (e.g., or higher resolution measurement) of phase and or frequency shift or modulation, the output of 257 that is Out2 is coupled to frequency multiplier circuit, apparatus, or method (e.g., 286). An example of a frequency multiplier circuit or function can include one or more multiplier or multiplication circuit(s) or function(s), or a frequency multiplier can include a nonlinear circuit to provide at least one harmonic signal. For example, a frequency multiplier circuit can include a two input multiplier circuit with both inputs coupled to the output of block 257 or to Out2. The output of the multiplier circuit example will then provide a signal of twice frequency along with a signal with twice the phase and or frequency deviation.

A multiplier circuit can include a nonlinear function or amplifier that provides harmonics. A differential pair amplifier or a limiting amplifier can provide substantially odd harmonics such as $3^{rd}$, $5^{th}$, $7^{th}$, and so on type harmonic signals, which "amplify" the phase and or frequency shifts from a signal via the band pass filter, filter bank, or modifier by 3 or 5 or 7 or (2n+1) fold, where n is a whole number. Other nonlinear circuits such a single ended amplifier may provide odd and or even harmonics, can amplify the phase modulation distortion or frequency modulation distortion from a DUT by a factor of N, where N is a whole number or N can be a real number. In general, N can be a real number.

The frequency multiplier may be coupled to a band pass filter to provide the nth harmonic. It should be noted that block 286 may include a system of nonlinear circuits and filters. For example, it may include a first differential amplifier coupled to a first filter, a second differential amplifier coupled to a second filter. This two stage frequency multiplier allows for further "amplification" of the phase and or frequency shifts or deviations from Out2. For example, if the first filter passes the $5^{th}$ harmonic, and the second filter passes the 7th harmonic, the original phase and or frequency deviation from Out2 will be multiplied by 5×7=35, or multiplied by 35 times. Frequency multiplier 286 may comprise one or more multiplying or nonlinear stages. An output of the frequency multiplier can be coupled to an amplitude, phase, and or frequency demodulator or detector to provide measurement of amplitude modulation distortion, phase modulation or differential phase distortion, and or frequency shift or modulation or frequency deviation. The output of the frequency multiplier may be coupled to a frequency converter to magnify or amplify the phase and or frequency deviation with respect to a frequency of the signal from the band pass filter, filter, or filter bank (e.g., from 257). The frequency multiplied signal from 286 is for example down converted at the output of the frequency converter at Out4 (e.g., which may include a filter) via a generator signal or reference signal from 288. In an example, if the frequency of the signal from Out2 is $(f_1+\Delta f)$, where $\Delta f$ represents the change in frequency due to the distortion in the DUT 245, and if the frequency multiplier has a frequency multiplication (e.g., factor) of N, then the frequency of the signal from the output of the frequency multiplier (e.g., Out3) is $N(f_1+\Delta f)=N f_1+N \Delta f$. If the generator or signal source from 288 has a frequency of $(N-1) f_1$, then the frequency of the signal from the output of the frequency converter (or mixer) will be:

$N f_1+N \Delta f-(N-1) f_1=f_1+N \Delta f$. If the generator or signal source from 288 has a frequency of $(N+1) f_1$, then the frequency of the signal from the output of the frequency converter (or mixer) will be:

$N f_1+N \Delta f-(N+1) f_1=f_1-N \Delta f$. When the output of the frequency converter or mixer is coupled to the amplitude, phase, or frequency demodulator (or detector), the phase and or frequency deviation is amplified or enlarged by the frequency multiplication factor, which provides for extra or higher resolution or higher sensitivity measurement(s). The test signal coupled into an input of DUT 245 may include any of the test signal(s) or composite test signal(s) previously or fore after mentioned (e.g., in this patent application and or in any of the incorporated patent applications.)

The DUT may be electronic, mechanical, and or electromechanical. For example, a DUT may include an electronic circuit or an electromechanical device such as a transducer, speaker, phone, and or microphone.

An example frequency converter may include a modulator such as shown in FIG. 18A, block 131. In this example in FIG. 18A, there are two inputs, m(t) and f(t), and an output terminal, Out. For example, in FIG. 34, a frequency converter (e.g., Freq. Conv'r) can include or comprise block 131 from FIG. 18A. In terms of example inputs, In4 of FIG. 34 can be associated with f(t) in FIG. 18A of block 131, and In5 of FIG. 34 can be associated with m(t) in FIG. 18A of block 131. Of course, the inputs can be reversed. Out4 from FIG. 34 can be associated with Out in FIG. 18A of block 131.

A frequency converter may include an output filter. For example, an output filter may include a band pass filter.

A frequency multiplier circuit or function may include an output filter. For example an output filter may include a band pass filter.

FIG. 34 shows an alternate embodiment wherein the output of the frequency multiplier is coupled via dotted lines to the input of the amplitude, phase, and or frequency (e.g., modulation) demodulator or to block 282.

An embodiment includes: An apparatus for measuring a phase modulation, amplitude modulation, or frequency modulation effect of a cross modulation distortion signal from an audio device, wherein the audio device has an input and an output, comprising: providing at least two signals comprising at least a first signal, and a second signal comprising a frequency modulation signal whose carrier frequency is higher than the frequency of the first signal to an input of the audio device and whose frequency modulating frequency is less than the frequency of the first signal; coupling an output signal of the audio device to an input of a modifier, and wherein the modifier provides an output terminal; measuring the cross modulation distortion signal from the output terminal of the audio device with a first phase modulation demodulator, first amplitude modulation demodulator, or a first frequency modulation demodulator, and wherein the cross-modulation distortion signal is related to the first signal.

Another embodiment includes: An apparatus for measuring a phase modulation, amplitude, or frequency modulation effect from an audio device, wherein the audio device has an input and an output, comprising:

providing a test signal to an input of the audio device, wherein the audio device includes an output signal; coupling the output signal of the audio device to an input of a modifier or first filter, and wherein the modifier or first filter provides an output terminal; coupling the output terminal of the modifier or first filter to an input of a first amplitude modulation demodulator, phase modulation demodulator, and or frequency modulation demodulator, wherein the amplitude modulation demodulator, phase modulation demodulator, and or frequency modulation demodulator includes an output terminal; measuring amplitude, phase, and or frequency modulation distortion signal from the output terminal of the audio device via the output terminal of the first amplitude modulation demodulator, phase modulation demodulator and or a frequency modulation demodulator; and further coupling to the output terminal of the first amplitude modulation demodulator, phase modulation demodulator and or a frequency modulation demodulator to one or more inputs of a second filter, third filter, and or filter bank, wherein the second filter, third filter, and or filter bank include one or more output terminals; further coupling at least one output terminal of the second filter, third filter, and or filter bank to an input of a second and or third amplitude modulation demodulator, phase modulation demodulator, and or frequency modulation demodulator; wherein the second and or third amplitude modulation demodulator, phase modulation demodulator, and or frequency modulation demodulator include one or more output terminals that provide measurement of static or time varying amplitude, phase, or frequency modulation distortion via signals from the output of the second filter, third filter, and or filter bank.

Another embodiment includes: An apparatus for measuring a phase modulation or frequency modulation effect from an audio device, wherein the audio device has an input terminal and an output terminal, comprising: providing at least two signals comprising at least a first signal, and a second signal whose frequency is higher than the fundamental frequency of the first signal, to the input terminal of the audio device; coupling the output terminal of the audio device to an input of a modifier or first filter, and wherein the modifier or first filter provides an output terminal; further coupling the output terminal of the modifier or first filter to an input terminal of a frequency multiplier circuit or function and coupling an output terminal from the frequency multiplier circuit or function to an input terminal of a phase modulation demodulator and or frequency modulation demodulator, wherein the phase modulation demodulator and or frequency modulation demodulator includes an output terminal; measuring the phase or frequency modulation distortion signal of the audio device via the output terminal of the phase modulation demodulator or a frequency modulation demodulator. An addition novelty includes that the frequency multiplier circuit or function provides higher resolution or high sensitivity measurement of the phase and or frequency modulation distortion.

A transducer may be coupled to the output (e.g., for listening) of any of the filters such as in FIG. 33, filters 257, 266, and or 267, and or filter 257 in FIG. 34. The transducer may be couple to the output the frequency multiplier, frequency converter, and or any demodulator such as 271, 272, and or 273 of FIG. 33 or demodulator 282 in FIG. 34.

Another embodiment may include a method and or apparatus to measure de-sensing of one or more amplifying circuits within an amplifier. De-sensing includes a loss in gain of an amplifier or audio device by use of a large amplitude (e.g., interfering) AC (alternating current) signal. When this AC signal is combined with small amplitude (e.g., AC) signal, the small signal gain is reduced or changed by adjusting the amplitude of the large amplitude AC signal. Alternatively the large amplitude AC signal can be a de-sensing signal. For example a de-sensing signal is combined with a small signal into an input of an audio device (e.g., amplifier or other audio device). By adjusting the amplitude and or frequency of the de-sensing signal, the amplitude, frequency response, phase response, time delay, and or phase of an output signal of the audio device that is related to the small signal is changed or varied. In one example, increasing the amplitude or increasing the frequency of the de-sensing signal at the input of the audio device causes the small signal (e.g., that was combined with the de-sensing signal) to be subjected to increased attenuation or to be subjected to increased phase shift (e.g., when compared to the small signal at the input of the audio device) or to be subjected to increased time delay.

For example, in some amplifier circuits that include a de-sensing effect may include one or more differential pair amplifiers such as a differential pair bipolar transistor amplifier (e.g., using matched pair transistor array such as an MD918 or MP311 or MD2369 or MAT-01, or CA3054, or the like), or a differential pair field effect transistor amplifier (e.g., such as an LSK389 or LSK489 or 2N5566 or SD5000 or any of 2N5902 to 2N5909 or the like), or a differential pair vacuum tube (e.g., triode or pentode) amplifier (e.g., any of: 12AU7, 6DJ8, 12AT7, 6AR11 (pentode), 12AX7, or the like).

Of course other types of amplifiers may include a de-sensing effect. This may include amplifier that have amplifier stages that are single ended or amplifiers that include substantially symmetrical limiting/saturating transfer function(s) or asymmetrical limiting/saturating transfer function(s).

An example of the de-sensing effect on a bipolar junction transistor differential pair amplifier is as follows: The dual matched transistor has both their emitter terminals connected/coupled together and the emitters of the dual matched transistor are connected/coupled to a current source, IEE. The matched transistor includes a first transistor and a second transistor, each with emitter, base, and collector terminals. The base terminal of the first transistor is coupled to a first signal source that typically provides small amplitude signal. The base terminal of the second transistor is coupled to a second signal source that typically provides a larger amplitude signal than the amplitude of the first signal source. The second signal source can be used to change the gain of the first signal source at an output of the differential pair amplifier. The output of the differential pair amplifier may be taken from the collector of the first transistor or taken from the collector of the second transistor. Alternatively, the difference or subtraction of the signal of the collector of the first transistor from the signal of the collector of the second transistor may be provided. Depending on the amplitude level of the second signal source, the output of the differential amplifier will show a gain change for the first signal source. An approximation for the gain (e.g., tranconductance) as a function of the second signal source is given by a gain function, $G(x)=k[I_0(x)]/[1+I_0(x)]^2$, where k is a constant, and the peak amplitude, $V_{p2}$, of the second signal source that is sinusoidal has $x=nV_{p2}/26$ mV, where n is a real number. The constant k can be equal to $1/26$ mV. The function or term, $I_0(x)$, is derived from modified Bessel functions. A tabulation of modified Bessel function values is included in the book, "Communication Circuits Analysis and Design" by Kenneth Clarke and Donald Hess, Addison-Wesley Publishing Company, 1971, on Appendix pages 636 to 641, in which this book by Kenneth Clarke and Donald Hess is incorporated by reference. As can be observe from $G(x)=k[I_0(x)]/[1+I_0(x)]$, an increase in the amplitude provided from the second signal source results in a decrease in the gain $G(x)$. The function $G(x)=k[I_0(x)]/[1+I_0(x)]^2$ applies to two signals combined and coupled to at least one input terminal of the differential amplifier. For example, the two signals (e.g., where at least one signal includes an AC signal, or wherein both signals include AC signals) may be combined then coupled to one of the input terminals of the differential amplifier. Alternatively one signal of the two signals may be coupled to a first input of the differential amplifier and the other signal of the two signals may be coupled to a second input terminal of the differential amplifier. For example, gain variation of the differential amplifier is provided by a changing the amplitude one of the signals that includes an AC signal.

The gain function $G(x)=k[I_0(x)]/[1+I_0(x)]^2$ is applicable to many operational amplifier with negative feedback. Negative feedback may include coupling a feedback element to the output terminal of an amplifier or operational amplifier. For example a negative feedback amplifier may include coupling an element or a resistor from the output terminal of the operational amplifier to the inverting input terminal of the operational amplifier. When two signals such as a low amplitude signal and high amplitude signal are combined into the operational amplifier, the voltage across the 2 inputs of the operational amplifier can be sufficiently large to start causing an attenuation effect in a differential amplifier that is within the operational amplifier. For example, in a inverting gain negative feedback configuration or in a non inverting gain negative feedback configuration, a high amplitude level 20 kHz signal at the output of the operational amplifier will cause attenuation of a small amplitude signal coupled to an input of the operational amplifier that has an open loop frequency response where the open loop −3 dB frequency is less than 1 kHz, and wherein the operational amplifier is has a sufficiently large amplitude signal across its input terminals. In another example, in a inverting gain negative feedback configuration or in a non inverting gain negative feedback configuration, a high amplitude level de-sensing signal at the output of the operational amplifier will cause decreased gain or will cause a lower frequency response of a small amplitude signal coupled to an input of the operational amplifier.

In an example, a feedback amplifier with a resistor or element is coupled from the output of the amplifier and to the inverting input terminal of the amplifier. The amplifier is set with two resistors to set a gain of 10 in non inverting op amp configuration such as have the gain=1+R2/R1, where R2/R1=9, and where R2 is a resistor connected across the output terminal and the inverting input terminal of the operational amplifier. R1 is connected between the inverting input terminal of the operational amplifier an ground or AC ground. Two signals are combined and coupled to the non inverting input terminal. If a signal with 2 volts peak to peak at 15 kHz and another signal with 100 millivolts peak to peak at 20 kHz are combined and coupled to the non inverting input of the operational amplifier, the expected signals at the output would be 20 volts peak to peak at 15 kHz and 1 volt peak to peak at 20 kHz. However, the actual voltage may be a lower 900 millivolts peak to peak from the 20 kHz signal at the output, but when the 15 kHz signal is turned off, the 20 kHz signal increases back to 1 volt peak to peak. Therefore in this example, the large amplitude 15 kHz signal has a de-sensing effect. If the 20 kHz signal is lowered in frequency to 200 Hz, turn on or off the large amplitude 15 kHz signal will not affect the output level of the 200 Hz small signal amplitude; that is the amplitude will be 1 volt peak to peak. Therefore the de-sensing signal affects the frequency response of the smaller amplitude signal.

For a negative feedback amplifier a de-sensing signal affects the open loop gain which in then affects the closed loop gain and or frequency response. The open loop gain transfer function of an amplifier usually includes an open loop pole that is required to provide stability (e.g., not oscillating) when negative feedback is applied to form a closed loop transfer function. The de-sensing signal by lowering the open loop gain, reduces the frequency response or bandwidth when negative feedback is enabled or used. Negative feedback is used in common amplifier configurations for operational amplifiers and other amplifiers.

An example measuring method or apparatus may include providing a first test signal and a second test signal coupled to an input of a device under test, DUT. The DUT may include a negative feedback configuration such as having a negative feedback element coupled to an output terminal of the DUT. A device under test may include an audio signal device such as an audio amplifier or an audio transducer (e.g., loudspeaker, earphone, phonograph cartridge, or headphone). The frequency of the first test signal may be a fixed frequency (e.g. a sine wave test tone in a frequency range of 1 kHz to >25 kHz, but another frequency range may be used), and the amplitude of the first test signal is greater than the amplitude of the second test signal at an output of the device under test. The second signal may include multiple frequency tones, one or more tones with different frequencies tested one at a time, or a swept frequency signal. An output of the device under test is then measured for phase response and or frequency response with respect to the second test signal. The first test signal may be increased or decreased in amplitude and the output of the device under test is then measured for phase response and or frequency response with respect to the second test signal.

In one example, an experiment included an amplifier with negative feedback configuration (e.g., a feedback resistor was connected between the output and inverting input terminals of the amplifier) with an operational amplifier (e.g., LM741 or other device), including a first test signal (e.g., a de-sensing signal) provided about a 10 volt peak to peak signal with a frequency of 15 kHz at the output of the operational amplifier. For example, the amplifier circuit may be a combining/summing circuit for the first signal and a second signal. The second signal at 9 kHz whose amplitude is 200 mV peak to peak is coupled to the input of the operational amplifier such that the output signal with the frequency of 9 kHz is less than 10 volts peak to peak. The amplitude of the 9 kHz signal is measured at the output. Then the second signal is changed in frequency from 9 kHz to 20 kHz or 25 kHz while providing the same input amplitude as before (e.g., 200 mV peak to peak coupled to the input of the operational amplifier) and at the output of the operational amplifier, the 20 kHz or 25 kHz signal is measured for amplitude. For this experiment example, there was about a 20% lower amplitude (−2 dB) of the 20 kHz or 25 kHz signal when compared to the 9 kHz signal. The experiment may also include turning off or attenuating the first signal (e.g., wherein the first signal is a de-sensing signal). When the first signal was turned off, the second signal at 9 kHz, 20 kHz, and or 25 kHz showed substantially the same amplitude (e.g., no amplitude loss or no lower amplitude). The experiment may include to measure the relative phase of the 9 kHz, 20 kHz, and or 25 kHz second test signal at the output of the operational amplifier compared with the signal source or signal generator providing the second test signal. Of course other amplifiers, amplitudes, and or frequencies may be used. In this example, turn on and off the first signal (or turning on and off the de-sensing signal) changed the frequency response (or an the phase response) of the second signal.

In an embodiment the first test signal can be at a frequency and at an amplitude that stresses the amplifier such that the amplifier is approaching slew rate limiting or is at slew rate limiting. Put in other words, the first signal is a signal (or signals) that causes the amplifier or device under test to provide an output signal that is below slew rate limiting, approach slew rate limiting, and or be at slew rating limiting. For example the amplifier or device under test has a measured or specified slew rate such as a positive slew rate and or negative slew rate. A small signal amplitude of one or more frequencies of the second signal will show one or more variation(s) in frequency response and or variation(s) in phase response. For example, the frequency response or phase response may include using one of the input test generators (e.g., the second test signal generator) as a reference signal to compare with the output of the device under test in terms of frequency response and or phase response.

An embodiment may include a composite signal that includes two or more signals that are combined to provide the composite signal. The two or more signals can include a first test signal that includes an amplitude level (or a frequency), which causes the DUT to output a signal wherein the DUT is approaching slew rate limiting or is at slew rate limiting or is not approaching slew rate limiting. The two or more signals can include a second signal that can be a smaller signal with one or more frequencies to determine the frequency and or phase response of the DUT under one or more amplitude level and or under one or more frequency of the first test signal. For an illustration example, in FIG. 24, there are at least two signal sources from blocks 241 and 242 that are summed or combined via block 244. The output signal of the combiner 244 provides a composite signal. The composite signal is coupled to a device under test (e.g., DUT) such DUT, 245. For example, the first signal can be considered as a de-sensing signal.

Another example of providing the first and second test signals can include the first, second, and or Nth signal source (e.g., generator) shown in FIG. 23 as blocks 21, 22, and or 23. The signals from blocks 21, 22, and or 23 are combined (e.g., or summed or added or subtracted) via block 24, wherein the output of combiner 24 provides a composite test signal that is coupled to a device under test or DUT such as block 25 in FIG. 23 or the composite test signal from block 24 of FIG. 23 is coupled to a DUT (e.g., 254) in FIG. 29.

Note that the Filter 254 in FIG. 29 may include a nulling circuit to remove the first test signal from the output of the DUT or Filter 254 may include a filter to remove the first test signal from the output of the DUT. A DUT may be item 245 in FIG. 29. The output of the Filter 254 may be coupled to a measuring system or circuit (e.g., block 255) for measuring frequency response and or phase response of the DUT (e.g., 245 in FIG. 29).

The composite signal may be coupled to the input of DUT 245 in FIG. 29 for example. The output of the DUT 245 in FIG. 29 may be coupled to the filter 254 or the output of the DUT (e.g., 245) may be coupled to a measuring system or circuit (e.g., block 255 in FIG. 29) that measures amplitude, phase, and or frequency.

The composite signal may include a noise source that is combined with a test signal to measure frequency response as a function of the amplitude of the test signal. For example, a test signal whose amplitude is greater than the amplitude of the noise source is combined, added, or subtracted with a noise source. The combined signal is coupled to an input of a device under test (DUT). An output of the DUT is coupled to an amplitude measurement device such as a spectrum analyzer or Fourier Transform measurement system (e.g., FFT). The spectrum of the noise such as a white noise source will show in one or more cases that the noise spectrum at the output of the DUT changes amplitude with frequency as the test signal is increased or decreased in amplitude. The noise spectrum measurements can be tabulated as a function of amplitude level(s) of the test signal. For example, if the test signal includes a 15 kHz sine wave (e.g., other waveforms or other frequencies may be used) is combined with a white noise source (e.g., the white noise source may be band limited or low pass filtered) to provide a composite signal. This composite signal is coupled to an input of a DUT. An output of the DUT is coupled to a spectrum analyzer or FFT (Fast Fourier Transform) measurement system. By varying the amplitude and or frequency of the example 15 kHz test signal, the noise spectrum with change shape (e.g., amplitude shape in a spectrum analyzer or FFT) such as showing a more attenuation at high frequencies as the amplitude of test signal increases. A DUT may include a feedback amplifier, and amplifier, or a circuit that includes a differential pair circuit (e.g., differential pair amplifier such as differential amplifier using a pair of amplifying devices, wherein the amplifying devices includes any of transistor, field effect transistor, bipolar transistor, or vacuum tube).

The composite signal may include a first test signal including a multiple tone signal, is combined with a second test signal to measure frequency response as a function of the amplitude of the second test signal. For example, a second test signal whose amplitude is greater than the amplitude of the multiple tone (e.g., multiple tone=multi tone) is combined with the first test signal to provide a composite signal. The second test signal can be consider as a de-sensing signal. The composite signal is coupled to an input of a device under test (DUT). An output of the of the DUT is coupled to a amplitude measurement device such as a spectrum analyzer or Fourier Transform measurement system (e.g., FFT). The spectrum of the multiple tone signal at the output of the DUT changes amplitude for one or more tones included in the multiple tone signal with frequency as the second test signal is increased or decreased in amplitude. The multiple tone spectrum measurements can be tabulated as a function of amplitude level(s) of the second test signal. For example, if the second test signal includes a 15 kHz sine wave (e.g., other waveforms or other frequencies may be used) is combined with a multiple tone source (e.g., the multiple tone source may include a plurality of tones; for example the tones may include frequencies of $n_0 \times 1000$ Hz, where $n_0$ is a real number or where $n_0$ is an integer) to provide a composite signal. This composite signal is coupled to an input of a DUT. An output of the DUT is coupled to a spectrum analyzer or FFT (Fast Fourier Transform) measurement system or to a voltmeter, selective (e.g., frequency) voltmeter, or wave analyzer. By varying the amplitude (or frequency) of the example 15 kHz test signal, the spectrum of the multiple tone signal(s) at the output of the DUT may change in terms of amplitude such as showing a more attenuation at high frequencies as the amplitude (or frequency) of the second test signal increases. A DUT may include a feedback amplifier, an amplifier, audio device, or a circuit that includes a differential pair circuit (e.g., differential pair amplifier such as differential amplifier using a pair of amplifying devices, wherein the amplifying devices includes any of transistor, field effect transistor, bipolar transistor, or vacuum tube).

The composite signal may include a first test signal including a swept frequency signal, that is combined with a second test signal to measure frequency response (or measure phase response) as a function of the amplitude of the second test signal. For example, a second test signal whose amplitude is greater than the amplitude of the swept frequency signal is combined to provide a composite signal. The composite signal is coupled to an input of a device under test (DUT). An output of the DUT is coupled to an amplitude measurement device such as a spectrum analyzer, Fourier Transform measurement system (e.g., FFT), oscilloscope, digital storage oscilloscope, voltmeter, selective (e.g., frequency) voltmeter, and or wave analyzer. The spectrum of the swept frequency signal at the output of the DUT changes amplitude as the second test signal is increased or decreased in amplitude and or frequency. The swept frequency signal amplitude measurements can be tabulated as a function of amplitude level and or frequency of the second test signal. For example, if the second test signal includes a 15 kHz sine wave (e.g., other waveforms or other frequencies may be used) is combined with a swept frequency signal source to provide a composite signal. This composite signal is coupled to an input of a DUT. An output of the DUT is coupled to a spectrum analyzer or an FFT (Fast Fourier Transform) measurement system or a voltmeter, selective (e.g., frequency) voltmeter, or wave analyzer. By varying the amplitude and or frequency of the example 15 kHz test signal, the swept frequency signal at the output of the DUT may change shape in terms of amplitude such as showing a more attenuation at high frequencies as the amplitude of the second test signal increases in amplitude and or frequency. By varying the amplitude and or frequency of the example 15 kHz test signal, the swept frequency signal at the output of the DUT may change in terms of phase response such as showing a more phase shift or more time delay at high frequencies as the amplitude of the second test signal increases in amplitude and or frequency. A DUT may include a feedback amplifier, an amplifier, or a circuit that includes a differential pair circuit (e.g., differential pair amplifier such as differential amplifier using a pair of amplifying devices, wherein the amplifying devices includes any of transistors, field effect transistor, bipolar transistor, or vacuum tube).

Another embodiment may include measuring for cross-modulation distortion such as amplitude modulation cross-modulation distortion, phase modulation cross-modulation distortion, and or frequency modulation cross-modulation distortion. For example an embodiment can include three or more signals. For an illustration for three signals, a first signal has frequency of $f_1$, and a second signal that includes a modulated signal whose carrier frequency is $f_2$ with a modulating signal of frequency $f_{mod}$, and third signal whose frequency is $f_3$, wherein $f_1<f_2<f_3$. For example, the frequency of the first signal is lower than the frequency of the second signal, and the frequency of the second signal is lower than the frequency of the third signal. The second signal can include amplitude modulation, phase modulation, and or frequency modulation at a carrier frequency of $f_2$ and the carrier of the second signal is modulated with a modulation signal whose frequency includes $f_{mod}$. The first signal, second signal, and third signal are combined and coupled to an input of a device under test (e.g., an amplifier or audio amplifier, or audio device). To perform one or more measurements on signals related to the first signal and third signal, an output of the device under test is coupled an amplitude detector for measuring average amplitude, amplitude modulation detector/demodulator for measuring amplitude modulation, phase detector/demodulator for measuring phase modulation, and or frequency modulation demodulator for measuring frequency shifts. The second signal may be adjusted to an amplitude level that causes the device under test to approach slew rate limiting. In an example, the amplitudes of the first signal and or second signal are lower than the average amplitude of the second signal. A cross modulation effect or cross modulation distortion may be measured at the output of the device under test. For example at the output of the device under test cross modulation (e.g., amplitude modulation cross modulation, phase modulation cross modulation, and or frequency modulation cross modulation) is tested for signals whose frequencies includes those of the first signal and the third signal such as frequencies $f_1$ and $f_3$. The cross modulation distortions measured at the output of the DUT may be tabulated for those frequencies below and or above the frequency of the modulated test signal (e.g., $f_2$). Of course more than three test signals may be included in another embodiment and or more than one modulated test signal may be used. In another embodiment, the cross modulation measurements are done with test signal without modulation such as having the first signal and the third signal not modulated (e.g., not modulated=continuous wave or CW signal). Alternatively, the modulated signal or the second signal may be substituted with two or more signals; for example the two or more signals may include one or more test tones (e.g., of different frequencies) or a test tone with another modulated signal, or two or more modulated signals.

In another embodiment for example, one or more modulated signals and/or one or more un-modulated signals may be combined to form a test signal (or form a composite signal). The one or more modulated signals may include one or more modulation signals and/or one or more carrier signals. The test signal is coupled to an input terminal of a device under test (DUT). An output terminal of the device under test may be coupled to one or more demodulators that demodulate(s) the one or more modulated signals. The one or more demodulated signals may be analyzed or compared with the one or more modulation signals. The one or more demodulated signals may be analyzed that may (or may not) include FFT, Fourier analysis, spectrum analysis, time domain analysis, and/or the like. Any of the modulation signals (or modulated signals) may include any combination of amplitude modulation, phase modulation, and/or frequency modulation. Any of the modulation signals (or modulated signals) may include any combination of an un-modulated signal (e.g., a tone) and/or amplitude modulation, phase modulation, or frequency modulation. For example, in one embodiment, a frequency modulation signal is coupled to an input terminal of device under test (e.g., DUT). An output terminal of the device under test is coupled to a demodulator, spectrum analyzer, and/or time domain analyzer (e.g., an oscilloscope or meter). The frequency modulation signal includes a modulation signal and/or a carrier signal. In another example the device under test may include a signal processing system (e.g., a recorder, a digital recorder, digital audio recorder, a data compression system, an audio compression system for example an MP3 device/program or a digital audio data compression system, a filter or filter system, a digital rate converter system or program, or the like). A DUT may include an audio device.

Note that a test signal may be a composite signal (e.g., a composite signal includes a carrier signal and/or at least one side band signal). For example, in FIG. 29 (or other figures), a test signal (or composite signal) may be coupled to an input of the device under test (DUT) and an output of the device under test is coupled to a circuit or system that measures amplitude, phase, and/or frequency in the time domain or in the frequency domain. For example, block 255 in FIG. 29 may include an amplitude measurement system, a frequency measurement system, and/or a phase measurement system. Any of the measurement systems may be implemented in hardware and/or software. In another example, block 255 in FIG. 29 may include an amplitude modulation demodulator/detector, a frequency modulation demodulator/detector, and/or a phase demodulator/detector. A device under test may include an audio device.

For example in a device under test (e.g., that may include data processing, data compression, and/or filtering) a modulated signal coupled to an input terminal of the device under test is evaluated at an output terminal of the device under test. The modulated signal may include amplitude modulation and/or frequency modulation wherein the device under test (e.g., at the output terminal) is evaluated or tested for a deviation in the amplitude modulation such as an amplitude modulation envelope that is deviated from the input amplitude modulation signal at the input terminal; or wherein the device under test (e.g., at the output terminal) is evaluated or tested for a deviation amplitude modulation carrier phase or frequency; or wherein the device under test (e.g., at the output terminal) is evaluated or tested for a deviation and/or any associated sideband(s) in terms of amplitude, phase, and/or frequency. Or wherein a frequency modulated signal and/or phase modulated signal is coupled to the input of the device under test and wherein the device under test is evaluated or tested for an amplitude modulation effect and/or a deviated frequency modulation effect. An example of a deviated frequency modulation effect includes a shift or deviation in carrier frequency (e.g., at the output terminal of the device under test) which is substantially not identical to frequency deviation or shift of the test signal (e.g., that is coupled to the input of the device under test). A device under test may include an audio device.

In one example embodiment, a test signal including a frequency modulated signal comprising a carrier signal and a modulation signal is coupled to an input of a device under test. An output of the device under test is coupled to an input terminal of a frequency modulation demodulator (e.g., a frequency modulation (FM) detector such as an FM detection including at least one of: quadrature detector, ratio detector, pulse counting detector, frequency discriminator, slope detector, amplitude modulation detector, multiplier, envelope detector, and/or filter), wherein an output terminal of the frequency modulation demodulator provides an demodulated signal indicative of frequency shift or deviation of the test signal; wherein the demodulated signal from the frequency modulation demodulation may be compared with the modulating signal of the test signal. In an ideal case wherein the device under test has no distortion, the output signal from the frequency demodulator should be substantially the same as the modulating signal of the test signal that may (or may not) include a difference in amplitude or phase. The test signal that is coupled to the input terminal of the device under test may include coupling to a first spectrum analyzer or first Fourier Transform device. The output of the device under test may be coupled to a second (or the first) spectrum analyzer or second (or the first) Fourier Transform device. Amplitudes and/or phases of sidebands generated by the test signal that includes frequency modulation can be compared (or measured) with amplitudes and/or phases of sidebands provided at the output terminal of the device under test (e.g., that includes a frequency modulated signal). In another example, should the output terminal of the device under test include a distortion signal such as harmonic distortion, intermodulation distortion, and/or cross modulation distortion, one or more of the distortion signal(s) from the output of the device under test may be coupled to an input of a first or a second frequency modulation demodulator to provide first or second demodulated signal (which can be compared or measured with the modulating signal of the test signal).

In one embodiment wherein the device under test included audio compression such as MP3, it was found at various (e.g., data) compression setting, a frequency modulation test input signal caused at the output terminal of device under test to attenuate one or more frequency modulation sideband(s) which then provided an unexpected change in the manner from which the test signal was changing pitch. In one example, the test signal included a tone whose pitch was changing in a sinusoidal manner while the output of the device under test (e.g., including MP3 audio compression) provided a different pitch change that did not track the pitch change of the test signal. When the output of the device under test was coupled to a frequency modulation (FM) demodulator, the demodulated (FM) signal provided a signal resembling a parabolic waveform instead of the (e.g., intended) sinusoidal waveform. The actual peak frequency deviation from the signal of the output terminal of the device under test did not match the peak frequency deviation of the test signal. Also as a function of the time from a particular start point, the frequency of the output signal of the device under test did not match or track the frequency of the test signal. Depending on the type of data compression, there were various degrees of frequency errors at the output of the device under test. For example in an MP3 audio data compression format, as the data compression increased or equivalently, the number of bits per second decreased such as decreasing from 256 kilo bits per second to 64 kilobits per second, the amount of frequency modulation distortion increased. In one experiment with decreasing the data rate in an MP3 device, it was found that the frequencies from the MP3 device did not match the frequencies of an input signal to the MP3 device. In one experiment if the input test signal included a frequency modulation signal whose frequency is $f_c+/-\Delta f$, the MP3 device outputted a signal with a frequency of $f_c+/-k_0\Delta f$, where $k_0 \neq 1$ (e.g., $k_0$ having a range of 0.7 to 0.9, or whereby $k_0<1$, or whereby $k_0>1$). The term $+/-\Delta f$ represents a deviation in frequency of the carrier frequency $f_c$. From the output of the DUT or audio device (e.g., MP3 device), the term $+/-k_0\Delta f$ represents a (e.g., new or different) deviation in frequency of the carrier frequency $f_c$. Note that $k_0$ may be a constant or $k_0$ may be a function of $f_i=(f_c+/-\Delta f)$ where $f_i$=instantaneous frequency of the test signal or input frequency modulated signal; for example $k_0 \rightarrow k_0(f_i)$. In an example with increased data compression from the output of the device under test, there were more errors or greater mismatches in frequency after data compression compared to the input test signal that included frequency modulation and/or phase modulation. In general it can be stated when coupling a modulated test signal to an audio device with data compression (e.g., such as MP3 or other data compression method), the output of the audio device will generally provide more frequency errors as the data compression is increased or when the bit rate is reduced. Errors or mismatches in frequency from the output of the device under test (DUT) having a modulated signal coupled to the input of the DUT can be measured via short time Fourier Transform, digital signal processing, frequency modulation demodulator (e.g., FM detector), and/or a filter bank. For a static test signal such as a tone (e.g., without modulation), the device under test provided substantially no error in frequency compared to the static test signal.

In one embodiment (e.g., that includes measuring for a change in modulation index of a frequency modulation test signal) wherein the device under test included audio compression such as MP3, it was found at various (e.g., data) compression setting, a frequency modulation test input signal caused at the output terminal of device under test to attenuate one or more frequency modulation sideband(s) which then provided an unexpected change in the manner from which the test signal was changing pitch. In one example, the test signal included a tone whose pitch was changing in a sinusoidal manner while the output of the device under test (e.g., including MP3 audio compression) provided a different pitch change that did not track the pitch change of the test signal. When the output of the device under test was coupled to a frequency modulation (FM) demodulator, the demodulated (FM) signal provided a signal resembling a parabolic waveform instead of the (e.g., intended) sinusoidal waveform. The actual (e.g., positive or negative) peak frequency deviation from the signal of the output terminal of the device under test did not match the (e.g., positive or negative) peak frequency deviation of the test signal. Also as a function of the time from a particular start point, the frequency of the output signal of the device under test did not match or track the frequency of the test signal. Depending on the type of data compression, there were various degrees of frequency errors at the output of the device under test (e.g., when compared to the input test signal). In an example if the test signal (e.g., the test signal including frequency modulation, phase modulation, and/or amplitude modulation) has a modulation index of k, the output signal from the DUT includes a modulation index of $k_1$, such that $k_1 \neq k$. Note that the modulation index of $k_1$, may pertain to a modulation index for the test signal including amplitude modulation, frequency modulation, and/or phase modulation. For a static test signal such as a tone (e.g., without modulation), the device under test (e.g., at the output of the device under test) provided substantially no error in frequency compared to the static test signal. In another embodiment where the device under test includes a first channel input and output and a second channel input and output, the input (e.g., terminal) of the first channel of the device under test is may be coupled to a test signal (e.g., the test signal previously mentioned or the test signal mentioned in following paragraphs), and the second channel may have the second channel input terminal coupled to a reference signal. The reference signal coupled to the input of the second channel may serve as a reference carrier signal that may be used with a demodulator associated with a signal from the output of the first channel. For example, the reference signal may serve as a reference signal for a phase detector/demodulator input terminal wherein another input terminal of the phase detector/demodulator is coupled to the output terminal of the first channel. The reference signal may include a static or un-modulated signal such as a tone. The reference signal may be required when analysis of phase modulation or phase distortion from the output of the first channel is needed.

In another embodiment, a test signal comprises an amplitude modulation signal that is coupled to an input of a device under test (e.g., including any combination of: an audio device, a digital audio device, a low pass filter, filter, equalizer, phase equalizer, and/or amplitude equalizer). The amplitude modulation signal includes a carrier signal that is modulated by a modulation signal. The output terminal of the device under test is measured for any combination of: modulation index (e.g., depth of amplitude modulation such as 50%, 100%, or k % where k is a real number) or phase (e.g., including phase modulation) or frequency (e.g., including frequency modulation). For example, in one embodiment, the device under test may include a filter with a test signal coupled to an input of the filter. The test signal includes an amplitude modulated signal with a modulation index of k. The output of the device under test (e.g., low pass filter) is coupled to an oscilloscope wherein the modulation index in the time domain is observed (e.g., unexpectedly) less (or different) than the modulation index of k (e.g., wherein the sidebands in the frequency domain are observed at output of the device under test is shown to have substantially the correct amplitudes for the given modulation index of k). The output of the device under test (e.g., low pass filter or filter) is coupled to an oscilloscope wherein the modulation index in the time domain is observed. This time domain observation of the output signal via the DUT may include a signal that includes (e.g., unexpectedly) less (or different) than the modulation index of k from the test signal. For example if the test signal has a modulation index of k, the output signal from the DUT includes a modulation index of $k_1$, such that $k_1 \neq k$. Note that the modulation index of k or $k_1$, may pertain to a modulation index for the test signal including amplitude modulation, frequency modulation, and/or phase modulation. Another observation showed the output of the device under test includes phase modulation and/or frequency modulation of the carrier signal. Another observation showed the output of the device under test showed an amplitude modulation (e.g., waveform) envelope or shape different from the test signal (e.g., amplitude modulation waveform envelope shape of the test signal). Another observation showed that coupling the output of the device under test to an input of a demodulator provided a demodulated output signal that differs (e.g., including a nonlinear effect or distortion) from the modulating signal of the carrier (e.g., of the test signal). In one example, the device under test included a low pass filter with minimal phase or a low pass filter with nonlinear phase shift (e.g., a low pass filter with varying group delay). The low pass filter or filter included in the device under test may include constant group delay or non-constant group delay. The output of the device under test may be coupled to a spectrum analyzer, Fourier Transform (e.g., including a Fast Fourier Transform), or frequency domain analyzer (e.g., for measuring phase or amplitude of one or more sidebands or carrier).

In another embodiment, a test signal comprises a phase modulation signal or frequency modulation signal that is coupled to an input of a device under test (e.g., including any combination of: an audio device, a digital audio device, a low pass filter, filter, equalizer, phase equalizer, and/or amplitude equalizer). The test signal includes a carrier signal that is modulated by a modulation signal. The output terminal of the device under test (DUT) is measured for any combination of: modulation index (e.g., amount o of phase modulation or frequency modulation such as 5%, 10%, or k % where k is a real number) or phase (e.g., including phase modulation) or frequency (e.g., including frequency modulation). For example, in one embodiment, the device under test may include a low pass filter (or filter) with a test signal coupled to an input of the low pass filter (or filter). The test signal includes an amplitude modulated signal with a modulation index of k. The output of the device under test (e.g., low pass filter or filter) is coupled to an oscilloscope wherein the modulation index in the time domain is observed. This time domain observation of the output signal via the DUT may include a signal that includes (e.g., unexpectedly) less (or different) than the modulation index of k from the test signal. For example if the test signal has a modulation index of k, the output signal from the DUT includes a modulation index of $k_1$, such that $k_1 \neq k$. Note that the modulation index of $k_1$, may pertain to a modulation index for the test signal including amplitude modulation, frequency modulation, and/or phase modulation. Another observation showed the output of the device under test includes any additional or change in phase modulation and/or frequency modulation of the test signal. Another observation showed the output of the device under test showed an amplitude modulation (e.g., coupling the output of the device under test to an amplitude modulation demodulator). Another observation showed that coupling the output of the device under test to an input of a demodulator provided a demodulated output signal that differs from the modulating signal of the carrier (e.g., of the test signal). In one example, the device under test included a low pass filter with minimal phase or a low pass filter (or a filter) with nonlinear phase shift (e.g., a low pass filter with varying group delay or a filter with nonlinear group delay or non constant group delay). The low pass filter or filter included in the device under test may include constant group delay or non-constant group delay. The output of the device under test may be coupled to a spectrum analyzer, Fourier Transform (e.g., including a Fast Fourier Transform), or frequency domain analyzer (e.g., for measuring phase or amplitude of one or more sidebands or carrier).

In the previous example or examples including a modulated signal coupled to an input terminal of the device under test, an output of the device under test is measured for distortion or nonlinearity in a manner of how the test signal is modulated. For example, if the test signal includes sinusoidal modulation (or an arbitrary signal modulation), the output of the device under test is measured or examined for distortion in the modulation of the test signal such as including a distorted sinusoidal modulation or a distorted arbitrary signal modulation. A distorted modulation effect may include a changed or different modulation index from the output terminal of the device under test when compared to the modulation index of the test signal.

Examples of a modulation index for amplitude, phase, and or frequency modulation can be characterized by the following:

For an amplitude modulated signal $AM(t)=[1+k \times m(t)] \times \cos(2\pi f_c t)$, where k is a modulation index, $f_c$=carrier frequency, and m(t)=modulation signal/function and where $0 \le |m(t)| \le 1$.

For a phase modulated signal $PM(t)=\cos[2f_c t+\varphi+k \times (t)]$, where k is a modulation index, $f_c$=carrier frequency, $\varphi$=static phase offset, and $\theta(t)$=phase modulation waveform/function.

For a frequency modulated signal $FM(t)=\cos([1+k \times m'(t)] \times 2\pi f_c t)$, where k is a modulation index, $f_c$=carrier frequency, and m'(t)=modulation signal/function. Generally $|k \times m'(t)| \ge 0$ or $|k \times m'(t)| \ll 1$. For example (but not limited to): $0\% \le |k \times m'(t)| \le 10\%$. Other percentages may be used.

As an example, the modulation index "k" can represent a modulation index associated with a test signal coupled to an input of a device under test. For the equations above for AM(t), PM(t), and/or FM(t), as an example, $k \rightarrow k_1$ for describing a new modulation index provided at an output of the device under test.

Another embodiment may include providing pulse waveform (or other waveform) to an input of a device under test and coupling an output signal from the device under test to a phase modulation demodulator and/or a frequency modulation demodulator to provide a signal indicative of phase and/or frequency as function over time. For example, a sharp cut-off filter generally provides a "ringing" waveform signal output when driven by a pulse signal. The "ringing" waveform signal is coupled to a phase detector/demodulator and/or frequency modulation detector/demodulator to provide a signal indicative of phase shift and/or frequency shift as a function of time. In some examples utilizing a "brick wall" low pass filter, the "ringing" waveform signal may include phase modulation and or frequency modulation. Also as an example, cascading one or more filters may cause a greater shift in phase modulation, frequency shift, and/or frequency modulation via an output of the cascaded filter.

The device under test or DUT may include an audio device.

Any signal, or signals, that is, or are, utilized for testing (or for measuring differential gain, differential phase, phase modulation, frequency response, phase response, amplitude modulation demodulation, phase modulation demodulation, frequency modulation demodulation, and or frequency modulation distortion) may include an arbitrary signal. For example by synthesizing a signal or waveform via a series of discrete time values such as generated from a computational circuit, module, and or program, and or wherein the values are read from a memory device. In general, any signal or signals for testing may be provided via in an analog domain, digital domain, and or software domain. Any measurement techniques may include a computational circuit, software defined radio, or digital signal processing.

This disclosure is illustrative and not limiting; further modifications will be apparent to one skilled in the art and are intended to fall within the scope of the appended claims and or of the embodiments described.

That which is claimed is:

1. An apparatus for measuring a change in modulation index of an audio device, wherein the audio device having an input terminal and an output terminal, comprising:
   coupling to the input of the audio device a test signal comprising a modulated signal wherein the modulated signal is characterized by a modulating signal, a carrier signal, and a modulating index and wherein the carrier signal is modulated by the modulating signal;
   coupling an output signal from the output terminal of the audio device to an input terminal of a demodulator to measure the modulation index at the output terminal of the audio device and further comprising an output terminal from the demodulator to provide a signal indicative the modulation index from the output of the audio device;
   wherein the output signal of the audio device causes a change in frequency deviation from the test signal wherein the test signal includes a frequency modulation signal with a predetermined frequency deviation; and
   wherein the output signal of the audio device causes a smaller modulation index compared to the test signal wherein the test signal includes an amplitude modulated signal with a predetermined modulation index.

2. The apparatus of claim 1 wherein the audio device includes a digital audio device including data compression.

3. The apparatus of claim 1 wherein the audio device includes a filter or low pass filter.

4. The apparatus of claim 1 wherein the change in frequency deviation at the output of the audio device provides a distorted modulation effect.

5. The apparatus of claim 1 wherein the demodulator includes an amplitude modulation demodulator, a phase modulation demodulator, or a frequency modulation demodulator.

6. The apparatus of claim 1 wherein the modulation index for the modulated signal including amplitude modulation is characterize by the test signal:
   $AM(t)=[1+k \times m(t)] \times \cos(2\pi f_c t)$, where k is a modulation index, $f_c$=carrier frequency, and m(t)=modulation signal/function and where $0 \le |m(t)| \le 1$.

7. The apparatus of claim 1 wherein the modulation index for the modulated signal including phase modulation is characterize by the test signal:

PM(t)=cos [$2\pi f_c t + \varphi + k \times \Theta(t)$], where k is a modulation index, $f_c$=carrier frequency, $\varphi$=static phase offset, and $\Theta(t)$=phase modulation waveform/function.

8. The apparatus of claim 1 wherein modulation index for the modulated signal including frequency modulation is characterize by the test signal:

FM(t)=cos ([$1+k \times m'(t)] \times 2\pi f_c t$), where k is a modulation index, $f_c$=carrier frequency, and m'(t)=modulation signal/function, whereby $|k \times m'(t)| \geq 0$ or $|k \times m'(t)| \ll 1$.

9. The apparatus of claim 6 further comprising the test signal including a sinusoidal modulating signal to the carrier signal of the test signal wherein the output of the demodulator provides a non sinusoidal signal.

10. The apparatus of claim 1 wherein the audio device includes data compression and wherein the test signal includes a frequency modulated signal whose frequency is characterized as $f_c +/- \Delta f$ and further measuring the frequency of a signal at the output terminal of the audio device that is characterized as $f_c +/- k_0 \Delta f$ with $k_0 \neq 1$.

* * * * *